United States Patent
Chen et al.

(10) Patent No.: US 9,824,922 B1
(45) Date of Patent: Nov. 21, 2017

(54) METHOD OF FORMING INTERCONNECT STRUCTURES BY SELF-ALIGNED APPROACH

(71) Applicant: Taiwan Semiconductor Manufacturing Company, Ltd., Hsinchu (TW)

(72) Inventors: Chih-Hao Chen, Hsinchu (TW); Ta-Ching Yu, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/601,588

(22) Filed: May 22, 2017

Related U.S. Application Data

(63) Continuation of application No. 15/225,452, filed on Aug. 1, 2016, now Pat. No. 9,659,821.

(60) Provisional application No. 62/340,390, filed on May 23, 2016.

(51) Int. Cl.
| | |
|---|---|
| *H01L 21/768* | (2006.01) |
| *H01L 23/522* | (2006.01) |
| *H01L 21/033* | (2006.01) |
| *H01L 23/528* | (2006.01) |
| *H01L 21/311* | (2006.01) |

(52) U.S. Cl.
CPC .... *H01L 21/76897* (2013.01); *H01L 21/0332* (2013.01); *H01L 21/31144* (2013.01); *H01L 21/76816* (2013.01); *H01L 21/76877* (2013.01); *H01L 23/528* (2013.01); *H01L 23/5226* (2013.01)

(58) Field of Classification Search
CPC ......... H01L 21/76897; H01L 21/76816; H01L 21/76877; H01L 21/31144; H01L 21/0332; H01L 23/528; H01L 23/5226
See application file for complete search history.

(56) References Cited

U.S. PATENT DOCUMENTS

| | | | |
|---|---|---|---|
| 8,470,708 B2 | 6/2013 | Shih et al. | |
| 9,406,739 B2 | 8/2016 | Tsai et al. | |
| 9,425,150 B2 | 8/2016 | Huang et al. | |
| 9,478,661 B1 | 10/2016 | Xie et al. | |
| 9,508,722 B2 | 11/2016 | Hsu et al. | |
| 9,601,348 B2 * | 3/2017 | Chu | H01L 23/5226 |
| 2002/0102843 A1 | 8/2002 | Seta et al. | |
| 2011/0070738 A1 | 3/2011 | Liang et al. | |

(Continued)

*Primary Examiner* — Savitr Mulpuri
(74) *Attorney, Agent, or Firm* — Slater Matsil, LLP

(57) ABSTRACT

A method includes forming a dielectric layer over a conductive feature. A first mask having a first opening is formed over the dielectric layer. A second mask is formed over the first mask. A third mask having a second opening is formed over the second mask. A fourth mask having a third opening is formed over the third mask, a portion of the third opening overlapping with the second opening. The portion of the third opening is transferred to the second mask to form a fourth opening, a portion of the fourth opening overlapping with the first opening. The portion of the fourth opening is transferred to the dielectric layer to form a fifth opening. The fifth opening is extended into the dielectric layer to form an extended fifth opening, the extended fifth opening exposing the conductive feature. The extended fifth opening is filled with a conductive material.

20 Claims, 56 Drawing Sheets

(56) References Cited

U.S. PATENT DOCUMENTS

2015/0262873 A1   9/2015  Chu et al.
2016/0314971 A1   10/2016 Lu et al.

* cited by examiner

METHOD OF FORMING INTERCONNECT STRUCTURES BY SELF-ALIGNED APPROACH

PRIORITY CLAIM AND CROSS-REFERENCE

This application is a continuation and claims the benefit of U.S. patent application Ser. No. 15/225,452, filed on Aug. 1, 2016, entitled "Method of Forming Interconnect Structures by Self-Aligned Approach," which claims the benefit of U.S. Provisional Application No. 62/340,390, filed on May 23, 2016, entitled "Method of Forming an Interconnect Via by Self-Aligned Approach", which applications are hereby incorporated herein by reference in their entireties.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
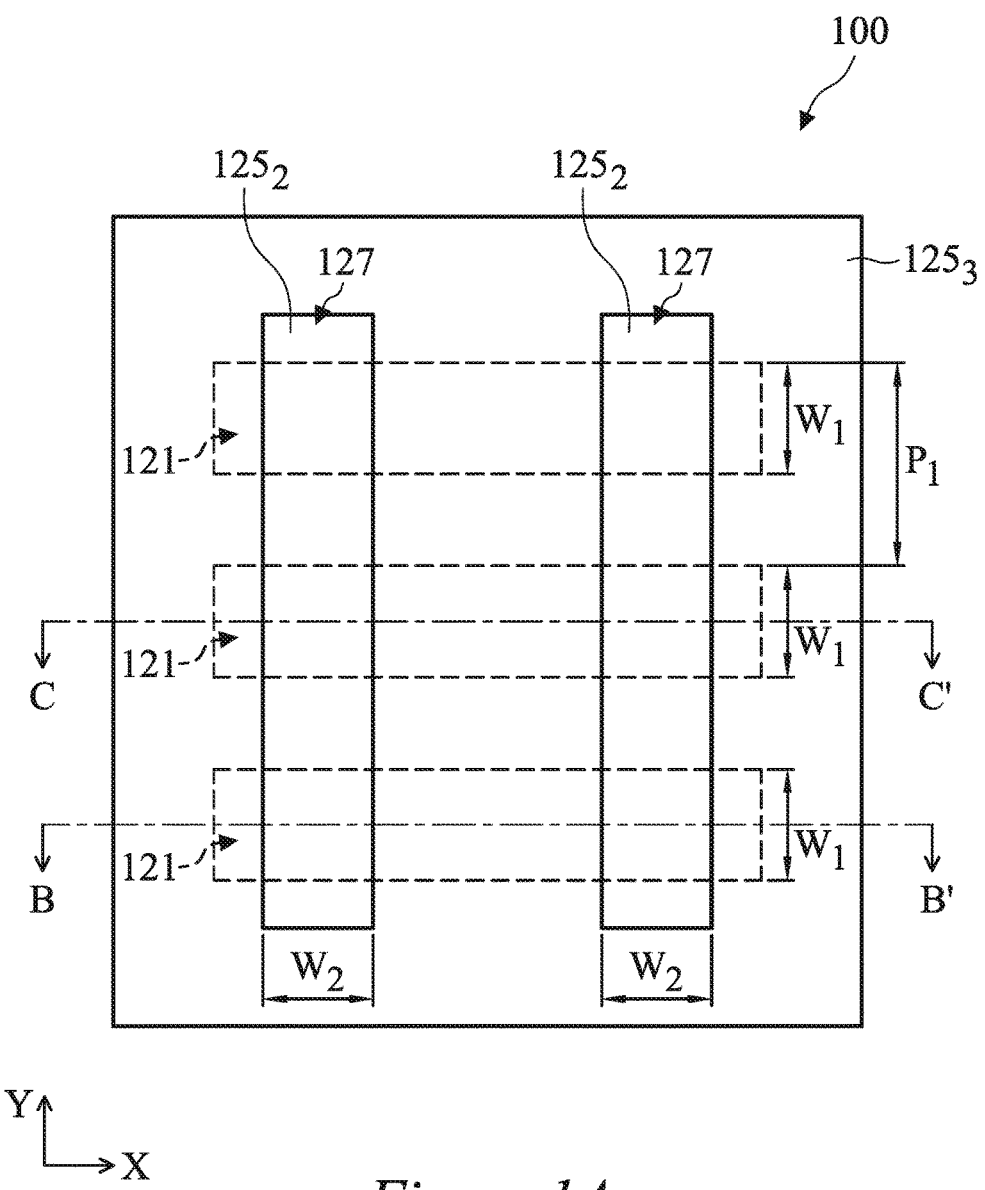
FIGS. 1A-8C illustrate top and cross-sectional views of various intermediate stages of fabrication of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, using a self-aligned process to form interconnects in a semiconductor structure. Various embodiments discussed herein allow for forming interconnects having a reduced size and pitch, and allow for reducing or avoiding effects caused by overlay shift during lithography, such as via-induced-metal-bridge (VIMB) and via-to-via leakage defects. Furthermore, various embodiments discussed herein allow for improving a time dependent dielectric breakdown (TDDB) window. It should be noted that various embodiments discussed herein are not limited to forming interconnects in a semiconductor structure, but may be also used to form other structures having reduced pitch and having overlay shift issues.

FIGS. 1A-8C illustrate various intermediate stages of fabrication of a semiconductor structure 100 in accordance with some embodiments. FIGS. 1A-8C illustrate top and cross-sectional views, wherein an "A" figure represents a top view, a "B" figure represents a first cross-sectional view along a B-B' line of the respective "A" figure, and a "C" figure represents a second cross-sectional view along a C-C' line (parallel to and spaced apart from the B-B' line) of the respective "A" figure.

Figure 1B:
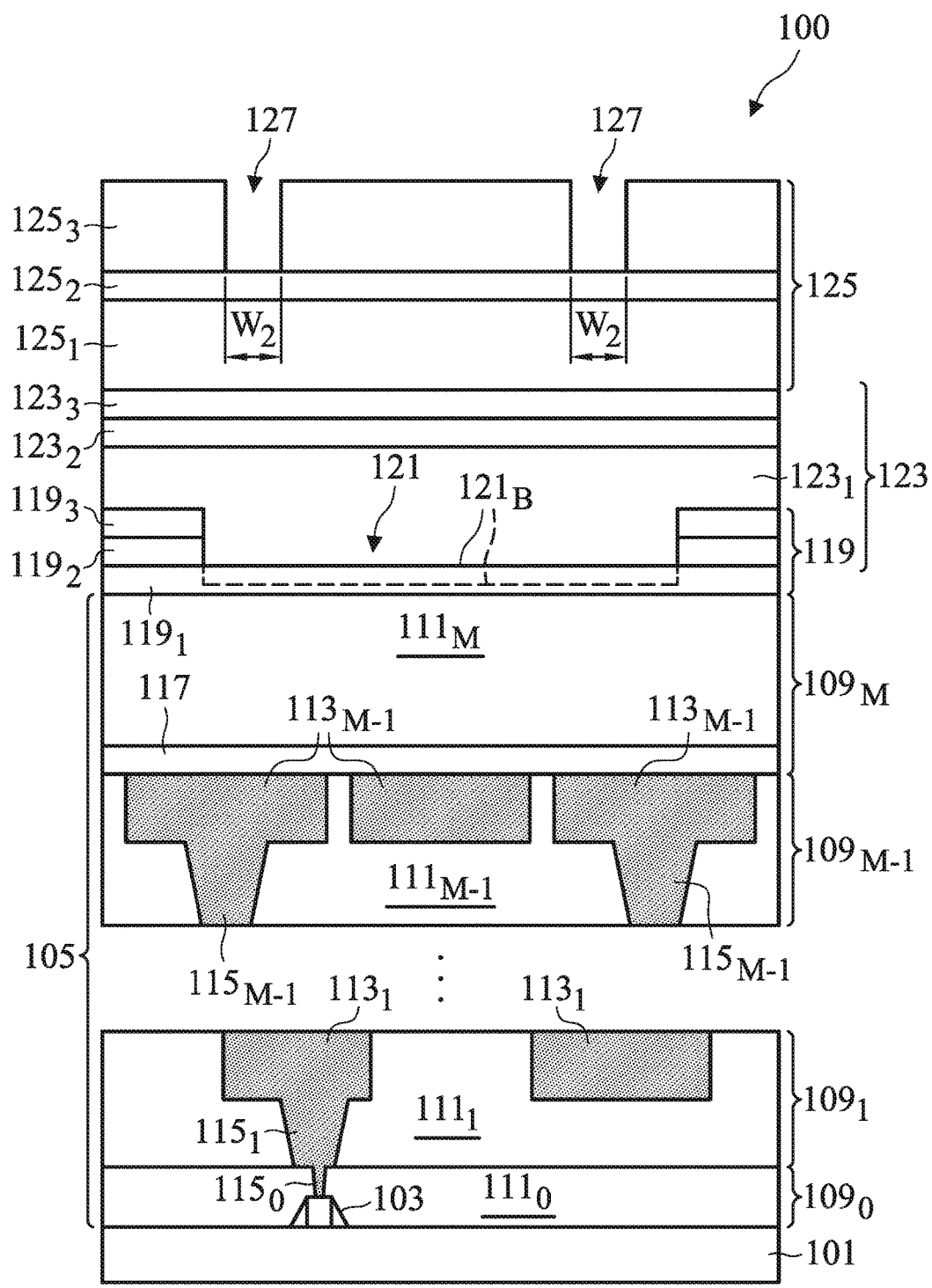
Figure 1C:
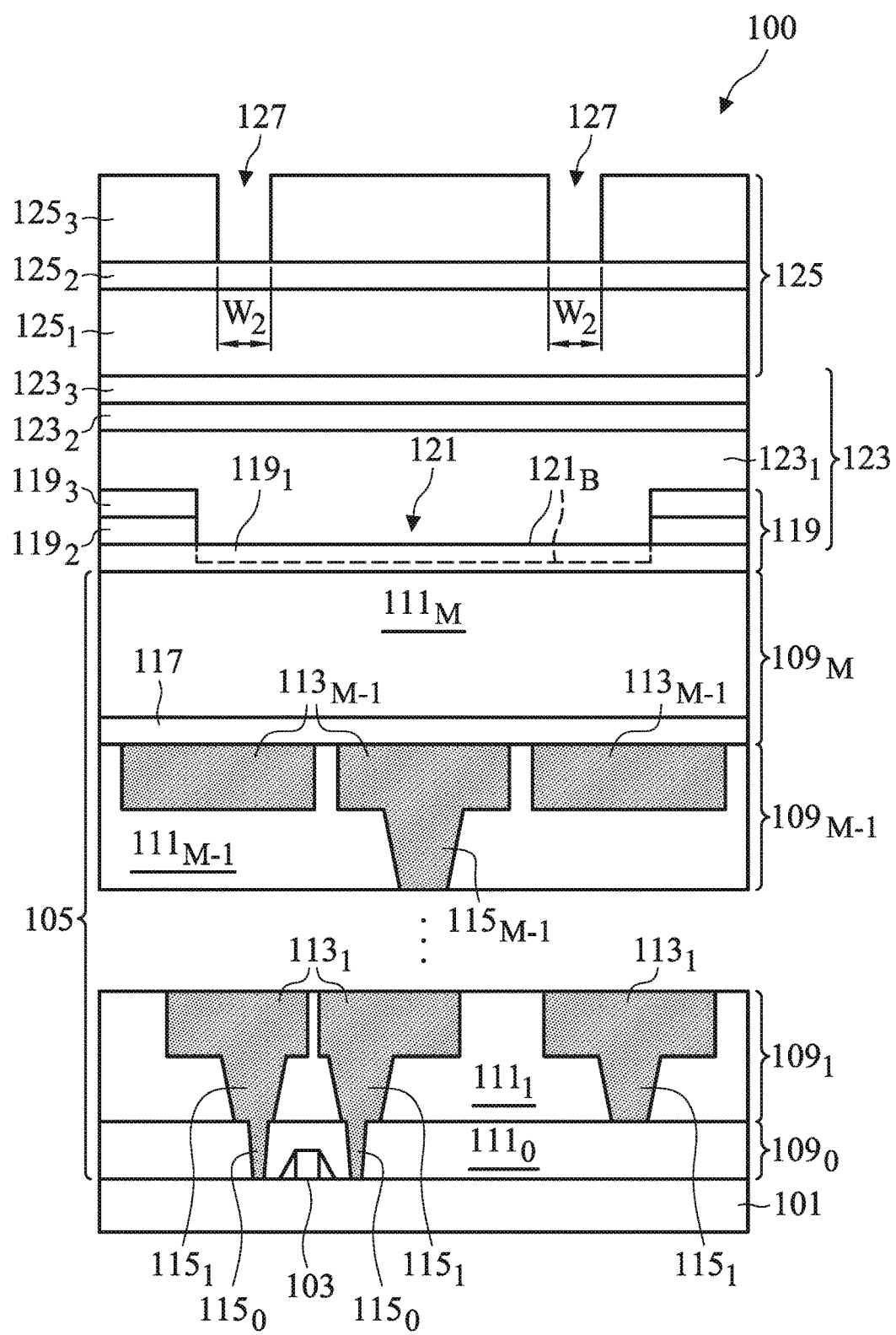

Referring to FIGS. 1A, 1B and 1C, a portion the semiconductor structure 100 is illustrated. The semiconductor structure 100 may be an intermediate structure of an integrated circuit manufacturing process. In some embodiments, the semiconductor structure 100 may comprise a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIGS. 1B and 1C as a single transistor) are formed on the substrate 101. The one or more active and/or passive devices 103 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 105 is formed over the one or more active and/or passive devices 103 and the substrate 101. The interconnect structure 105 electrically interconnects the one or more active and/or passive devices 103 to form functional electrical circuits within the semiconductor structure 100. The interconnect structure 105 may comprise one or more metallization layers $109_0$ to $109_M$, wherein M+1 is the number of the one or more metallization layers $109_0$ to $109_M$. In some embodiments, the value of M may vary according to design specifications of the semiconductor structure 100. In what follows, the one or more metallization layers $109_0$ to $109_M$ may also be collectively referred to as the one or more metallization layers 109. The one or more metallization layers $109_0$ to $109_M$, comprise one or more dielectric layers $111_0$ to $111_M$, respectively.

In some embodiments, the dielectric layer $111_0$ is an inter-layer dielectric (ILD) layer, and the dielectric layers $111_1$ to $111_M$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like.

In some embodiments, etch stop layers (not shown) may be formed between adjacent ones of the dielectric layers $111_0$ to $111_M$. In the illustrated embodiment, such an etch stop layer (ESL) 117 is formed between the dielectric layers $111_{M-1}$ and $111_M$. The etch stop layers aid in patterning the dielectric layers $111_0$ to $111_M$ to form openings in the dielectric layers $111_0$ to $111_M$. A material for the etch stop layers is chosen such that etch rates of the etch stop layers are less then etch rates of corresponding ones of the dielectric layers $111_0$ to $111_M$. In an embodiment, an etch rate of the ESL 117 is less than an etch rate of the dielectric layer $111_M$. In some embodiments, the ESL 117 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), combinations thereof, or the like, and may be formed using spin-on coating, CVD, PECVD, atomic layer deposition (ALD), the like, or a combination thereof. In an embodiment, the ESL 117 comprises a SiOC layer and an aluminum oxide layer over the SiOC layer.

In some embodiments, the dielectric layers $111_0$ comprises conductive plugs $115_0$, and the dielectric layers $111_1$ to $111_{M-1}$ comprise one or more conductive interconnects, such as conductive lines $113_1$ to $113_{M-1}$ and conductive vias $115_1$ to $115_{M-1}$, respectively. The conductive plugs $115_0$ electrically couple the one or more active and/or passive devices 103 to the conductive lines $113_1$ to $113_{M-1}$ and the conductive vias $115_1$ to $115_{M-1}$. As described below in greater detail, conductive lines $113_M$ and conductive vias $115_M$ (not illustrated in FIGS. 1A, 1B and 1C, see FIGS. 8A, 8B and 8C) are formed in the dielectric layer $111_M$.

In some embodiments, the conductive plugs $115_0$, the conductive lines $113_1$ to $113_{M-1}$ and the conductive vias $115_1$ to $115_{M-1}$ may be formed using any suitable method, such as damascene, dual damascene, or the like. The conductive plugs $115_0$, the conductive lines $113_1$ to $113_{M-1}$ and the conductive vias $115_1$ to $115_{M-1}$ may comprise conductive materials such as copper, aluminum, tungsten, combinations thereof, or the like. The conductive plugs $115_0$, the conductive lines $113_1$ to $113_{M-1}$ and the conductive vias $115_1$ to $115_{M-1}$ may further comprise one or more barrier/adhesion layers (not shown) to protect the respective dielectric layers $111_0$ to $111_{M-1}$ from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like. In an embodiment, the steps for forming the conductive plugs $115_0$, the conductive lines $113_1$ to $113_{M-1}$ and the conductive vias $115_1$ to $115_{M-1}$ may include forming openings in the respective dielectric layers $111_0$ to $111_{M-1}$, depositing barrier/adhesion layers in the openings, depositing seed layers of a suitable conductive material over barrier/adhesion layers, and filling the openings with a suitable conductive material, for example, by plating, or other suitable methods. A chemical mechanical polishing (CMP) is then performed to remove excess materials overfilling the openings.

Referring further to FIGS. 1A, 1B and 1C, a first mask stack 119 is formed over the dielectric layer $111_M$. In some embodiments, the first mask stack 119 comprises one or more mask layers. In the illustrated embodiment, the first mask stack 119 comprises a bottom layer $119_1$, a middle layer $119_2$ over the bottom layer $119_1$, and a top layer $119_3$ over the middle layer $119_2$. The bottom layer $119_1$ may be an anti-reflective coating (ARC) layer such as a nitrogen free ARC (NFARC) layer, or the like, and may be formed using CVD, ALD, or the like. In some embodiments, a thickness of the bottom layer $119_1$ may be between about 50 Å and about 300 Å. The middle layer $119_2$ may comprise a nitride, such as silicon nitride (SiN), titanium nitride (TiN), tantalum nitride (TaN), or the like, and may be formed using CVD, ALD, or the like. In some embodiment, a thickness of the middle layer $119_2$ may be between about 50 Å and about 500 Å. The top layer $119_3$ may comprise an oxide, such as silicon oxide, or the like, and may be formed using CVD, ALD, or the like. In some embodiment, a thickness of the top layer $119_3$ may be between about 50 Å and about 300 Å. In other embodiments, the bottom layer $119_1$ and the top layer $119_3$ may be omitted. In such embodiments, the first mask stack 119 may comprise a layer of a nitride material.

The first mask stack 119 is patterned to form openings 121 in the first mask stack 119. The first mask stack 119 may be patterned using suitable lithography and etching methods. In some embodiments, the openings 121 extend through the top layer $119_3$ and the middle layer $119_2$, and expose the bottom layer $119_1$. In other embodiments, the openings 121 may partially or fully extend through the bottom layer $119_1$, such that bottoms 121B of the openings 121 may be within the bottom layer $119_1$ or may expose the dielectric layer $111_M$. In some embodiments, a width $W_1$ of the openings 121 may be between about 10 nm and about 22 nm, and a pitch $P_1$ of the openings 121 may be between about 20 nm and about 44 nm. In the illustrated embodiment, each of the openings 121 has a rectangular shape as viewed from top, such that a long side of each rectangular shape is parallel to an x-direction and a short side of each rectangular shape is parallel to a y-direction, with the x-direction being perpendicular to the y-direction. A particular pattern of the openings 121, as illustrated in FIG. 1A, is provided for the purpose of illustration only, and various different patterns may be formed in the first mask stack 119 according to design specifications of the semiconductor structure 100. As described below in greater detail, the openings 121 are transferred to the dielectric layer $111_M$ to form openings for conductive interconnects, such as conductive lines.

Referring further to FIGS. 1A, 1B and 1C, a second mask stack 123 is formed over the first mask stack 119. In some embodiments, the second mask stack 123 comprises one or more mask layers. In the illustrated embodiment, the second mask stack 123 comprises a bottom layer $123_1$, a middle layer $123_2$ over the bottom layer $123_1$, and a top layer $123_3$ over the middle layer $123_2$. The bottom layer $123_1$ may comprise an organic material, such as a spin-on carbon (SOC) material, or the like, and may be formed using spin-on coating, CVD, ALD, or the like. In some embodiment, a thickness of the bottom layer $123_1$ may be between about 500 Å and about 2000 Å, such as about 2000 Å. The middle layer $123_2$ may comprise a nitride material, such as silicon nitride (SiN), silicon oxynitride (SiON), titanium nitride (TiN), tantalum nitride (TaN), or the like, and may be formed using CVD, ALD, or the like. In some embodiment, a thickness of the middle layer $123_2$ may be between about 50 Å and about 500 Å, such as about 300 Å. The top layer $123_3$ may comprise an oxide material, such as silicon oxide, or the like, and may be formed using CVD, ALD, or the like. In some embodiment, a thickness of the top layer $123_3$ may be between about 50 Å and about 500 Å, such as about 300 Å. As described below in greater detail, the second mask stack 123 is patterned to form openings in the second mask stack 123. Subsequently, portions of the openings are transferred to the dielectric layer $111_M$ to form via openings in the dielectric layer $111_M$, which are filled with suitable conductive materials to form conductive interconnects, such as conductive vias.

Referring further to FIGS. 1A, 1B and 1C, a first tri-layer mask 125 is formed over the second mask stack 123. In some embodiments, the first tri-layer mask 125 comprises a bottom layer $125_1$, a middle layer $125_2$ over the bottom layer $125_1$, and a top layer $125_3$ over the middle layer $125_2$. In some embodiments, the bottom layer $125_1$ may comprise an organic material, such as a spin-on carbon (SOC) material, or the like, and may be formed using spin-on coating, CVD, ALD, or the like. In some embodiment, a thickness of the bottom layer $125_1$ may be between about 500 Å and about 2000 Å, such as about 2000 Å. The middle layer $125_2$ may comprise an inorganic material, which may be a nitride (such as SiN, TiN, TaN, or the like), an oxynitride (such as SiON), an oxide (such as silicon oxide), or the like, and may be formed using CVD, ALD, or the like. In some embodiment, a thickness of the middle layer $125_2$ may be between about 200 Å and about 500 Å, such as about 300 Å. The top layer $125_3$ may comprise an organic material, such as a photoresist material, and may be formed using a spin-on coating, or the like. In some embodiment, a thickness of the top layer $125_3$ may be between about 500 Å and about 1000 Å, such as about 600 Å. In some embodiments, the middle layer $125_2$ has a higher etch rate than the top layer $125_3$, and the top layer $125_3$ is used as an etch mask for patterning of the middle layer $125_2$. The bottom layer $125_1$ has a higher etch rate than the middle layer $125_2$, and the middle layer $125_2$ is used as an etch mask for patterning of the bottom layer $125_1$.

In some embodiments, the top layer $125_3$ is patterned to form openings 127 in the top layer $125_3$. The top layer $125_3$ is patterned using suitable photolithography techniques. In some embodiments where the top layer $125_3$ comprises a photoresist material, the photoresist material is irradiated (exposed) and developed to remove portions of the photoresist material. In some embodiments, a width $W_2$ of the openings 127 is between about 10 nm and about 44 nm. In the illustrated embodiment, each of the openings 127 has a rectangular shape as viewed from top, such that a long side of each rectangular shape is parallel to the y-direction and a short side of each rectangular shape is parallel to the x-direction. Furthermore, the openings 127 overlap with the openings 121 as viewed from top. A particular pattern of the openings 127, as illustrated in FIG. 1A, is provided for the purpose of illustration only, and various different patterns may be formed in the top layer $125_3$ according to design specifications of the semiconductor structure 100. In some embodiments, the width $W_2$ of the openings 127 may be substantially equal to the width $W_1$ of the openings 121. In other embodiments, the width $W_2$ of the openings 127 may be different from the width $W_1$ of the openings 121.

Figure 2A:
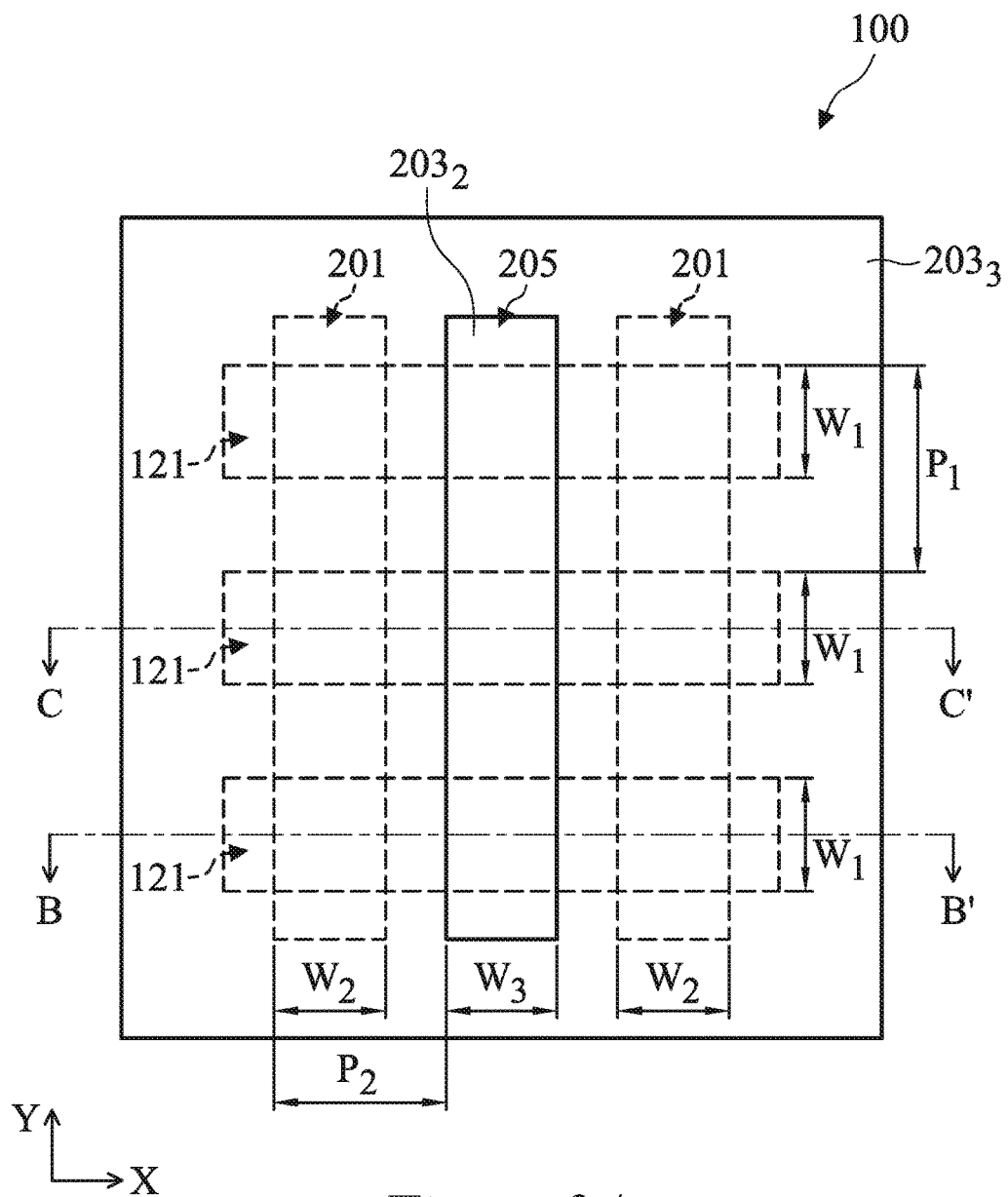
Figure 2B:
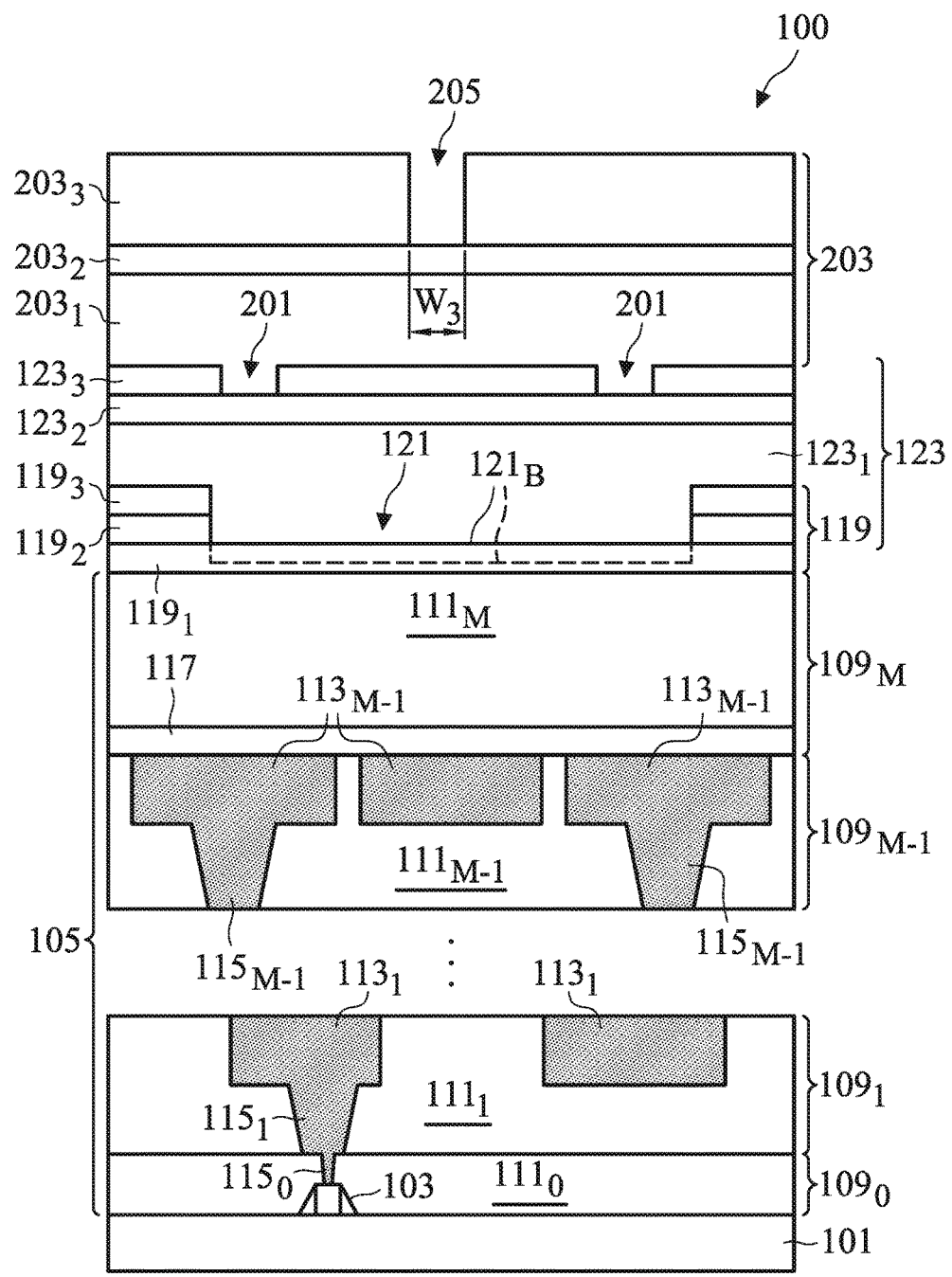
Figure 2C:
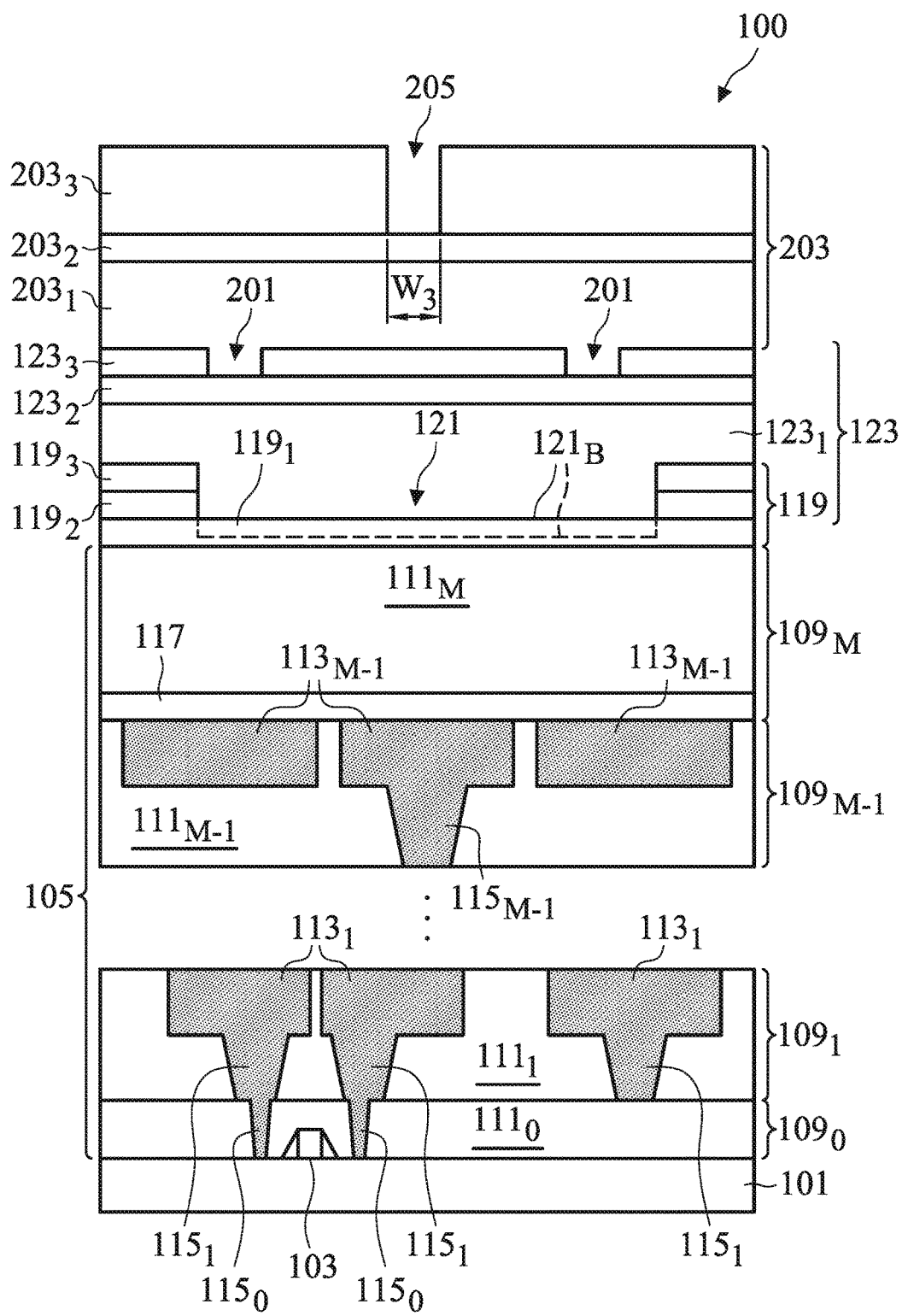

Referring to FIGS. 2A, 2B and 2C, a first patterning process is performed on the second mask stack 123 to transfer the openings 127 (see FIGS. 1A, 1B and 1C) in the first tri-layer mask 125 to the second mask stack 123. The first patterning process forms openings 201 in the top layer $123_3$ of the second mask stack 123. In some embodiments, the first patterning process comprises one or more etching processes, where the first tri-layer mask 125 is used as an etch mask. The one or more etching processes may include anisotropic wet etching processes, anisotropic dry etching processes, or combinations thereof. Accordingly, the openings 201 in the top layer $123_3$ of the second mask stack 123 have approximately same sizes and the same pitch as respective openings 127 in the top layer $125_3$ of the first tri-layer mask 125 (see FIGS. 1A, 1B and 1C). Furthermore, in the illustrated embodiment, the openings 201 overlap with the openings 121 as viewed from top, with a pattern of the openings 201 being the same as the pattern of the openings 127 as viewed from top. During the first patterning process, the top layer $125_3$, the middle layer $125_2$, and the bottom layer $125_1$ of the first tri-layer mask 125 may be consumed. If any residue of the top layer $125_3$, the middle layer $125_2$, and the bottom layer $125_1$ of the first tri-layer mask 125 is left over the second mask stack 123 after the first patterning processes, the residue may also be removed.

Referring further to FIGS. 2A, 2B and 2C, a second tri-layer mask 203 is formed over the second mask stack 123. In some embodiments, the second tri-layer mask 203 comprises a bottom layer $203_1$, a middle layer $203_2$ over the bottom layer $203_1$, and a top layer $203_3$ over the middle layer $203_2$. In some embodiments, the bottom layer $203_1$, the middle layer $203_2$, and the top layer $203_3$ of the second tri-layer mask 203 may be formed using similar materials and methods as the bottom layer $125_1$, the middle layer $125_2$, and the top layer $125_3$ of the first tri-layer mask 125, respectively, described above with reference to FIGS. 1A, 1B and 1C, and the description is not repeated herein for the sake of brevity. In some embodiments, a thickness of the bottom layer $203_1$ may be between about 500 Å and about 2000 Å, such as about 2000 Å, a thickness of the middle layer $203_2$ may be between about 200 Å and about 500 Å, such as about 300 Å, and a thickness of the top layer $203_3$ may be between about 500 Å and about 1000 Å, such as about 600 Å.

The top layer $203_3$ of the second tri-layer mask 203 is patterned to form an opening 205 in the top layer $203_3$ of the second tri-layer mask 203. In some embodiments, the top layer $203_3$ of the second tri-layer mask 203 may be patterned using similar methods as the top layer $125_3$ of the first tri-layer mask 125 described above with reference to FIGS. 1A, 1B and 1C, and the description is not repeated herein for the sake of brevity. In some embodiments, a width $W_3$ of the opening 205 is between about 10 nm and about 44 nm. In some embodiments, the width $W_2$ of the openings 201 may be substantially equal to the width $W_3$ of the opening 205. In some embodiments, the width $W_2$ of the openings 201 may be different from the width $W_3$ of the opening 205. In the illustrated embodiment, the opening 205 has a rectangular shape as viewed from top, such that a long side of the rectangular shape is parallel to the y-direction and a short side of the rectangular shape is parallel to the x-direction. Furthermore, the opening 205 is interposed between the openings 201, and the openings 201 and the opening 205 form a pattern having a pitch $P_2$. In some embodiments, the pitch $P_2$ is between about 20 nm and about 88 nm. In addition, the opening 205 overlaps with the openings 121 as viewed from top. In some embodiments, the pitch $P_2$ may be substantially equal to the pitch $P_1$. In some embodiments, the pitch $P_2$ may be different from the pitch $P_1$.

Figure 3A:
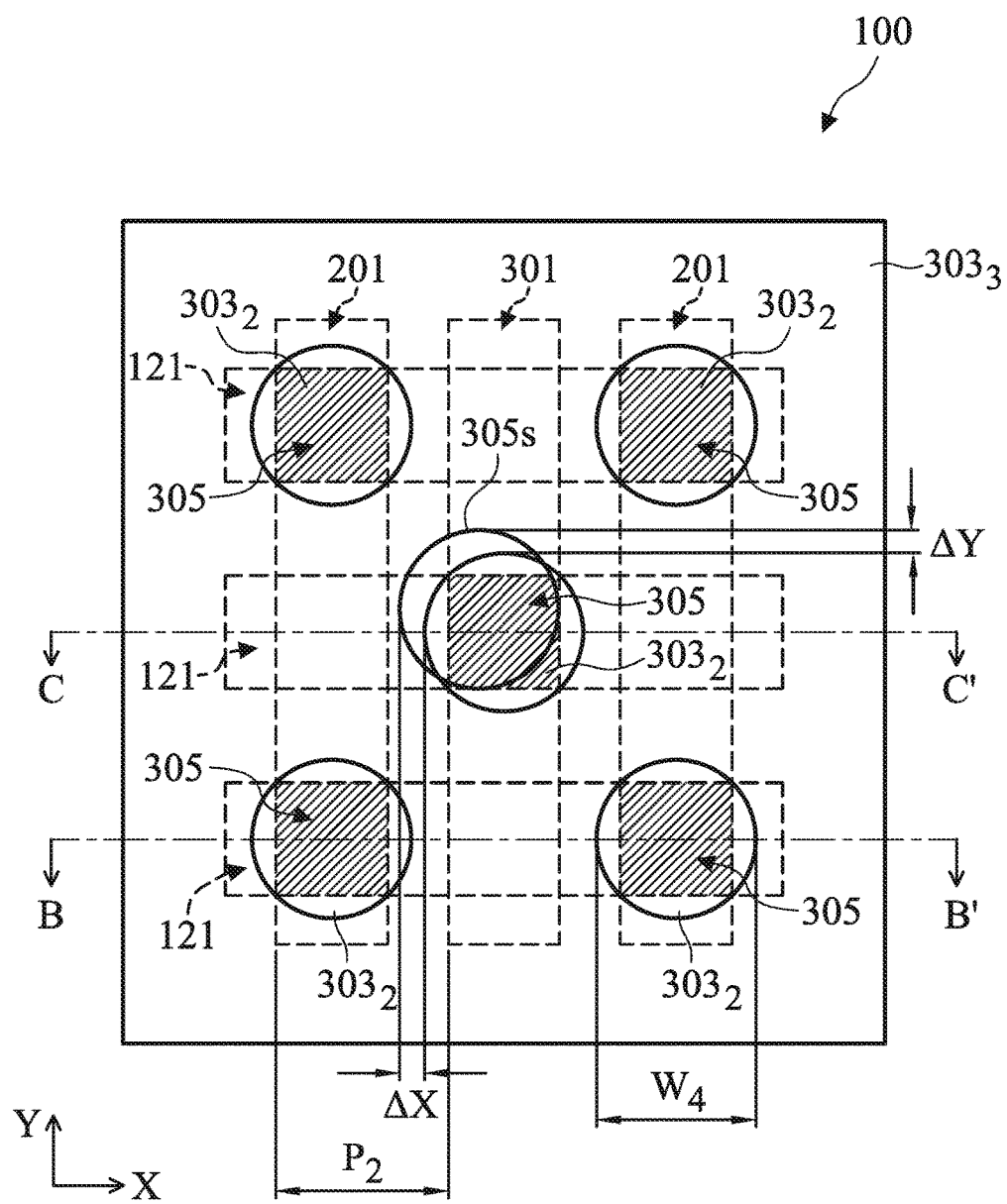
Figure 3B:
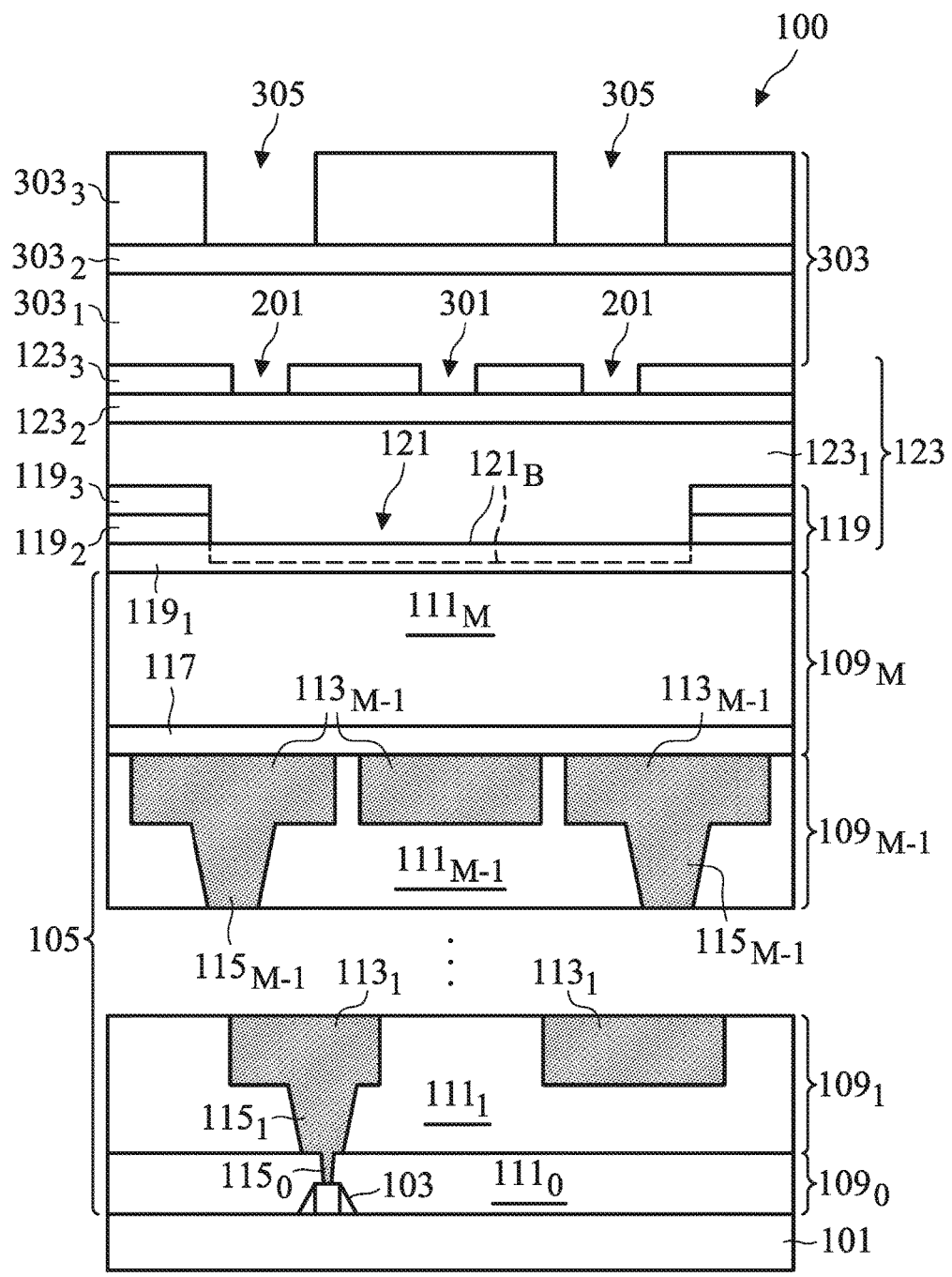
Figure 3C:
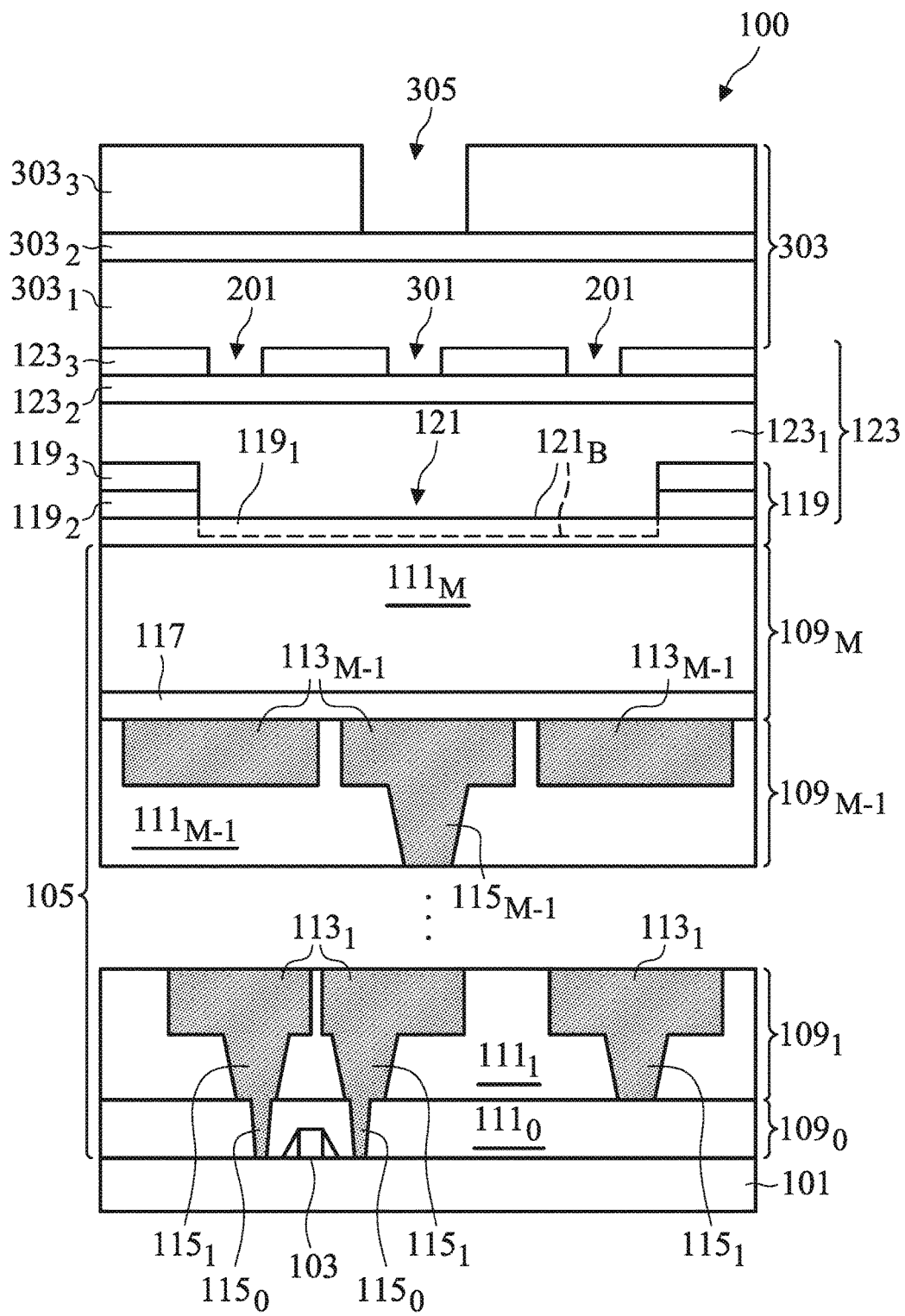

Referring to FIGS. 3A, 3B and 3C, a second patterning process is performed on the second mask stack 123 to transfer the opening 205 (see FIGS. 2A, 2B and 2C) in the second tri-layer mask 203 to the second mask stack 123. The second patterning process forms an opening 301 in the top layer $123_3$ of the second mask stack 123. In some embodiments, the second patterning process comprises one or more etching processes, where the second tri-layer mask 203 is used as an etch mask. The one or more etching processes may include anisotropic wet etching processes, anisotropic dry etching processes, or combinations thereof. Accordingly, the opening 301 in the top hard mask layer $123_3$ has approximately the same size as the opening 205 in the top layer $203_3$ of the second tri-layer mask 203 (see FIGS. 2A, 2B and 2C). During the second patterning process, the top layer $203_3$, the middle layer $203_2$, and the bottom layer $203_1$ may be consumed. If any residue of the top layer $203_3$, the middle layer $203_2$, and the bottom layer $203_1$ is left over the second mask stack 123 after the second patterning process, the residue may also be removed.

In the illustrated embodiment, the opening 301 has a rectangular shape as viewed from top, such that a long side of the rectangular shape is parallel to the y-direction and a short side of the rectangular shape is parallel to the x-direction. The opening 301 is interposed between the openings 201, and the openings 201 and the opening 301 form a pattern having the pitch $P_2$. The openings 201 and 301 overlap with the openings with the openings 121 as viewed from top. As described below in greater detail, the openings 121 are used to align subsequently formed conductive vias in the y-direction, and the openings 201 and 301 are used to align subsequently formed conductive vias in the x-direction. As described above in greater detail, the openings 201 and 301 in the top layer $123_3$ of the second mask stack 123 are formed using two patterning process. In some embodiments, the use of multiple patterning processes allow for avoiding the optical proximity effect while patenting the openings 201 and 301.

Referring further to FIGS. 3A, 3B and 3C, a third tri-layer mask 303 is formed over the second mask stack 123. In some embodiments, the third tri-layer mask 303 comprises a bottom layer $303_1$, a middle layer $303_2$ over the bottom layer $303_1$, and a top layer $303_3$ over the middle layer $303_2$. In some embodiments, the bottom layer $303_1$, the middle layer $303_2$ and the top layer $303_3$ of the third tri-layer mask 303 may be formed using similar materials and methods as the bottom layer $125_1$, the middle layer $125_2$ and the top layer $125_3$ of the first tri-layer mask 125, respectively, described above with reference to FIGS. 1A, 1B and 1C, and the description is not repeated herein for the sake of brevity. In some embodiment, a thickness of the bottom layer $303_1$ may be between about 500 Å and about 2000 Å, such as about 2000 Å, a thickness of the middle layer $303_2$ may be between about 200 Å and about 500 Å, such as about 300 Å, and a thickness of the top layer $303_3$ may be between about 500 Å and about 1000 Å, such as about 600 Å.

The top layer $303_3$ of the third tri-layer mask 303 is patterned to form openings 305 in the top layer $303_3$. In some embodiments, the top layer $303_3$ of the third tri-layer mask 303 may be patterned using similar methods as the top layer $125_3$ of the first tri-layer mask 125 described above with reference to FIGS. 1A, 1B and 1C, and the description is not repeated herein. In some embodiments, a width $W_4$ of the openings 305 is between about 20 nm and about 88 nm. In an embodiment, the width $W_4$ is greater than the widths $W_1$, $W_2$, and $W_3$. In other embodiments, the width $W_4$ may be substantially equal to the widths $W_1$, $W_2$, or $W_3$. In the illustrated embodiment, the openings 305 overlap with the openings 121, 201 and 301 as viewed from top, such that each of the openings 305 overlaps with one of the openings 121, and one of the openings 201 and 301. The portions of the openings 305 overlapping with the openings 121, 201 and 301 are shaded in FIG. 3A for the purpose of illustration. In the illustrated embodiment, the openings 305 have circular shapes as viewed from top. In other embodiments, the openings 305 may have other suitable shapes, such as oval shapes, square shapes, rectangular shapes, polygonal shapes, or the like, as viewed from top.

As described below in greater detail, the shaded portions of the openings 305 are transferred to the dielectric layer $111_M$ to form via openings in the dielectric layer $111_M$, which are filled with suitable conductive materials to form conductive interconnects, such as conductive vias. In some embodiments, due to lithography process variations, locations of the openings 305 in the top layer $303_3$ of the third tri-layer mask 303 may shift from desired locations. Such a shifted opening $305s$ is illustrated in FIG. 3A, where a center of the opening $305s$ is shifted from a desired location (a center of the unshifted opening 305) by a distance $\Delta x$ in the x-direction and a distance $\Delta y$ in the y-direction. Since an overlap of the shifted opening $305s$ with the opening 121 and the opening 301 determines an opening for conductive vias, such an undesired overlay shift of the shifted opening $305s$ may be mitigated provided that the maximum overlay shift in the y-direction, $\Delta y_{max}$, is less than a distance between adjacent openings 121, and the maximum overlay shift in the x-direction, $\Delta x_{max}$, is less than a distance between the opening 301 and the adjacent opening 201. In some embodiments, the maximum overlay shift in the x-direction, $\Delta x_{max}$, is between about 5 nm and about 22 nm, and the maximum overlay shift in the y-direction, $\Delta y_{max}$, is between about 5 nm and about 11 nm.

Figure 4A:
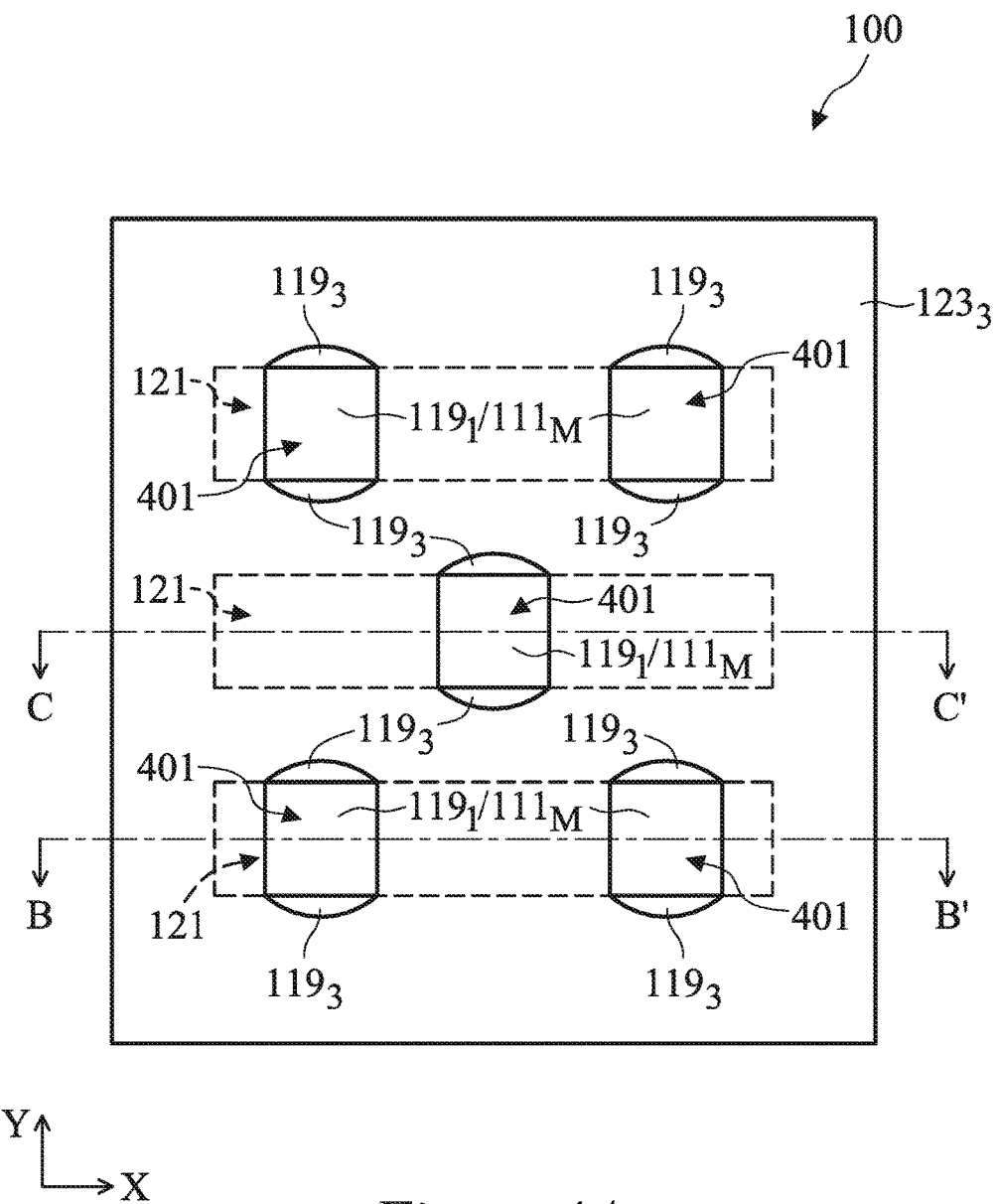
Figure 4B:
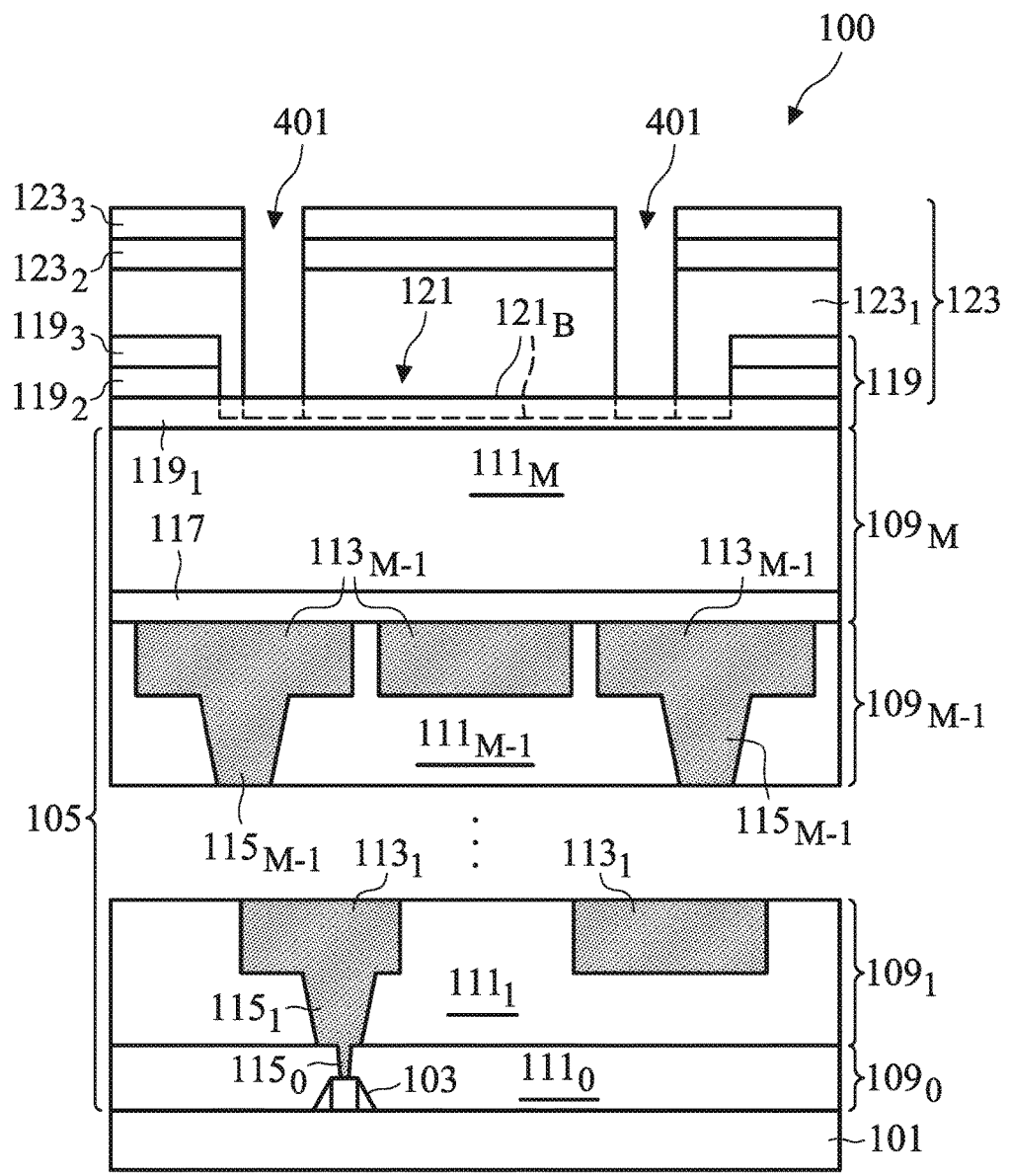
Figure 4C:
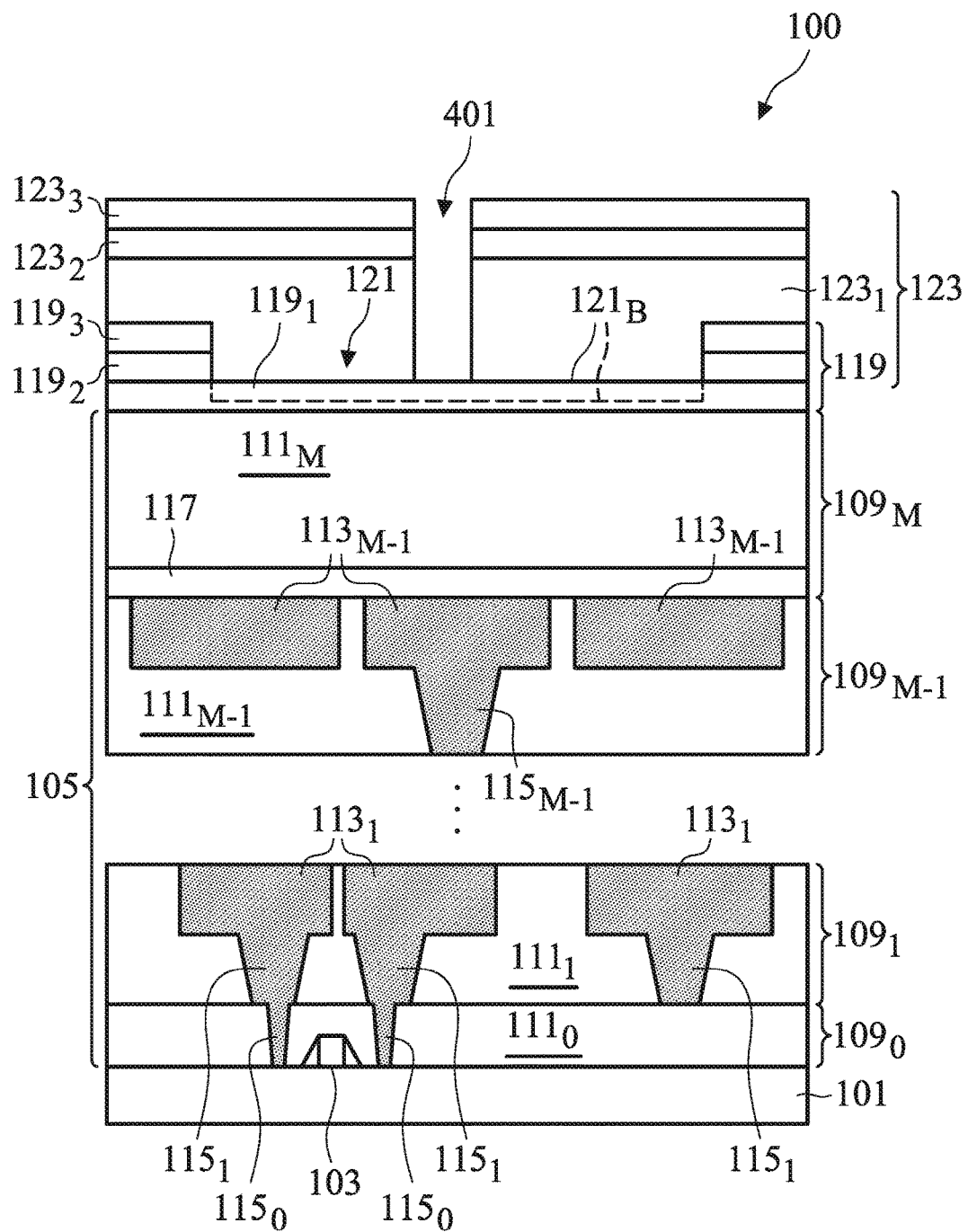

Referring to FIGS. 4A, 4B and 4C, the middle layer $123_2$ and the bottom layer $123_1$ of the second mask stack 123 are patterned to form openings 401. In some embodiments, the patterning process may include one or more etching processes, where the third tri-layer mask 303 (see FIGS. 3A, 3B and 3C) and the top layer $123_3$ of the second mask stack 123 are used a combined etching mask. The one or more etching processes may include anisotropic wet etching processes, anisotropic dry etching processes, or combinations thereof. Accordingly, the openings 401 are aligned with the openings 201 and 301 (see FIGS. 3A, 3B and 3C) in the x-direction and top view shapes of the openings 401 are determined by overlaps of the openings 305 with the openings 201 and 301. Furthermore, the openings 401 expose the first mask stack 119, such that each opening 401 exposes the bottom 121B of the corresponding opening 121 and a portion of the top layer $119_3$ of the first mask stack 119. In some embodiments, each opening 401 exposes a portion of the bottom layer $119_1$ of the first mask stack 119. In other embodiments, each opening 401 exposes a portion of the dielectric layer $111_M$. In some embodiments, during the patterning process to form the openings 401, the top layer $123_3$ and the middle layer $123_2$ of the second mask stack 123 may be partially or fully consumed. If any residue of the top layer $123_3$ and the middle layer $123_2$ of the second mask stack 123 is left over the bottom layer $123_1$ of the second mask stack 123 after the patterning process, the residue may also be removed as illustrated in FIGS. 5A, 5B and 5C.

Figure 5A:
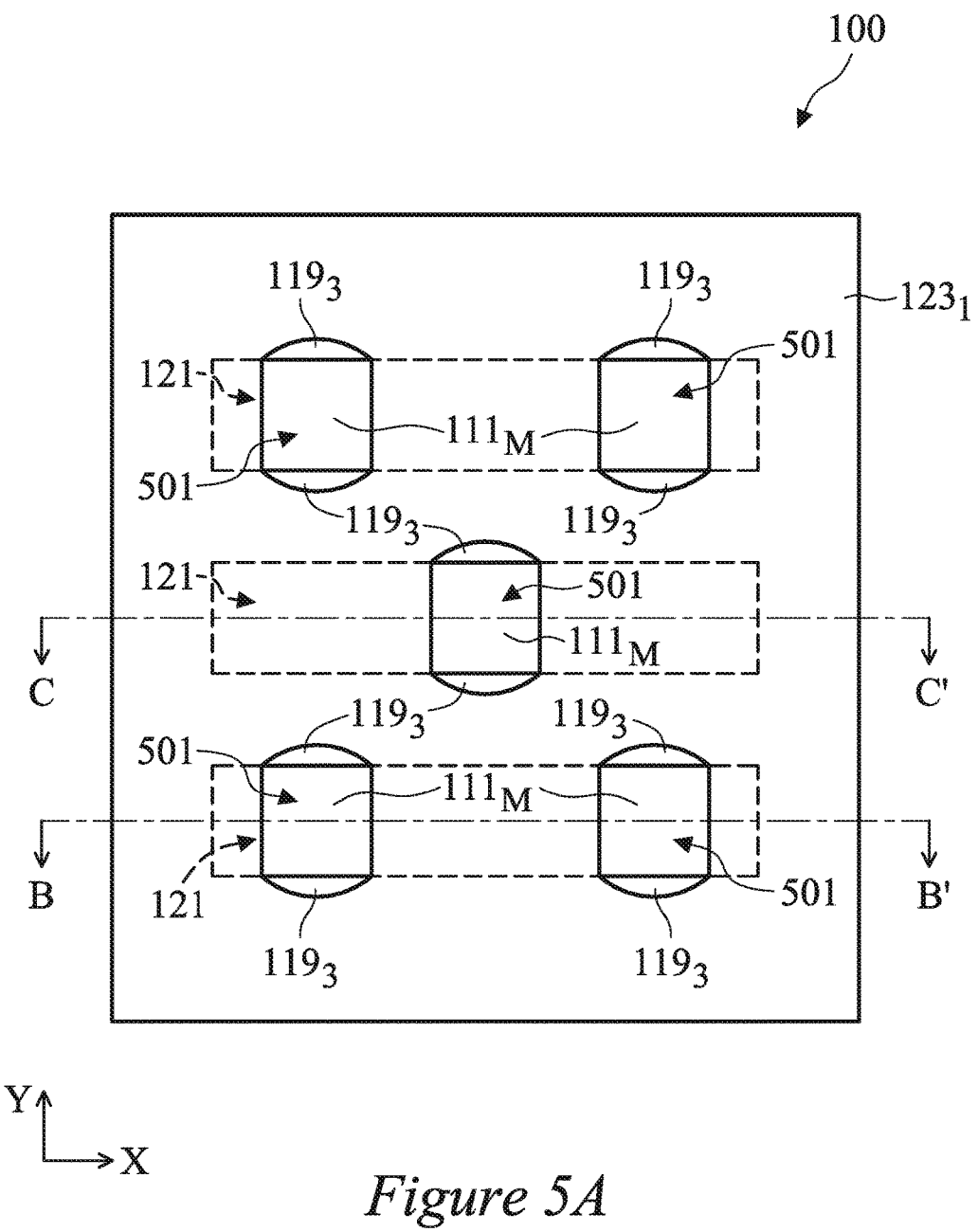
Figure 5B:
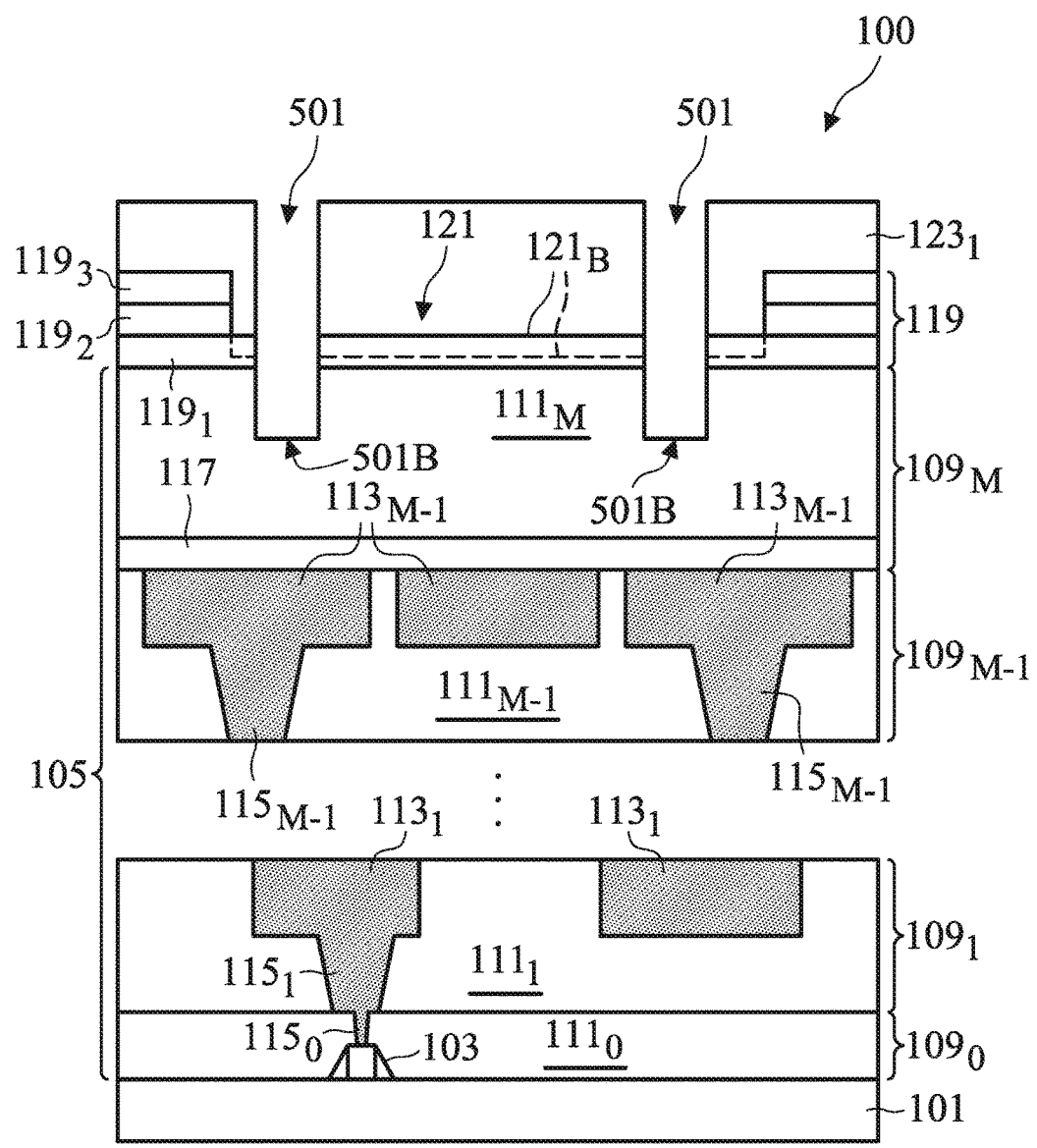
Figure 5C:
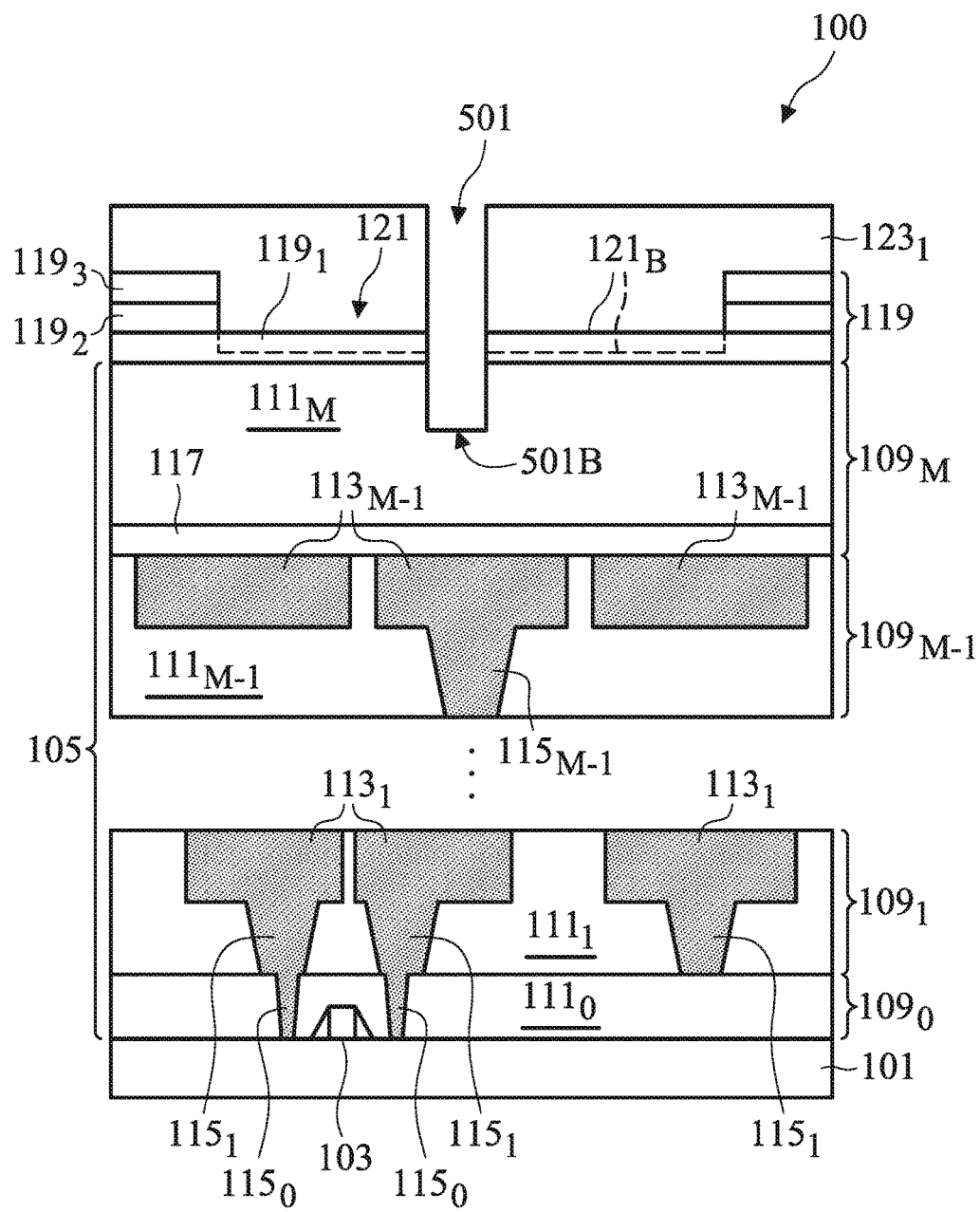

Referring further to FIGS. 5A, 5B and 5C, a first patterning process of the dielectric layer $111_M$ is performed to form the openings 501 in the dielectric layer $111_M$. In some embodiments, the first patterning process may include one or more etching processes, where the bottom layer $123_1$ of the second mask stack 123 and the top layer $119_3$ of the first mask stack 119 are used as a combined etching mask. The one or more etching processes may include anisotropic wet etching processes, anisotropic dry etching processes, or combinations thereof. Accordingly, the openings 501 are aligned with the openings 121 in the y-direction and top view shapes of the openings 501 are determined by overlaps of the openings 401 with the openings 121 (see FIGS. 4A, 4B and 4C). In some embodiment, the openings 501 partially extend through the dielectric layer $111_M$, such that bottoms 501B of the openings 501 are within the dielectric layer $111_M$.

Figure 6A:
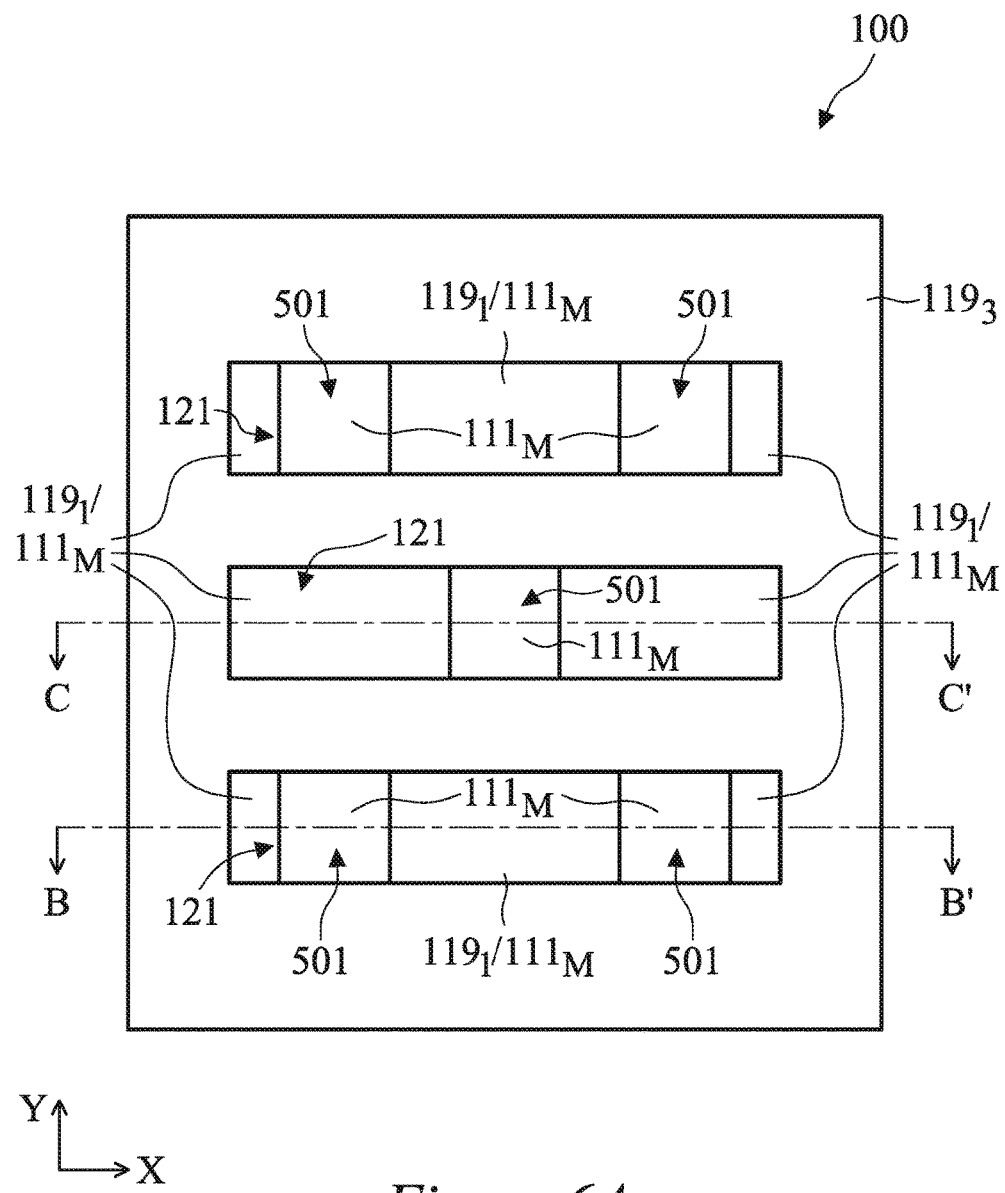
Figure 6B:
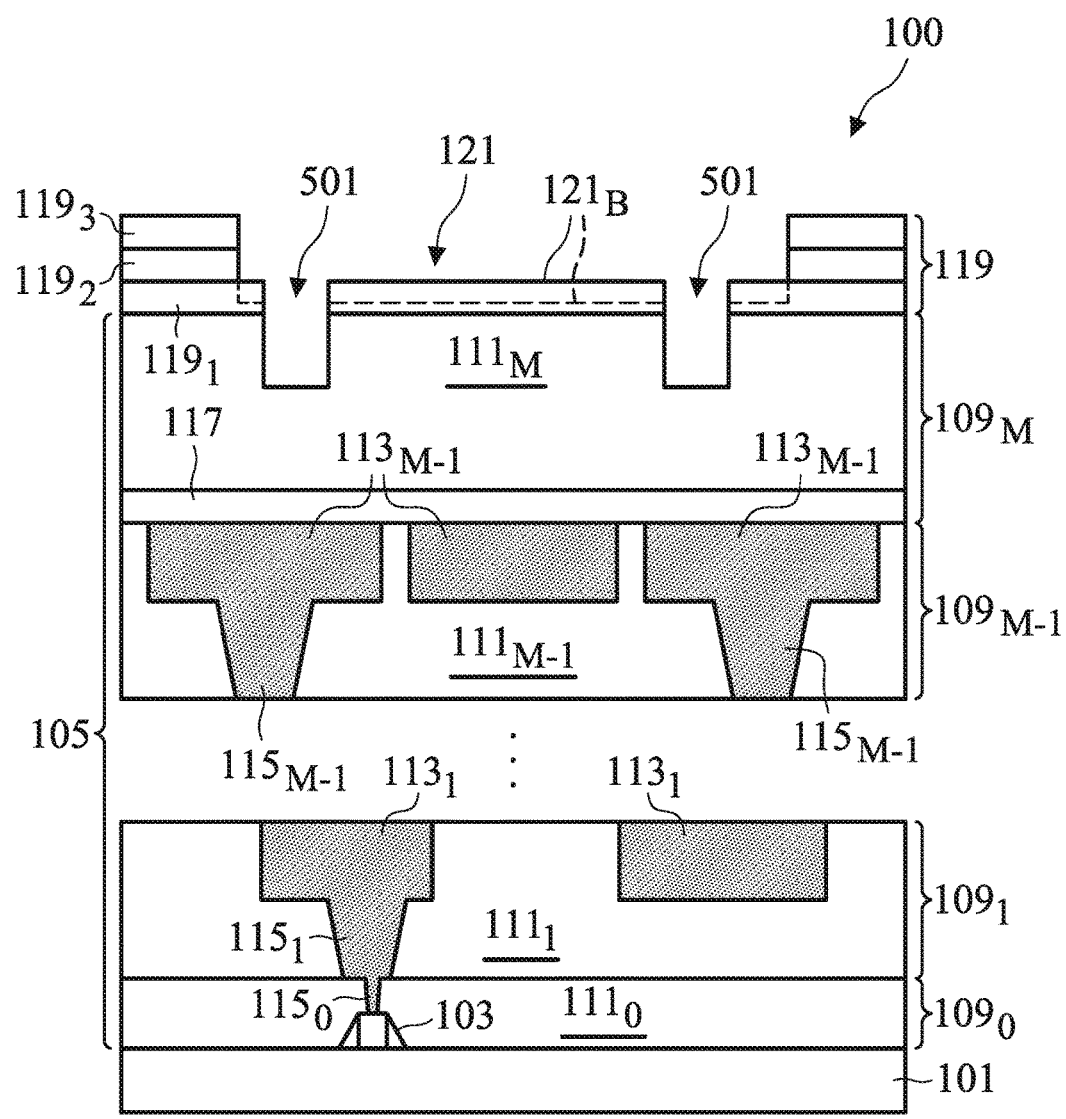
Figure 6C:
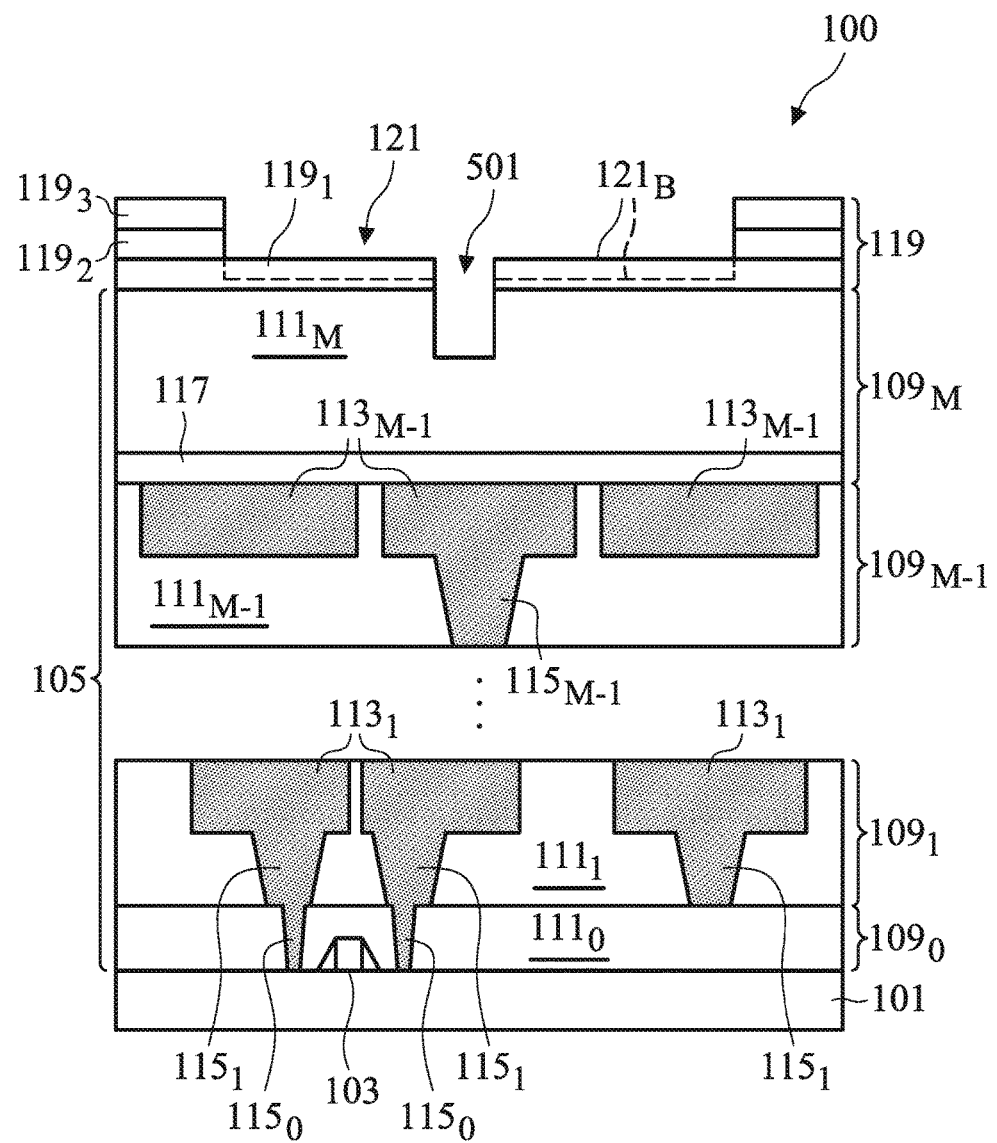

Referring to FIGS. 6A, 6B and 6C, in some embodiments, during the first patterning process to form the openings 501, the bottom layer $123_1$ of the second mask stack 123 (see FIGS. 5A, 5B and 5C) may be partially or fully consumed. If any residue of the bottom layer $123_1$ of the second mask stack 123 is left over the first mask stack 119 after the first patterning process, the residue may also be removed to expose the openings 121.

Figure 7A:
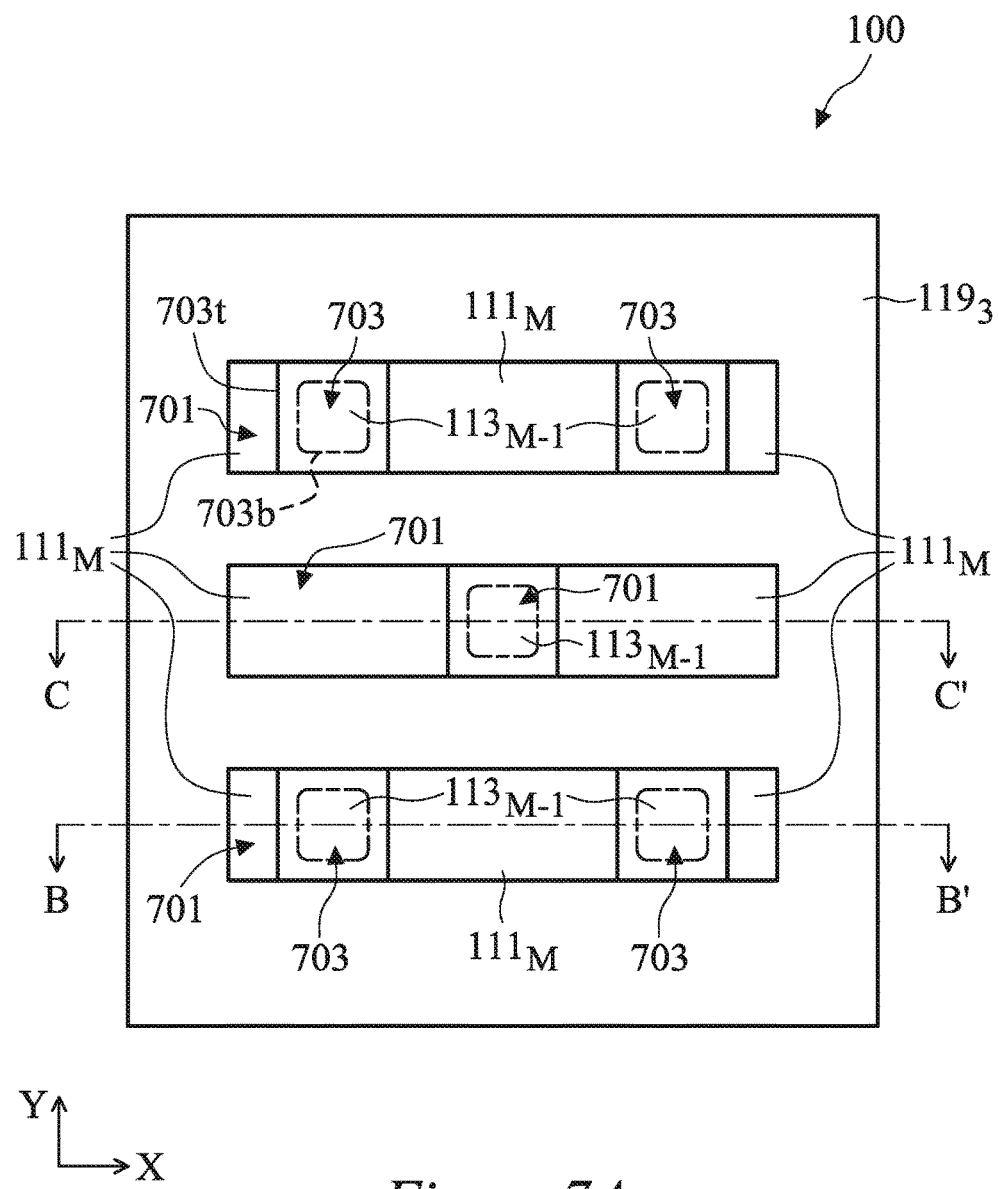
Figure 7B:
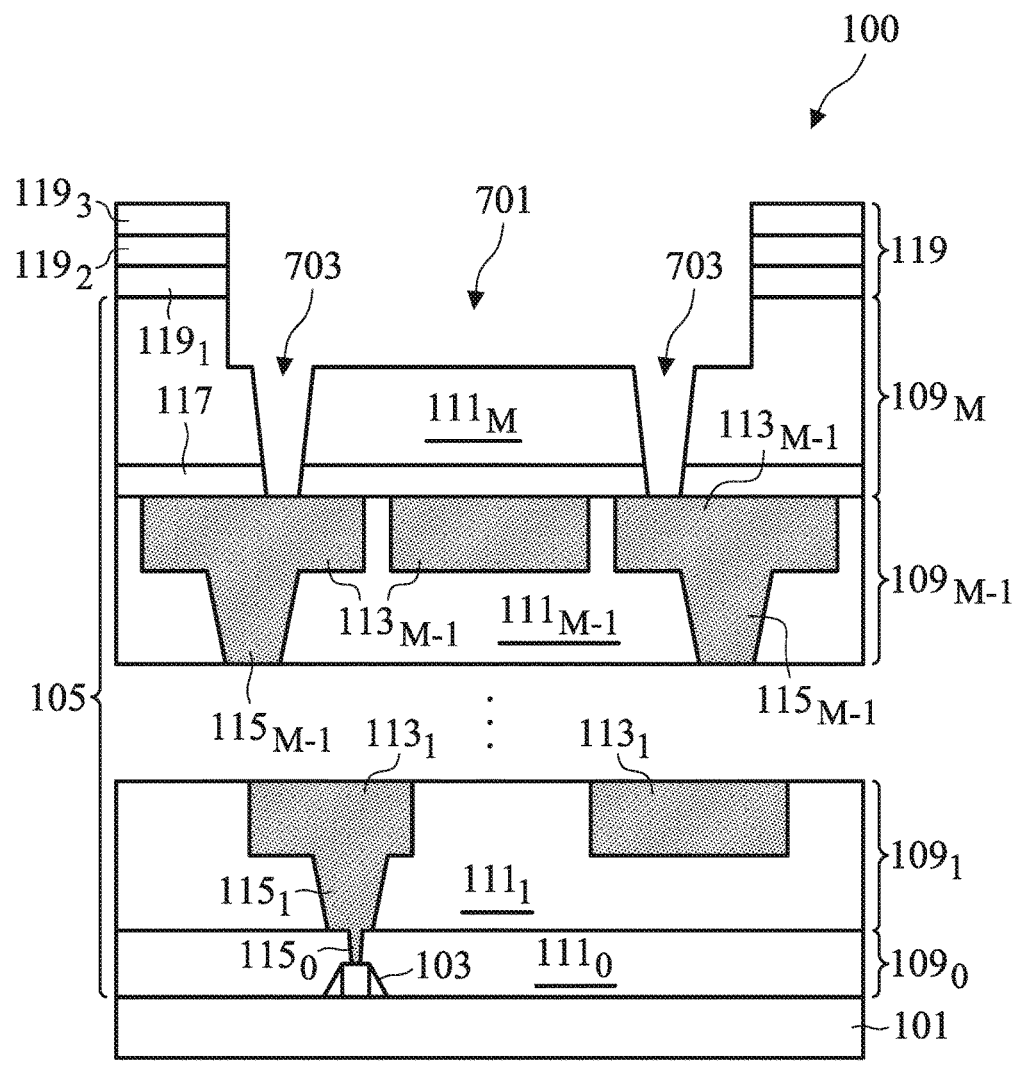
Figure 7C:
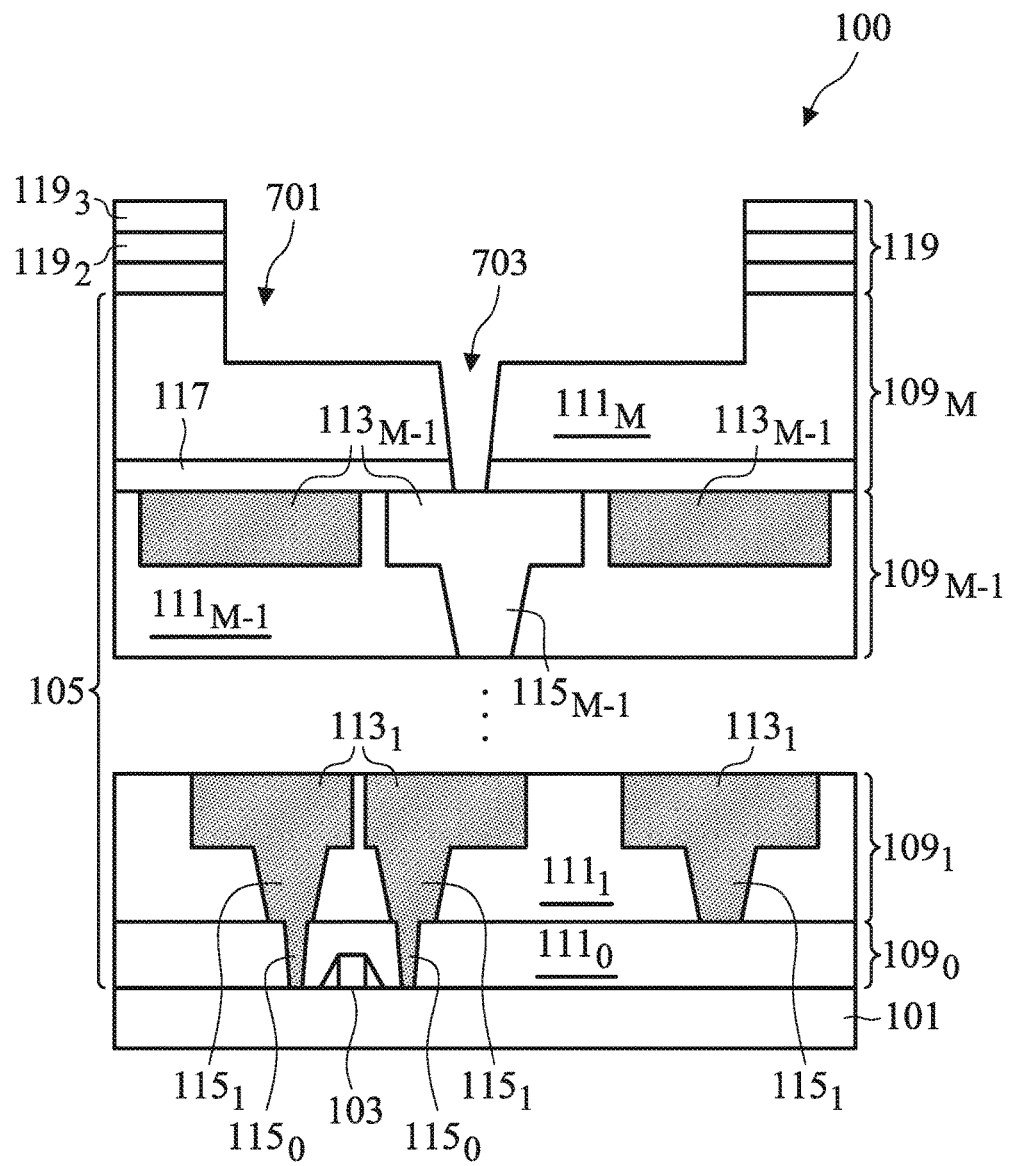

Referring to FIGS. 7A, 7B and 7C, a second patterning process of the dielectric layer $111_M$ and the ESL 117 is performed to form the openings 701 and 703 in the dielectric layer $111_M$ and the ESL 117. In some embodiments, the second patterning process may include one or more etching processes, where the top layer $119_3$ of the first mask stack 119 is used as an etching mask. The one or more etching processes may include anisotropic wet etching processes, anisotropic dry etching processes, or combinations thereof. The second patterning process extends the openings 121 into the dielectric layer $111_M$ to form the openings 701 in the dielectric layer $111_M$, and extends the openings 501 (see FIGS. 6A, 6B and 6C) further into the dielectric layer $111_M$ and the ESL 117 to form the openings 703. In some embodiments, the openings 703 expose the conductive lines $113_{M-1}$ of the metallization layer $109_{M-1}$. Accordingly, the openings 703 are aligned with the openings 701. The openings 701 and the openings 703 may be also referred to as line openings 701 or via openings 703, respectively. In some embodiments, widths of the via openings 703 narrow as the via openings 703 extend toward corresponding conductive lines $113_{M-1}$. Furthermore, top view shapes of the via openings 703 also change as the via openings 703 extend toward corresponding conductive lines $113_{M-1}$. In the illustrated embodiment, top view shapes of top portions 703t of the via openings 703 are squares with sharp corners and top view shapes of bottom portions 703b of the via openings 703 are squares with rounded corners. In other embodiments, top view shapes of the top portions 703t of the via openings 703 may be rectangles, polygons, or the like, with sharp or rounded corners, and top view shapes of the bottom portions 703b of the via openings 703 may be circles, ovals, or rectangles, polygons, or the like, with sharp or rounded corners.

Figure 8A:
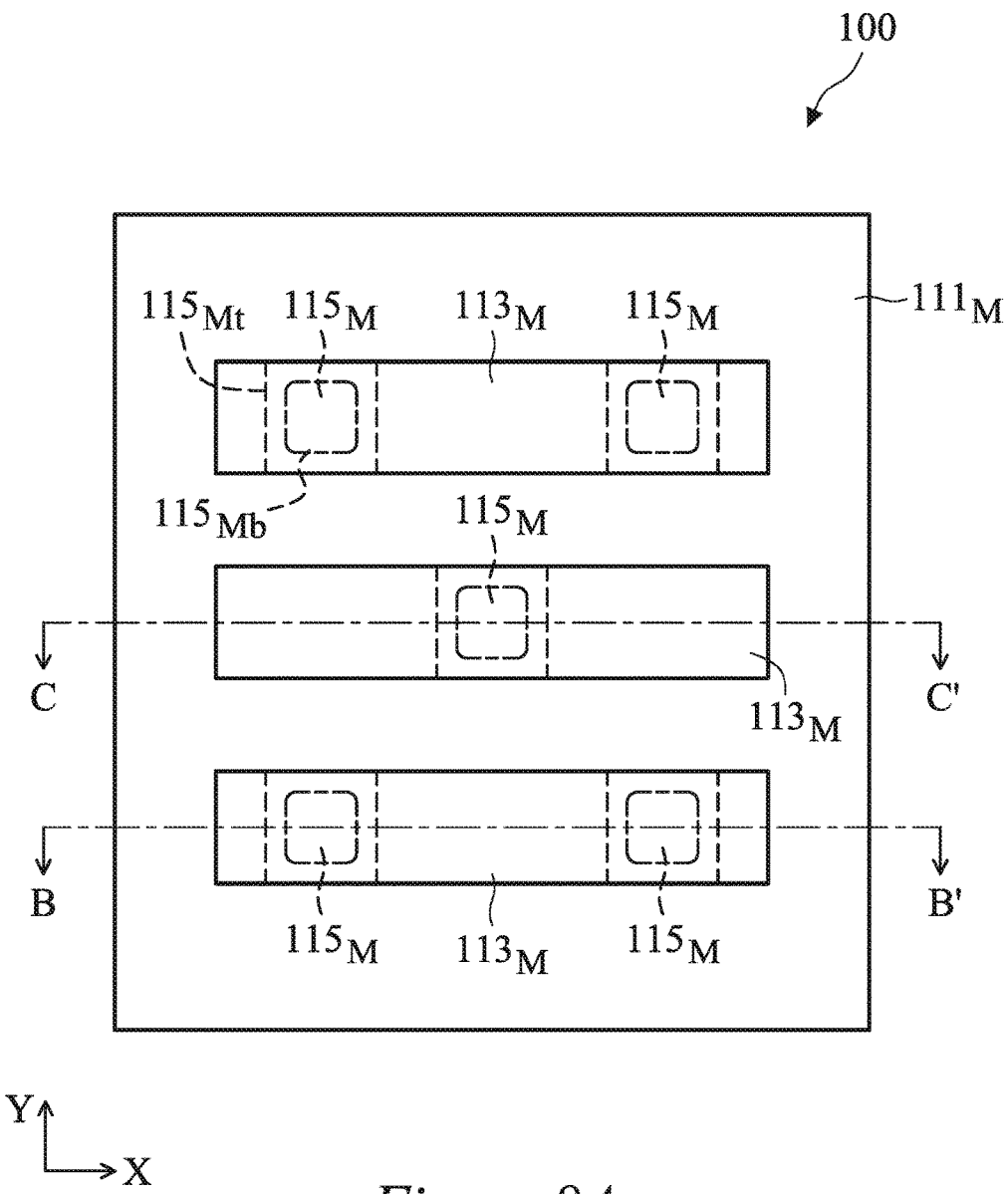
Figure 8B:
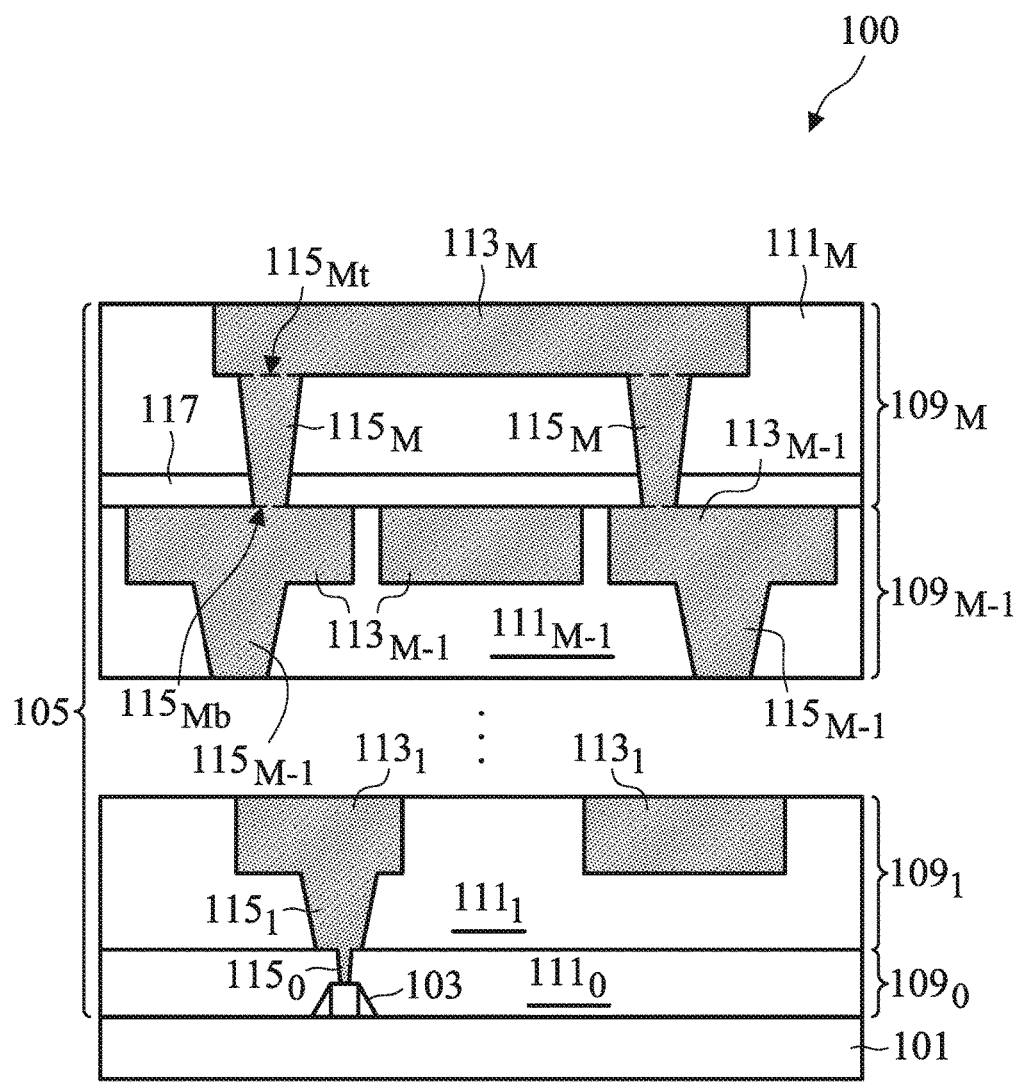
Figure 8C:
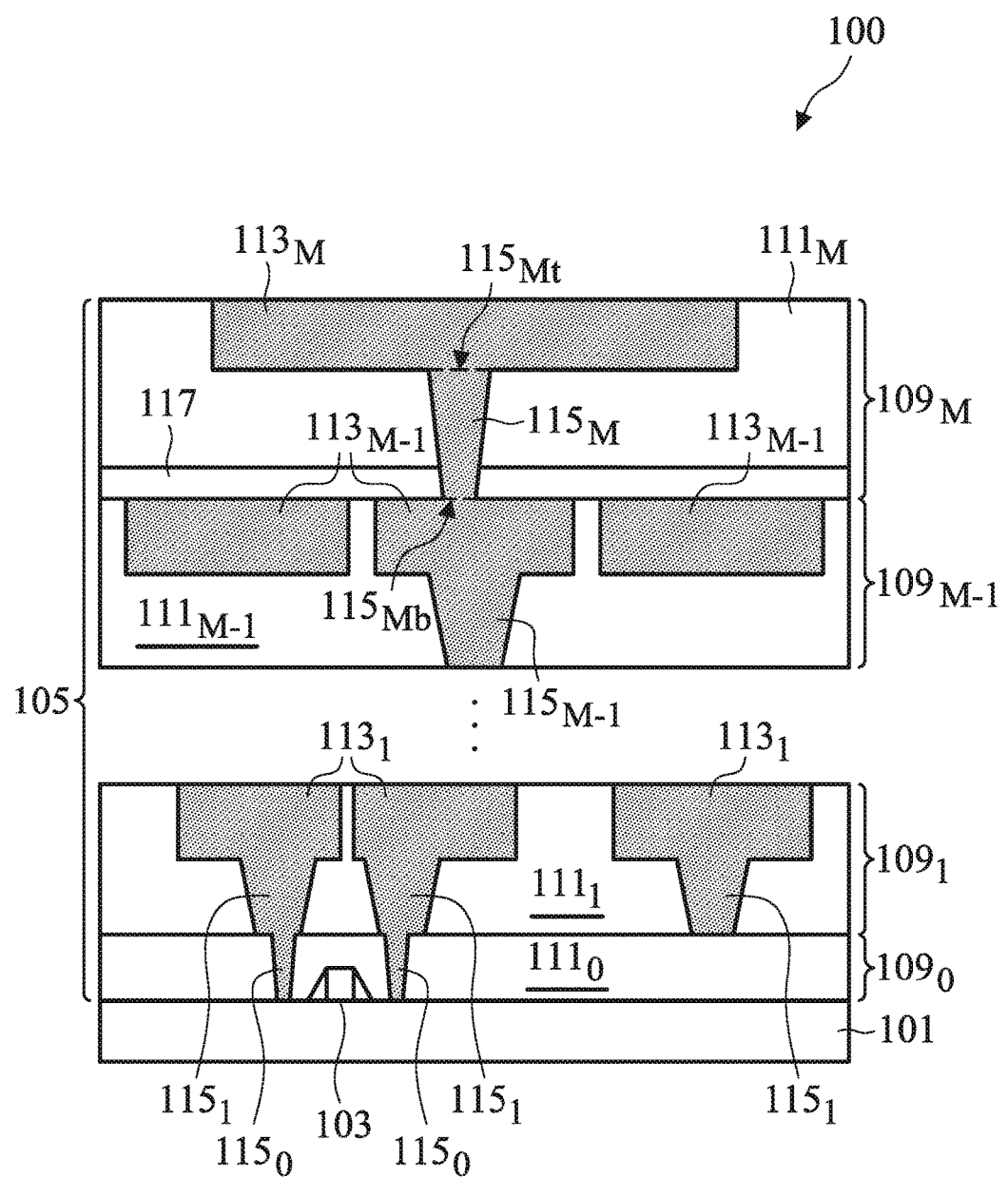

Referring to FIGS. 8A, 8B and 8C, the line openings 701 and the via openings 703 are filled with suitable conductive materials to form the conductive lines $113_M$ and the conductive vias $115_M$. The suitable conductive materials may include copper, aluminum, tungsten, combinations thereof, alloys thereof, or the like. The conductive lines $113_M$ and the conductive vias $115_M$ may further comprise one or more barrier/adhesion layers (not shown) to protect the dielectric layer $111_M$ from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like. In some embodiments, the steps for forming the conductive lines $113_M$ and the conductive vias $115_M$ may include depositing one or more barrier/adhesion layers on sidewalls and bottoms of the line openings 701 and on sidewalls and bottoms of the via openings 703, depositing a seed layer of a suitable conductive material over the one or more barrier/adhesion layers, and filling the line openings 701 and the via openings 703 with a suitable conductive material, for example, by plating, or other suitable methods. Subsequently, excess materials overfilling the line openings 701 are removed to expose a top surface of the dielectric layer $111_M$. In some embodiments, the excess materials may be removed using a CMP process, a grinding process, an etching process, the like, or a combination thereof.

Referring further to FIGS. 8A, 8B and 8C, similar to the openings 703, widths of the conductive vias $115_M$ narrow as the conductive vias $115_M$ extend toward corresponding conductive lines $113_{M-1}$. Furthermore, top view shapes of the conductive vias $115_M$ also change as the conductive vias $115_M$ extend toward corresponding conductive lines $113_{M-1}$. In the illustrated embodiment, top view shapes of top surfaces $115_{Mt}$ of the conductive vias $115_M$ are squares with sharp corners and top view shapes of bottom surfaces $115_{Mb}$ of the conductive vias $115_M$ are squares with rounded corners. In other embodiments, top view shapes of the top surfaces $115_{Mt}$ of the conductive vias $115_M$ may be rectangles, polygons, or the like, with sharp or rounded corners, and top view shapes of the bottom surfaces $115_{Mb}$ of the conductive vias $115_M$ may be circles, ovals, or rectangles, polygons, or the like, with sharp or rounded corners.

In some embodiments, the metallization layer $109_M$ may be the last metallization layer of the interconnect structure 105 and formation of the metallization layer $109_M$ completes formation of the interconnect structure 105. In other embodiments, the metallization layer $109_M$ may be an intermediate metallization layer of the interconnect structure 105. In such embodiments, additional metallization layers are formed over the metallization layer $109_M$ until the formation of the interconnect structure 105 is completed. In some embodiments, further processing steps may be performed on the semiconductor structure 100 after the formation of the interconnect structure 105 is completed. The further processing steps may include formation of contact pads and one or more passivation layers over the interconnect structure 105, formation of under-bump metallizations (UBMs) over the contact pads, and formation of connectors over the UBMs. Subsequently, the semiconductor structure 100 may be singulated into separate dies, which may further undergo various packaging processes.

Figure 9:
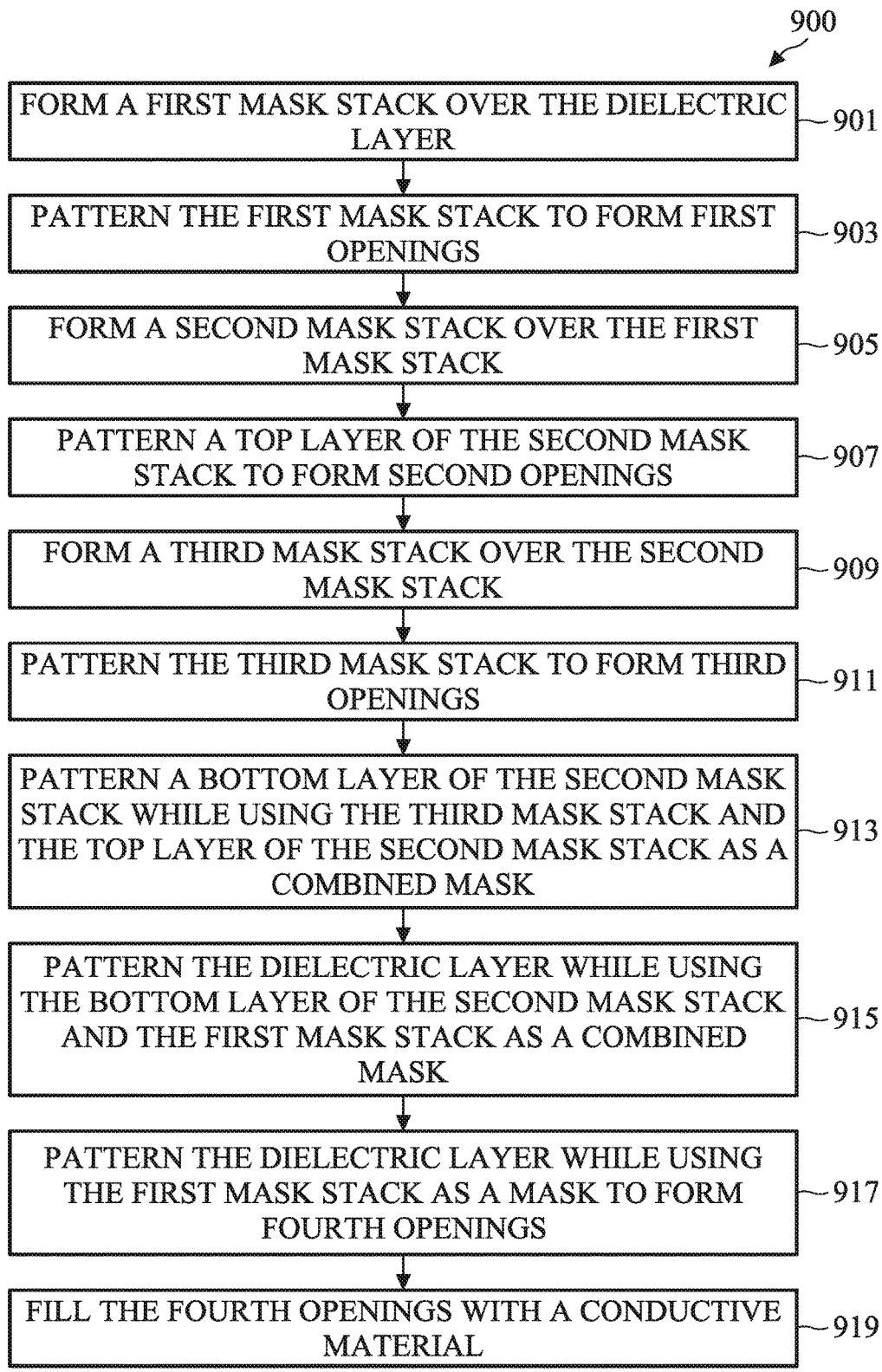
FIG. 9 is a flow diagram illustrating a method of forming a semiconductor structure in accordance with some embodiments.

FIG. 9 is a flow diagram illustrating a method 900 of forming a semiconductor structure in accordance with some embodiments. The method 900 starts with step 901, where a first mask stack (such as the first mask stack 119 illustrated in FIGS. 1A, 1B and 1C) is formed over a dielectric layer (such as the dielectric layer $111_M$ illustrated in FIGS. 1A, 1B and 1C) as described above with reference to FIGS. 1A, 1B and 1C. In step 903, the first mask stack is patterned to form first openings (such as the openings 121 illustrated in FIGS. 1A, 1B and 1C) as described above with reference to FIGS. 1A, 1B and 1C. In step 905, a second mask stack (such as the second mask stack 123 illustrated in FIGS. 1A, 1B and 1C) is formed over the first mask stack as described above with reference to FIGS. 1A, 1B and 1C. In step 907, a top layer (such as the top layer $123_3$ illustrated in FIGS. 3A, 3B and 3C) of the second mask stack is patterned to form second openings (such as the openings 201 and 301 illustrated in FIGS. 3A, 3B and 3C) as described above with reference to FIGS. 1A-3C. In step 909, a third mask stack (such as the third tri-layer mask 303 illustrated in FIGS. 3A, 3B and 3C) is formed over the second mask stack as described above with reference to FIGS. 3A, 3B and 3C. In step 911, the third mask stack is patterned to form third openings (such as the openings 305 illustrated in FIGS. 3A, 3B and 3C) as described above with reference to FIGS. 3A, 3B and 3C. In step 913, a bottom layer (such as the bottom layer $123_1$ illustrated in FIGS. 4A, 4B and 4C) of the second mask stack is patterned while using the third mask stack and the top layer of the second mask stack as a combined mask as described above with reference to FIGS. 4A, 4B and 4C. In step 915, the dielectric layer (such as the dielectric layer $111_M$ illustrated in FIGS. 5A, 5B and 5C) is patterned while using the bottom layer of the second mask stack and the first mask stack as a combined mask as described above with reference to FIGS. 5A, 5B and 5C. In step 917, the dielectric layer is further patterned to form fourth openings (such as the openings 701 and 703 illustrated in FIGS. 7A, 7B and 7C) while using the second mask stack as a mask as described above with reference to FIGS. 7A, 7B and 7C. In step 919, the fourth openings are filled with a conductive material as described above with reference to FIGS. 8A, 8B and 8C.

FIGS. 10A-19C illustrate various intermediate stages of fabrication of a semiconductor structure 1000 in accordance with some embodiments. FIGS. 10A-19C illustrate top and cross-sectional views, wherein an "A" figure represents a top view, a "B" figure represents a first cross-sectional view along the B-B' line of the respective "A" figure, and a "C" figure represents a second cross-sectional view along the C-C' line (parallel to and spaced apart from the B-B' line) of the respective "A" figure. In the embodiments described above with reference to FIGS. 1A-8C, the openings 305 (see FIGS. 3A, 3B and 3C) are transferred to the second mask stack 123 using a single patterning process (see FIGS. 4A, 4B and 4C). In the embodiments described below with reference to FIGS. 10A-19C, openings similar to the openings are transferred to a mask stack similar to the second mask stack 123 using multiple patterning processes.

Figure 10A:
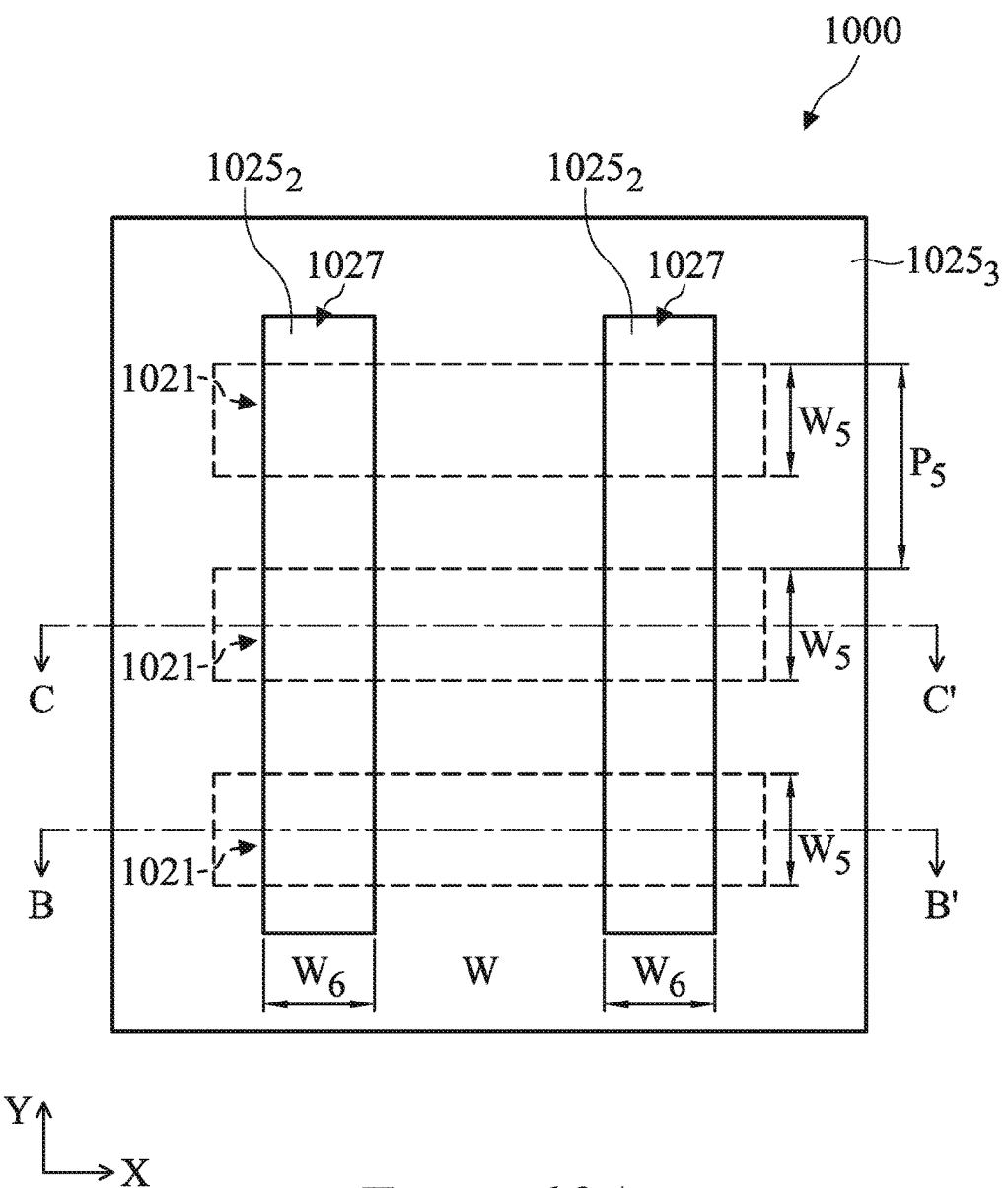
FIGS. 10A-19C illustrate top and cross-sectional views of various intermediate stages of fabrication of a semiconductor structure in accordance with some embodiments.
Figure 10B:
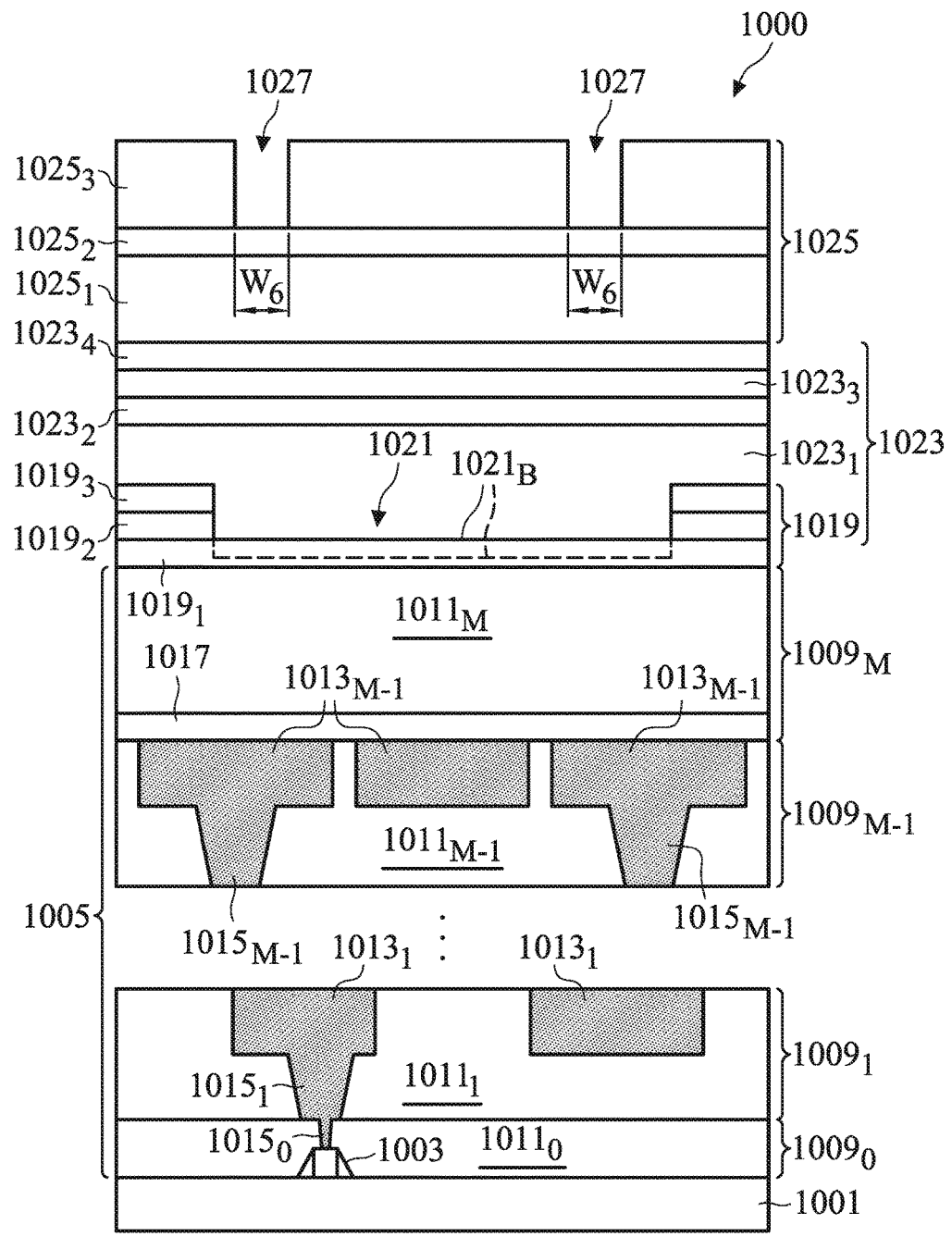
Figure 10C:
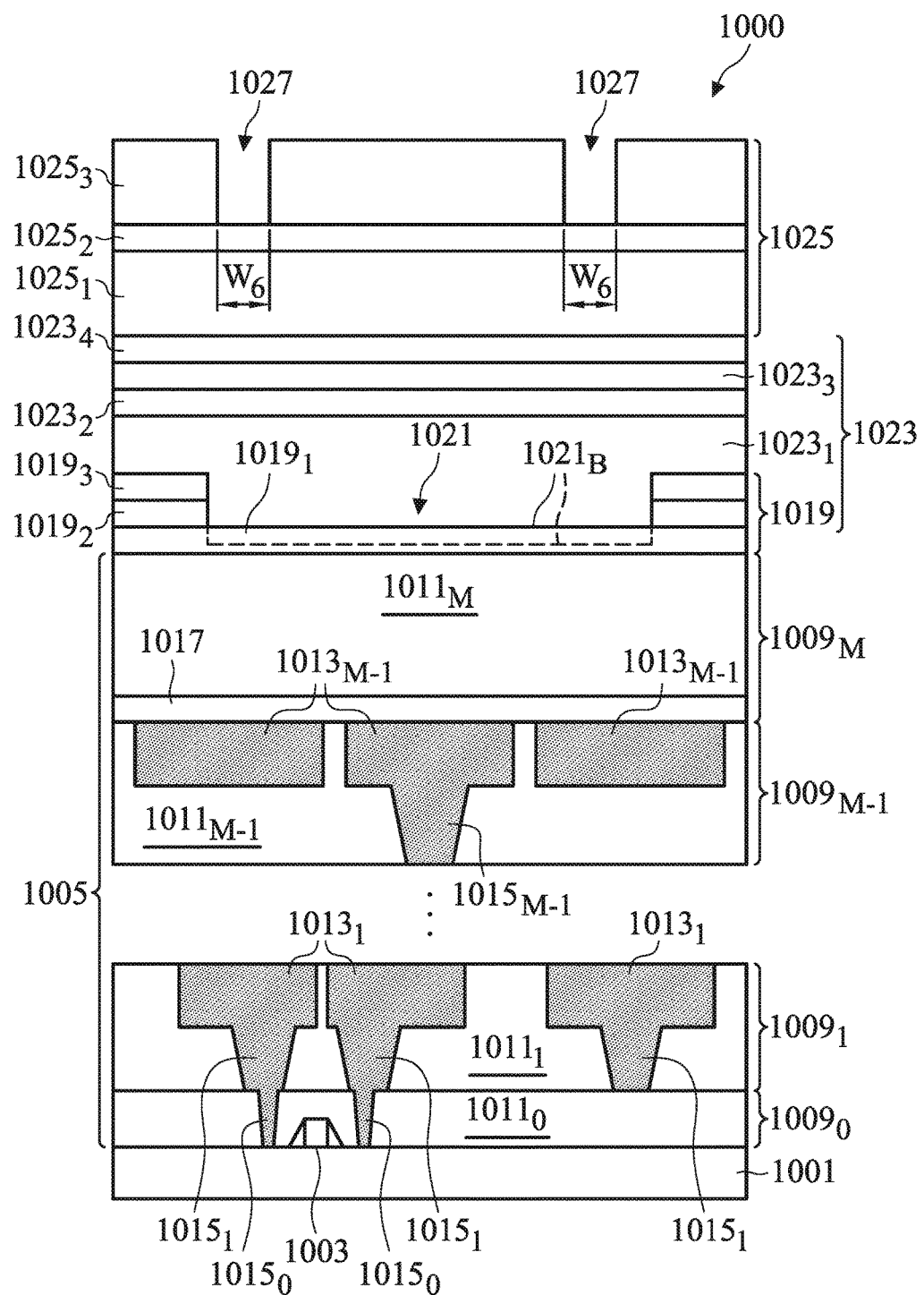

Referring to FIGS. 10A, 10B and 10C, a portion of the semiconductor structure 1000 is illustrated. The semiconductor structure 1000 may be an intermediate structure of an integrated circuit manufacturing process. In some embodiments, the semiconductor structure 1000 may comprise a substrate 1001. The substrate 1001 may comprise similar materials as the substrate 101 described above with reference to FIGS. 1A, 1B and 1C, and the description is not repeated herein for the sake of brevity.

In some embodiments, one or more active and/or passive devices 1003 (illustrated in FIGS. 10B and 10C as a single transistor) are formed on the substrate 1001. The one or more active and/or passive devices 1003 may include similar active and/or passive devices as the one or more active and/or passive devices 103 described above with reference to FIGS. 1A, 1B and 1C, and the description is not repeated herein for the sake of brevity. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 1005 is formed over the one or more active and/or passive devices 1003 and the substrate 1001. The interconnect structure 1005 electrically interconnects the one or more active and/or passive devices 1003 to form functional electrical circuits within the semiconductor structure 1000. The interconnect structure 1005 may comprise one or more metallization layers $1009_0$ to $1009_M$, wherein M+1 is the number of the one or more metallization layers $1009_0$ to $1009_M$. In some embodiments, the value of M may vary according to design specifications of the semiconductor structure 1000. In what follows, the one or more metallization layers $1009_0$ to $1009_M$ may also be collectively referred to as the one or more metallization layers 1009. The one or more metallization layers $1009_0$ to $1009_M$, comprise one or more dielectric layers $1011_0$ to $1011_M$, respectively.

In some embodiments, the dielectric layer $1011_0$ is an inter-layer dielectric (ILD) layer, and the dielectric layers $1011_1$ to $1011_M$ are inter-metal dielectric (IMD) layers. The dielectric layers $1011_0$ to $1011_M$ may be formed using similar materials and methods as the dielectric layers $111_0$ to $111_M$ described above with reference to FIGS. 1A, 1B and 1C, and the description is not repeated herein for the sake of brevity.

In some embodiments, etch stop layers (not shown) may be formed between adjacent ones of the dielectric layers $1011_0$ to $1011_M$. In the illustrated embodiment, such an etch stop layer (ESL) 1017 is formed between the dielectric layers $1011_{M-1}$ and $1011_M$. The etch stop layers aid in patterning the dielectric layers $1011_0$ to $1011_M$ to form openings in the dielectric layers $1011_0$ to $1011_M$. A material for the etch stop layers is chosen such that etch rates of the etch stop layer are less then etch rates of corresponding one of the dielectric layers $1011_0$ to $1011_M$. In an embodiment, an etch rate of the ESL 1017 is less than an etch rate of the dielectric layer $1011_M$. In some embodiments, the ESL 1017 may be formed using similar materials and methods as the ESL 117 described above with reference to FIGS. 1A, 1B and 1C, and the description is not repeated herein for the sake of brevity. In an embodiment, the ESL 1017 comprises a SiOC layer and an aluminum oxide layer over the SiOC layer.

In some embodiments, the dielectric layer $1011_0$ comprises conductive plugs $1015_0$, and the dielectric layers $1011_1$ to $1011_{M-1}$ comprise one or more conductive interconnects, such as conductive lines $1013_1$ to $1013_{M-1}$ and conductive vias $1015_1$ to $1015_{M-1}$. The conductive plugs $1015_0$ electrically couple the one or more active and/or passive devices 1003 to the conductive lines $1013_1$ to $1013_{M-1}$ and the conductive vias $1015_1$ to $1015_{M-1}$. As described below in greater detail, conductive lines $1013_M$ and conductive vias $1015_M$ (not illustrated in FIGS. 10A, 10B and 10C, see FIGS. 19A, 19B and 19C) are formed in the dielectric layer $1011_M$.

In some embodiments, the conductive plugs $1015_0$, the conductive lines $1013_1$ to $1013_{M-1}$, and the conductive vias $1015_1$ to $1015_{M-1}$ may be formed using similar materials and methods as the conductive plugs $115_0$, the conductive lines $113_1$ to $113_{M-1}$, and the conductive vias $115_1$ to $115_{M-1}$ described above with reference to FIGS. 1A, 1B and 1C, and the description is not repeated herein for the sake of brevity. The conductive plugs $1015_0$, the conductive lines $1013_1$ to $1013_{M-1}$, and the conductive vias $115_1$ to $115_{M-1}$ may further comprise one or more barrier/adhesion layers (not shown) to protect the respective dielectric layers $1011_0$ to $1011_{M-1}$ from diffusion and metallic poisoning.

Referring further to FIGS. 10A, 10B and 10C, a first mask stack 1019 is formed over the dielectric layer $1011_M$. In some embodiments, the first mask stack 1019 comprises one or more mask layers. In the illustrated embodiment, the first mask stack 1019 comprises a bottom layer $1019_1$, a middle layer $1019_2$ over the bottom layer $1019_1$, and a top layer $1019_3$ over the middle $1019_2$. The bottom layer $1019_1$, the middle layer $1019_2$, and the top layer $1019_3$ of the first mask stack 1019 may be formed using similar materials and methods as the bottom layer $119_1$, the middle layer $119_2$, and the top layer $119_3$ of the first mask stack 119, respectively, described above with reference to FIGS. 1A, 1B and 1C, and the description is not repeated herein for the sake of brevity. In some embodiments, a thickness of the bottom layer $1019_1$ may be between about 50 Å and about 300 Å, a thickness of the middle layer $1019_2$ may be between about 50 Å and about 300 Å, and a thickness of the top layer $119_3$ may be between about 50 Å and about 300 Å. In other embodiments, the bottom layer $1019_1$ and the top layer $1019_3$ may be omitted. In such embodiments, the first mask stack 1019 may comprise a layer of a nitride material.

The first mask stack 1019 is patterned to form openings 1021 in the first mask stack 1019. The first mask stack 1019 may be patterned using suitable lithography and etching methods. In some embodiments, the openings 1021 extend through the top layer $1019_3$ and the middle layer $1019_2$, and expose the bottom layer $1019_1$. In other embodiments, the openings 1021 may partially or fully extend through the bottom layer $1019_1$, such that bottoms 1021B of the openings 1021 may be within the bottom layer $1019_1$ or may expose the dielectric layer $1011_M$. In some embodiments, a width $W_5$ of the openings 1021 may be between about 10 nm and about 22 nm, and a pitch $P_5$ of the openings 1021 may be between about 20 nm and about 44 nm. In the illustrated embodiment, each of the openings 1021 has a rectangular shape as viewed from top, such that a long side of each rectangular shape is parallel to an x-direction and a short side of each rectangular shape is parallel to a y-direction, with the x-direction being perpendicular to the y-direction. A particular pattern of the openings 1021, as illustrated in FIG. 10A, is provided for the purpose of illustration only, and various different patterns may be formed in the first mask stack 1019 according to design specifications of the semiconductor structure 1000. As described below in greater detail, the openings 1021 are transferred to the dielectric layer $1011_M$ to form openings for conductive interconnects, such as conductive lines.

Referring further to FIGS. 10A, 10B and 10C, a second mask stack 1023 is formed over the first mask stack 1019. In some embodiments, the second mask stack 1023 comprises one or more mask layers. In the illustrated embodiment, the second mask stack 1023 comprises a bottom layer $1023_1$, a first middle layer $1023_2$ over the bottom layer $1023_1$, a second middle layer $1023_3$ over the first middle layer $1023_2$, and a top layer $1023_4$ over the second middle layer $1023_3$. The bottom layer $1023_1$ may comprise an organic material, such as a spin-on carbon (SOC) material, or the like, and may be formed using spin-on coating, CVD, ALD, or the like. In some embodiment, a thickness of the bottom layer $1023_1$ may be between about 500 Å and about 2000 Å, such as about 2000 Å. The first middle layer $1023_2$ and the top layer $1023_4$ may comprise an oxide material, such as silicon oxide, or the like, and may be formed using CVD, ALD, or the like. In some embodiment, a thickness of the first middle layer $1023_2$ may be between about 50 Å and about 300 Å, such as about 100 Å, a thickness of the top layer $1023_4$ may be between about 50 Å and about 300 Å, such as about 100 Å. The second middle layer $1023_3$ may comprise a nitride material, such as silicon nitride (SiN), silicon oxynitride (SiON), titanium nitride (TiN), tantalum nitride (TaN), or the like, and may be formed using CVD, ALD, or the like. In some embodiment, a thickness of the second middle layer $1023_3$ may be between about 50 Å and about 300 Å, such as about 200 Å. As described below in greater detail, the second mask stack 1023 is patterned to form openings in the second mask stack 1023. Subsequently, portions of the openings are transferred to the dielectric layer $1011_M$ to form via openings in the dielectric layer $1011_M$, which are filled with suitable conductive materials to form conductive interconnects, such as conductive vias.

Referring further to FIGS. 10A, 10B and 10C, a first tri-layer mask 1025 is formed over the second mask stack 1023. In some embodiments, the first tri-layer mask 1025 comprises a bottom layer $1025_1$, a middle layer $1025_2$ over the bottom layer $1025_1$, and a top layer $1025_3$ over the middle layer $1025_2$. In some embodiments, the bottom layer $1025_1$, the middle layer $1025_2$ and the top layer $1025_3$ of the first tri-layer mask 1025 may be formed using similar materials and methods as the bottom layer $125_1$, the middle layer $125_2$ and the top layer $125_3$ of the first tri-layer mask 125, respectively, described above with reference to FIGS. 1A, 1B and 1C, and the description is not repeated herein for the sake of brevity. In some embodiment, a thickness of the top layer $1025_1$ may be between about 500 Å and about 2000 Å, such as about 2000 Å, a thickness of the middle layer $1025_2$ may be between about 200 Å and about 500 Å, such as about 300 Å, and a thickness of the top layer $1025_3$ may be between about 500 Å and about 1000 Å, such as about 600 Å.

In some embodiments, the top layer $1025_3$ is patterned to form openings 1027 in the top layer $1025_3$. In some embodiments, the top layer $1025_3$ may be patterned using similar methods as the top layer $125_3$ of the first tri-layer mask 125 described above with reference to FIGS. 1A, 1B and 1C, and the description is not repeated herein for the sake of brevity. In some embodiments, a width $W_6$ of the openings 1027 is between about 10 nm and about 44 nm. In some embodiments, the width $W_6$ of the openings 1027 may be substantially equal to the width $W_5$ of the openings 1021. In other embodiments, the width $W_6$ of the openings 1027 may be different from the width $W_5$ of the openings 1021. In the illustrated embodiment, each of the openings 1027 has a rectangular shape as viewed from top, such that a long side of each rectangular shape is parallel to the y-direction and a short side of each rectangular shape is parallel to the x-direction. Furthermore, the openings 1027 overlap with the openings 1021 as viewed from top. A particular pattern of the openings 1027, as illustrated in FIG. 10A, is provided for the purpose of illustration only, and various different patterns may be formed in the top layer $1025_3$ according to design specifications of the semiconductor structure 1000.

Figure 11A:
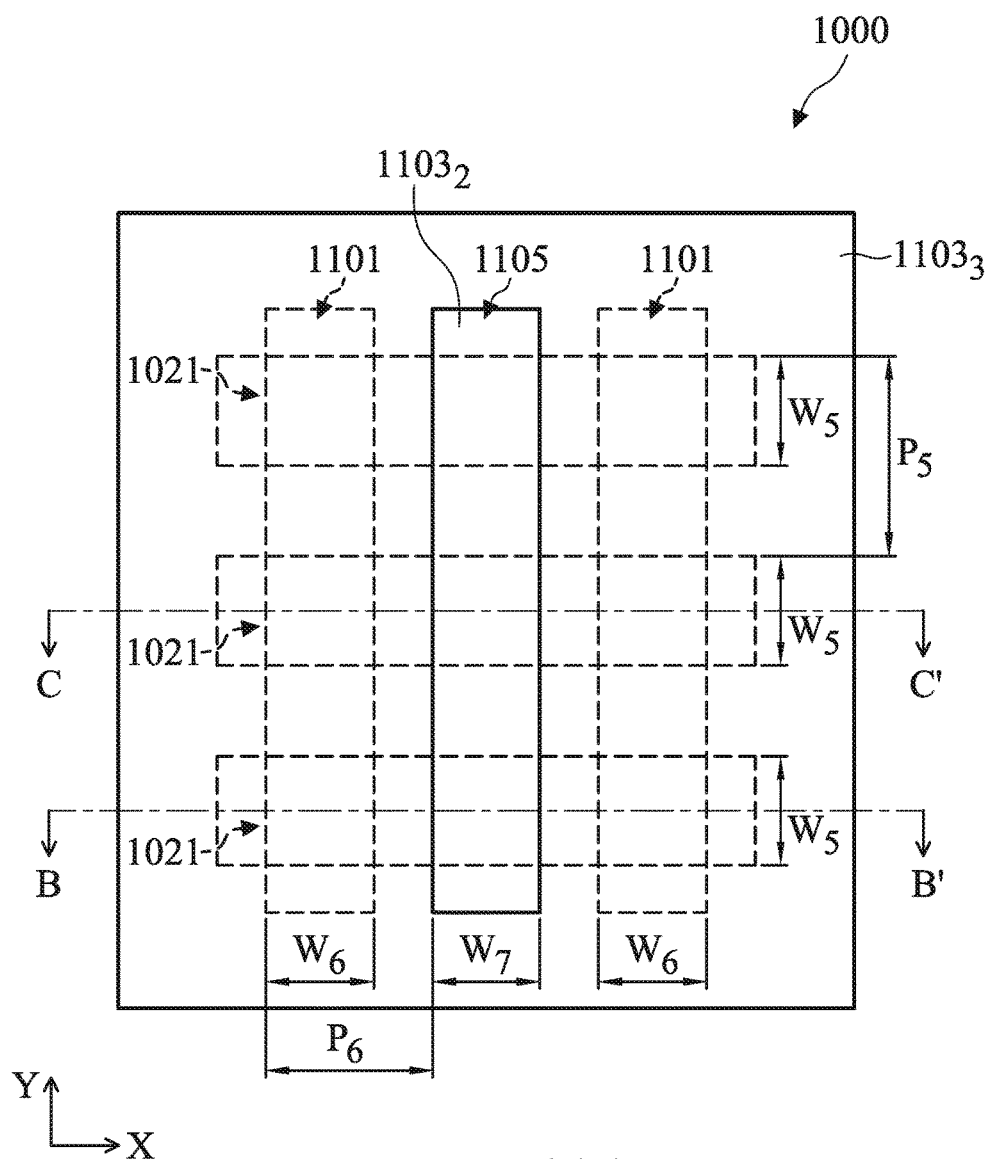
Figure 11B:
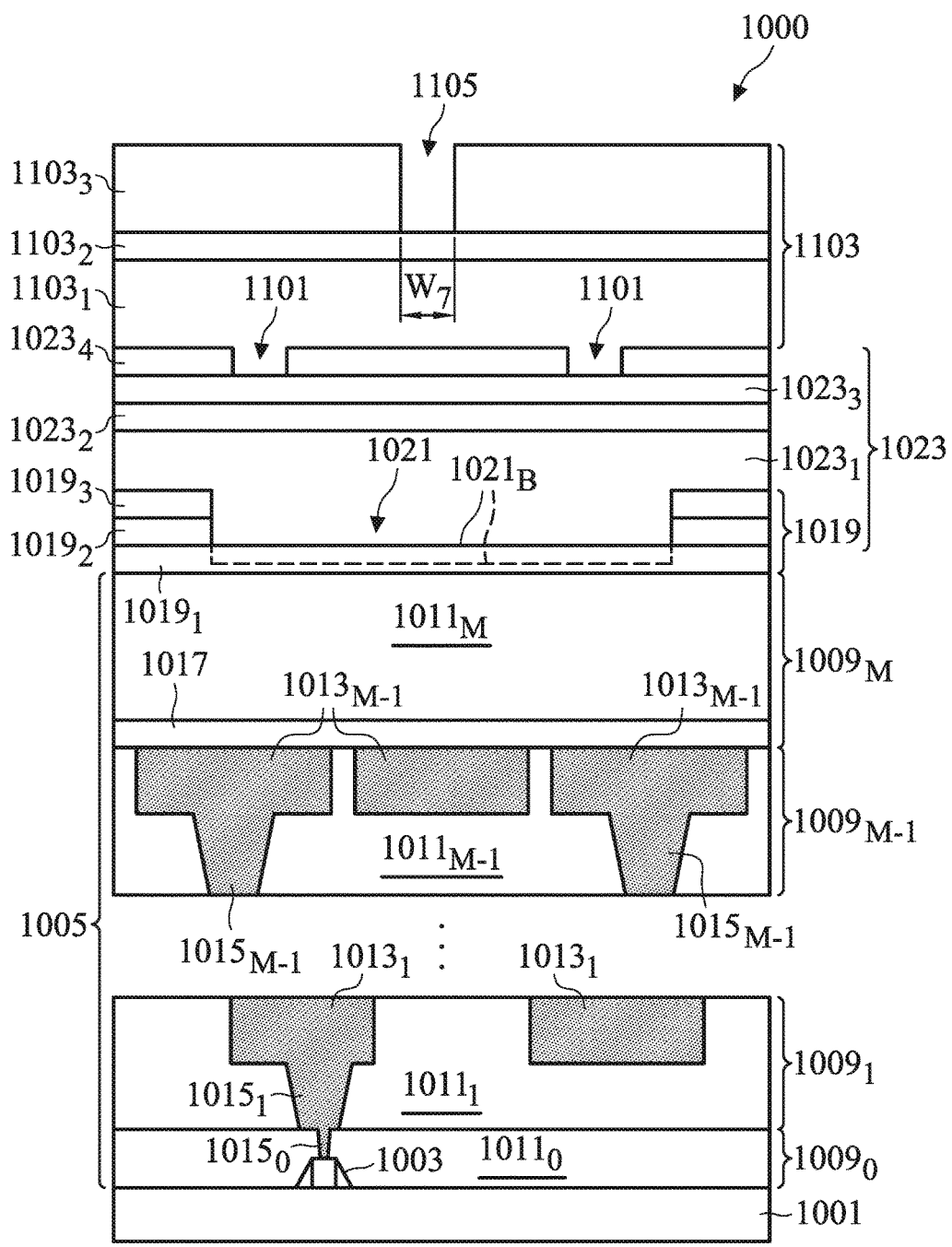
Figure 11C:
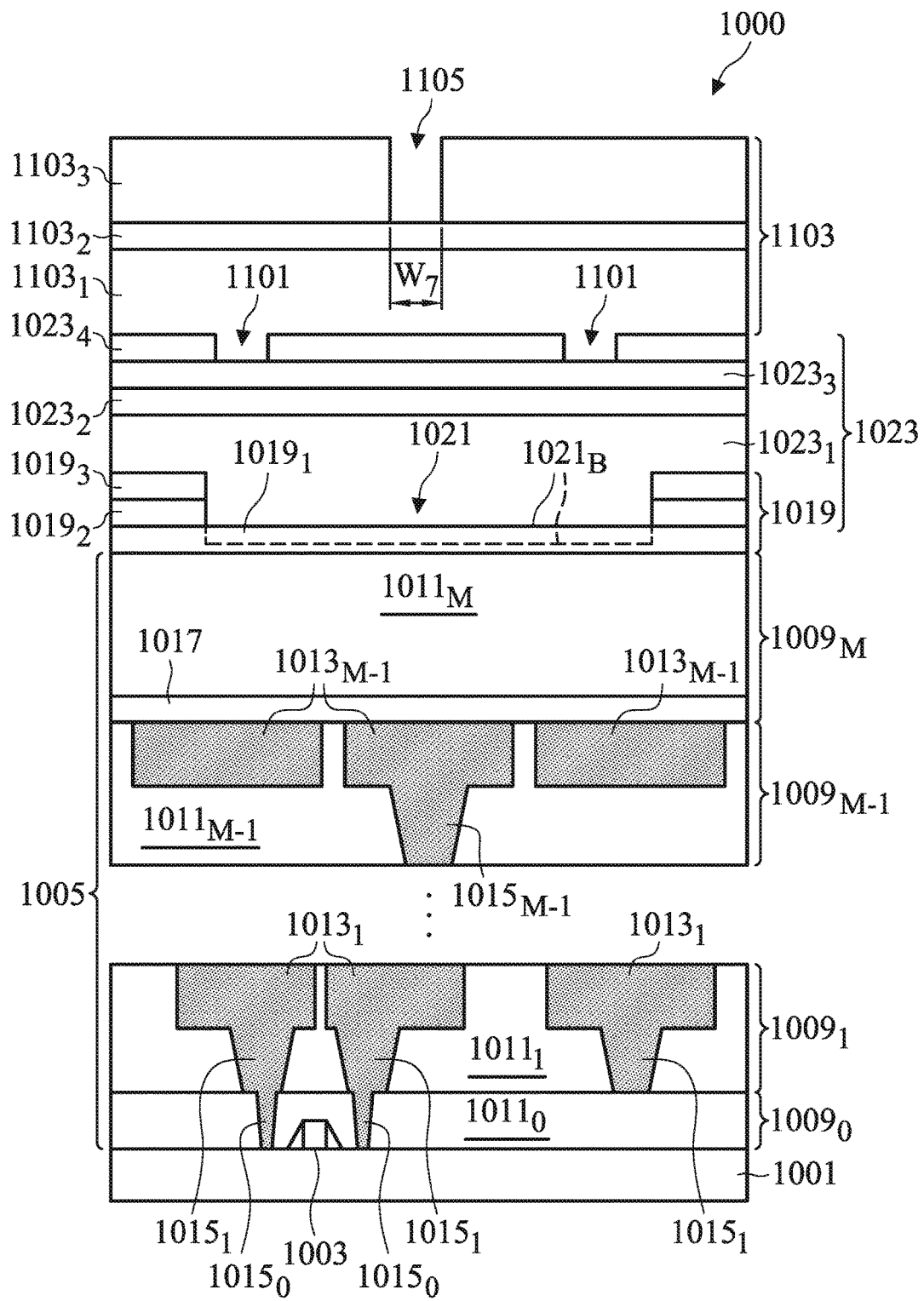

Referring to FIGS. 11A, 11B and 11C, a first patterning process is performed on the second mask stack 1023 to transfer the openings 1027 (see FIGS. 10A, 10B and 10C) in the first tri-layer mask 1025 to the second mask stack 1023. The first patterning process forms openings 1101 in the top layer $1023_4$ of the second mask stack 1023. In some embodiments, the first patterning process comprises one or more etching processes, where the first tri-layer mask 1025 (see FIGS. 10A, 10B and 10C) is used as an etch mask. The one or more etching processes may include anisotropic wet etching processes, anisotropic dry etching processes, or combinations thereof. Accordingly, the openings 1101 in the top layer $1023_4$ of the second mask stack 1023 have approximately same sizes and the same pitch as respective openings 1027 in the first top layer $1025_3$ of the first tri-layer mask 1025 (see FIGS. 10A, 10B and 10C). Furthermore, in the illustrated embodiment, the openings 1101 overlap with the openings 1021 as viewed from top, with a pattern of the openings 1101 being the same as the pattern of the openings 1027 as viewed from top. During the first patterning process, the top layer $1025_3$, the middle layer $1025_2$, and the bottom layer $1025_1$ of the first tri-layer mask 1025 may be consumed. If any residue of the top layer $1025_3$, the middle layer $1025_2$, and the bottom layer $1025_1$ of the first tri-layer mask 1025 is left over the second mask stack 1023 after the first patterning processes, the residue may also be removed.

Referring further to FIGS. 11A, 11B and 11C, a second tri-layer mask 1103 is formed over the second mask stack 1023. In some embodiments, the second tri-layer mask 1103 comprises a bottom layer $1103_1$, a middle layer $1103_2$ over the bottom layer $1103_1$, and a top layer $1103_3$ over the middle layer $1103_2$. In some embodiments, the bottom layer $1103_1$, the middle layer $1103_2$ and the top layer $1103_3$ of the second tri-layer mask 1103 may be formed using similar materials and methods as the bottom layer $125_1$, the middle layer $125_2$ and the top layer $125_3$ of the first tri-layer mask 125, respectively, described above with reference to FIGS. 1A, 1B and 1C, and the description is not repeated herein for the sake of brevity. In some embodiment, a thickness of the top layer $1103_1$ may be between about 500 Å and about 2000 Å, such as about 2000 Å, a thickness of the middle layer $1103_2$ may be between about 200 Å and about 500 Å, such as about 300 Å, and a thickness of the top layer $1103_3$ may be between about 500 Å and about 1000 Å, such as about 600 Å.

The top layer $1103_3$ of the second tri-layer mask 1103 is patterned to form an opening 1105 in the top layer $1103_3$. In some embodiments, the top layer $1103_3$ may be patterned using similar methods as the top layer $125_3$ of the first tri-layer mask 125 described above with reference to FIGS. 1A, 1B and 1C, and the description is not repeated herein for the sake of brevity. In some embodiments, a width $W_7$ of the opening 1105 is between about 10 nm and about 44 nm. In some embodiments, the width $W_6$ of the openings 1027 may be substantially equal to the width $W_6$ of the opening 1105. In other embodiments, the width $W_6$ of the openings 1027 may be different from the width $W_6$ of the opening 1105. In the illustrated embodiment, the opening 1105 has a rectangular shape as viewed from top, such that a long side of the rectangular shape is parallel to the y-direction and a short side of the rectangular shape is parallel to the x-direction. Furthermore, the opening 1105 is interposed between the openings 1101, and the openings 1101 and the opening 1105 form a pattern having a pitch $P_6$. In some embodiments, the pitch $P_5$ is between about 20 nm and about 44 nm. In some embodiments, the pitch $P_6$ may be substantially equal to the pitch $P_5$. In other embodiments, the pitch $P_6$ may be different from the pitch $P_5$. In addition, the opening 1105 overlaps with the openings 1021 as viewed from top.

Figure 12A:
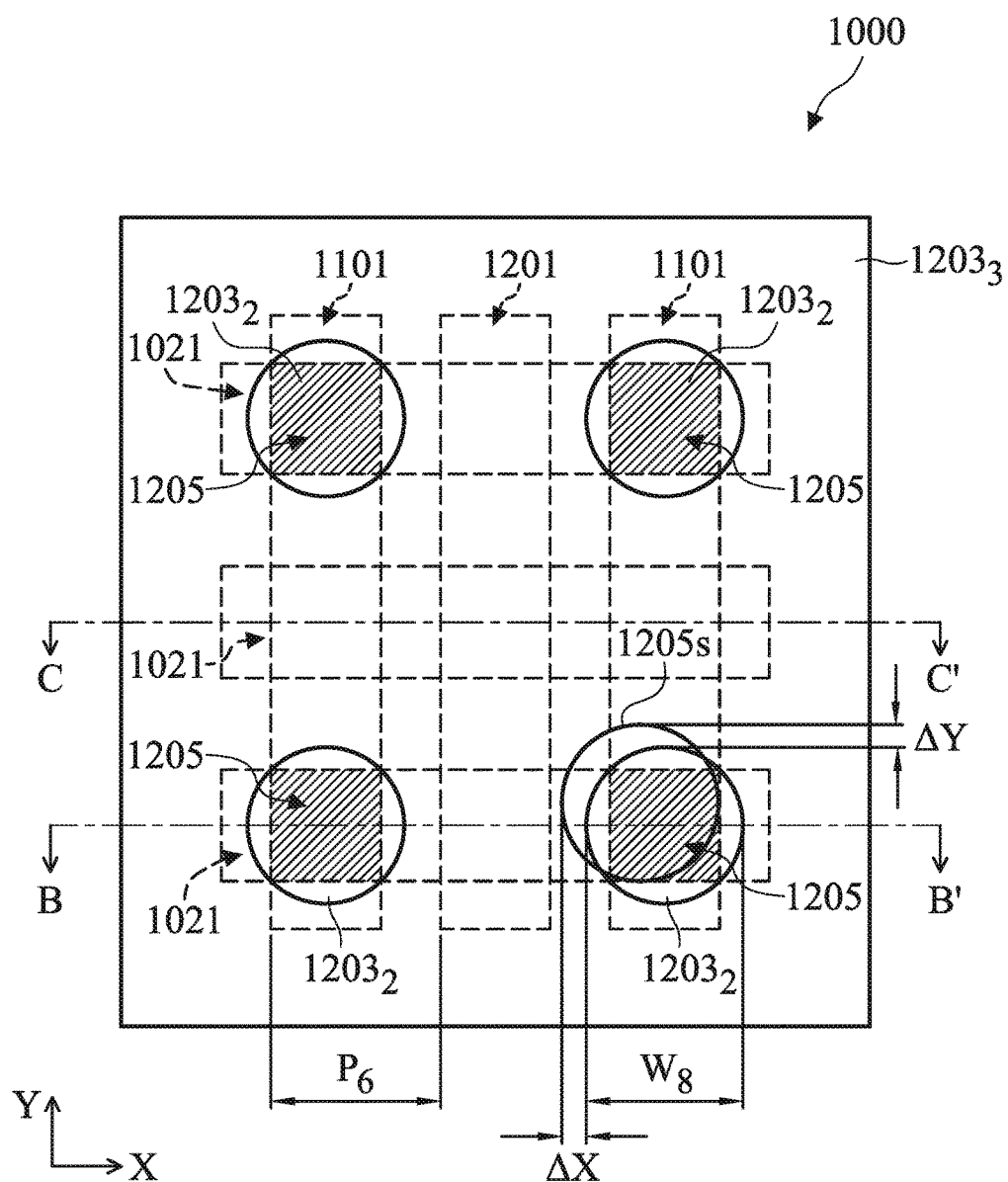
Figure 12B:
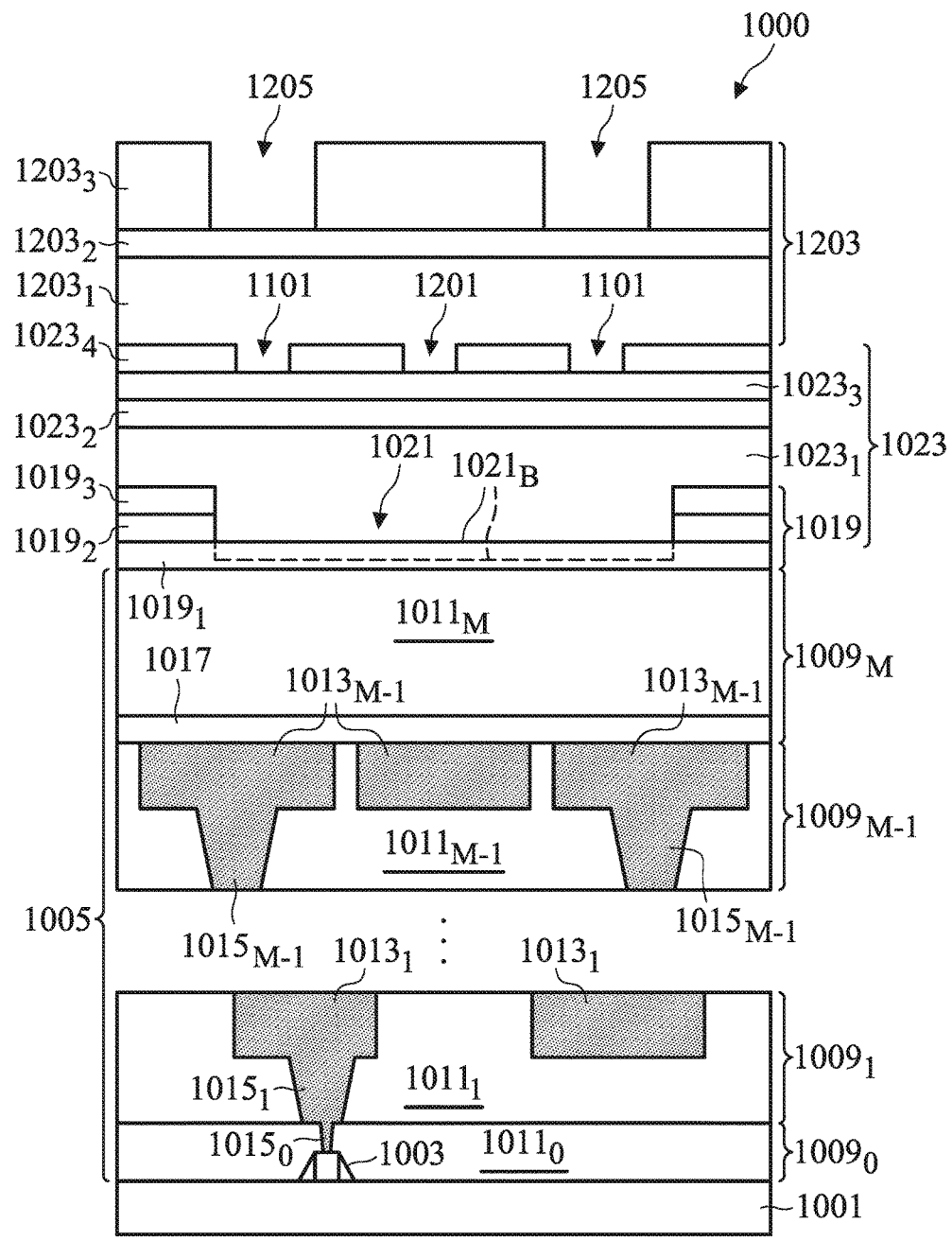
Figure 12C:
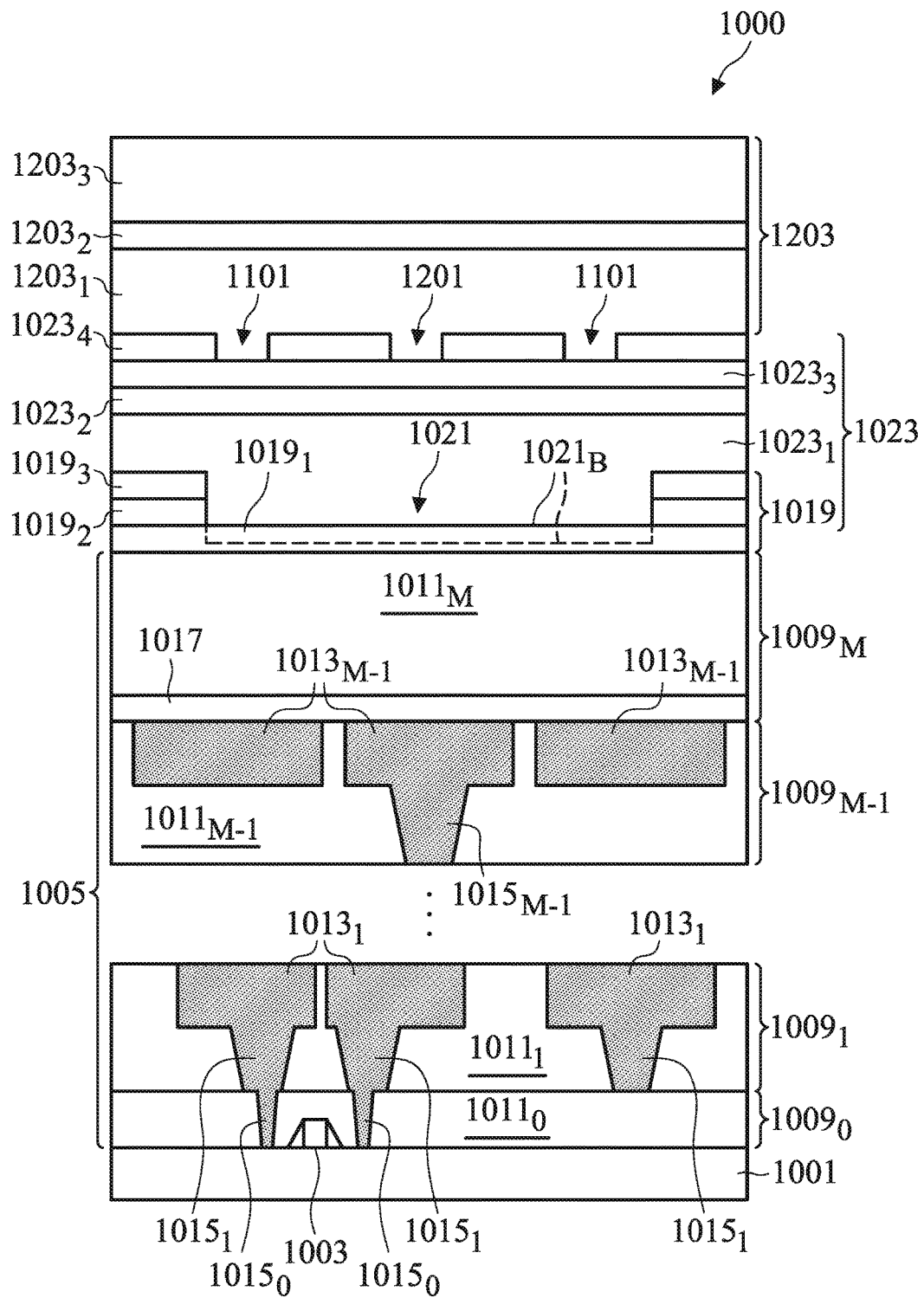

Referring to FIGS. 12A, 12B and 12C, a second patterning process is performed on the second mask stack 1023 to transfer the opening 1105 in the second tri-layer mask 1103 (see FIGS. 11A, 11B and 11C) to the second mask stack 1023. The second patterning process forms an opening 1201 in the top layer $1023_3$ of the second mask stack 1023. In some embodiments, the second patterning process comprises one or more etching processes, where the second tri-layer mask 1103 (see FIGS. 11A, 11B and 11C) is used as an etch mask. The one or more etching processes may include anisotropic wet etching processes, anisotropic dry etching processes, or combinations thereof. Accordingly, the opening 1201 in the top hard mask layer $1023_3$ has approximately the same size as the opening 1105 in the top layer $1103_3$ of the second tri-layer mask 1103 (see FIGS. 11A, 11B and 11C). During the second patterning process, the top layer $1103_3$, the middle layer $1103_2$, and the bottom layer $1103_1$ of the second tri-layer mask 1103 may be consumed. If any residue of the top layer $1103_3$, the middle layer $1103_2$, and the bottom layer $1103_1$ of the second tri-layer mask 1103 is left over the second mask stack 123 after the second patterning process, the residue may also be removed.

In the illustrated embodiment, the opening 1201 has a rectangular shape as viewed from top, such that a long side of the rectangular shape is parallel to the y-direction and a short side of the rectangular shape is parallel to the x-direction. The opening 1201 is interposed between the openings 1101, and the openings 1101 and the opening 1201 form a pattern having the pitch $P_6$. The openings 1101 and 1201 overlap with the openings 1021 as viewed from top. As described below in greater detail, the openings 1021 are used to align subsequently formed conductive vias in the y-direction, and the openings 1101 and 1201 are used to align subsequently formed conductive vias in the x-direction. As described above in greater detail, the openings 1101 and 1201 in the top layer $1023_4$ of the second mask stack 1023 are formed using two patterning process. In some embodiments, the use of multiple patterning processes allow for avoiding the optical proximity effect while patenting the openings 1101 and 1201.

Referring further to FIGS. 12A, 12B and 12C, a third tri-layer mask 1203 is formed over the second mask stack 1023. In some embodiments, the third tri-layer mask 1203 comprises a bottom layer $1203_1$, a middle layer $1203_2$ over the bottom layer $1203_1$, and a top layer $1203_3$ over the middle layer $1203_2$. In some embodiments, the bottom layer $1203_1$, the middle layer $1203_2$ and the top layer $1203_3$ of the third tri-layer mask 1203 may be formed using similar materials and methods as the bottom layer $125_1$, the middle layer $125_2$ and the top layer $125_3$ of the first tri-layer mask 125, respectively, described above with reference to FIGS. 1A, 1B and 1C, and the description is not repeated herein for the sake of brevity. In some embodiments, a thickness of the top layer $1203_1$ may be between about 500 Å and about 2000 Å, such as about 2000 Å, a thickness of the middle layer $1203_2$ may be between about 200 Å and about 500 Å, such as about 300 Å, and a thickness of the top layer $1203_3$ may be between about 500 Å and about 1000 Å, such as about 600 Å.

The top layer $1203_3$ of the third tri-layer mask 1203 is patterned to form openings 1205 in the top layer $1203_3$. In some embodiments, the top layer $1203_3$ of the third tri-layer mask 1203 may be patterned using similar methods as the top layer $125_3$ of the first tri-layer mask 125 described above with reference to FIGS. 1A, 1B and 1C, and the description is not repeated herein for the sake of brevity. In some embodiments, a width $W_8$ of the openings 1205 is between about 20 nm and about 88 nm. In an embodiment, the width $W_8$ is greater than the widths $W_5$, and $W_6$. In other embodiments, the width $W_8$ may be substantially equal to the widths $W_5$ or $W_6$. In the illustrated embodiment, the openings 1205 overlap with the openings 1021 and 1101 as viewed from top, such that each of the openings 1205 overlaps with one of the openings 1021 and one of the openings 1101. The portions of the openings 1205 overlapping with the openings 1021 and 1101 are shaded in FIG. 12A for the purpose of illustration. In the illustrated embodiments, the openings 1205 have circular shapes as viewed from top. In other embodiments, the openings 1205 may have other suitable shapes, such as oval shapes, square shapes, rectangular shapes, polygonal shapes, or the like, as viewed from top.

As described below in greater detail, the shaded portions of the openings 1205 are transferred to the dielectric layer $1011_M$ to form via openings in the dielectric layer $1011_M$, which are filled with suitable conductive materials to form conductive interconnects, such as conductive vias. In some embodiments, due to lithography process variations, locations of the openings 1205 in the top layer $1203_3$ of the third tri-layer mask 1203 may shift from desired locations. Such a shifted opening 1205s is illustrated in FIG. 12A, where a center of the opening 1205s is shifted from a desired location (a center of the unshifted opening 1205) by a distance Δx in the x-direction and a distance Δy in the y-direction. Since an overlap of the shifted opening 1205s with the opening 1021 and the opening 1101 determines an opening for conductive vias, such an undesired overlay shift of the shifted opening 1205s may be mitigated provided that the maximum overlay shift in the y-direction, $\Delta y_{max}$, is less than a distance between adjacent openings 1021, and the maximum overlay shift in the x-direction, $\Delta x_{max}$, is less than a distance between the opening 1101 and the adjacent opening 1201. In some embodiments, the maximum overlay shift in the x-direction, $\Delta x_{max}$, is between about 5 nm and about 22 nm, and the maximum overlay shift in the y-direction, $\Delta y_{max}$, is between about 5 nm and about 11 nm.

Figure 13A:
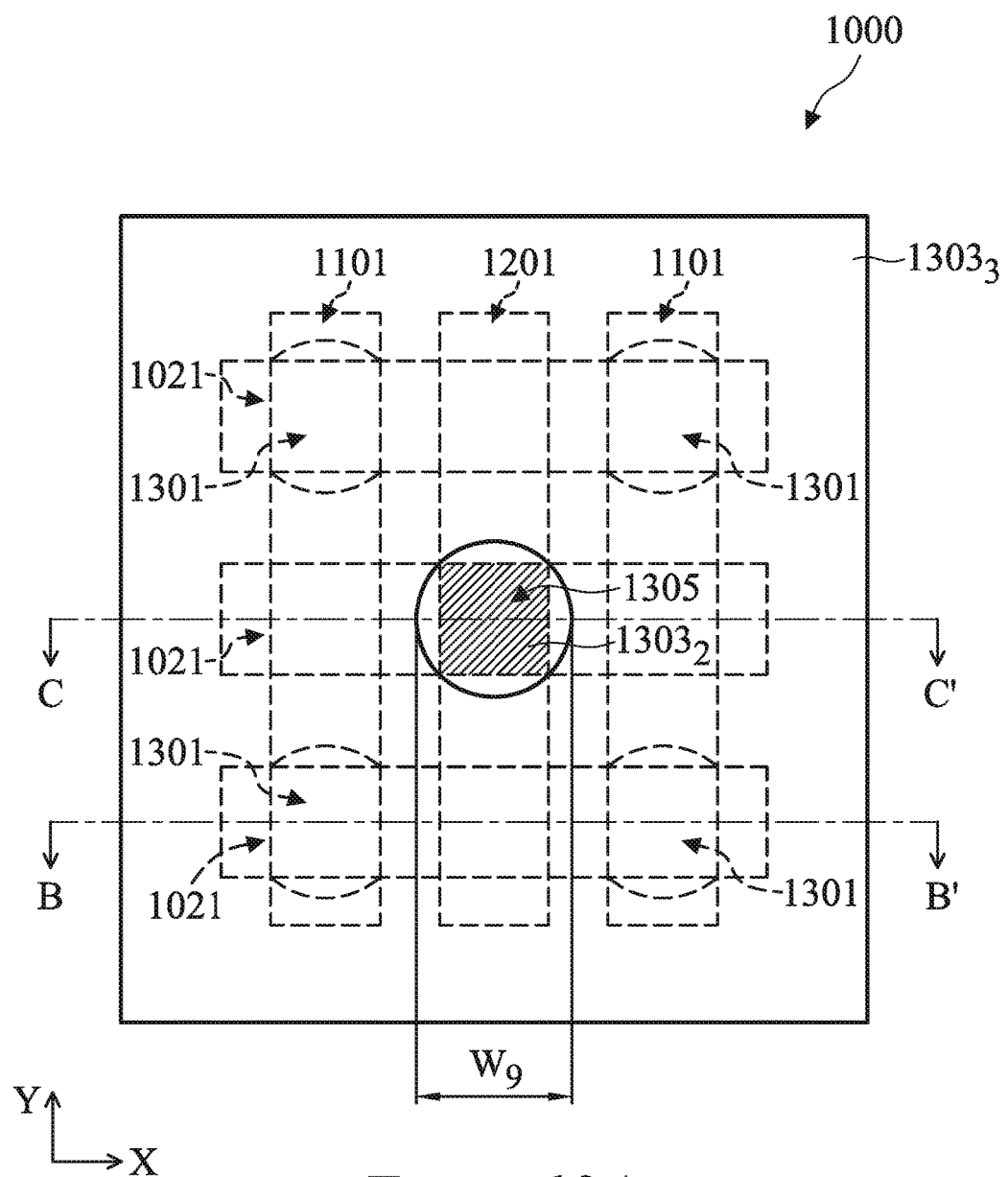
Figure 13B:
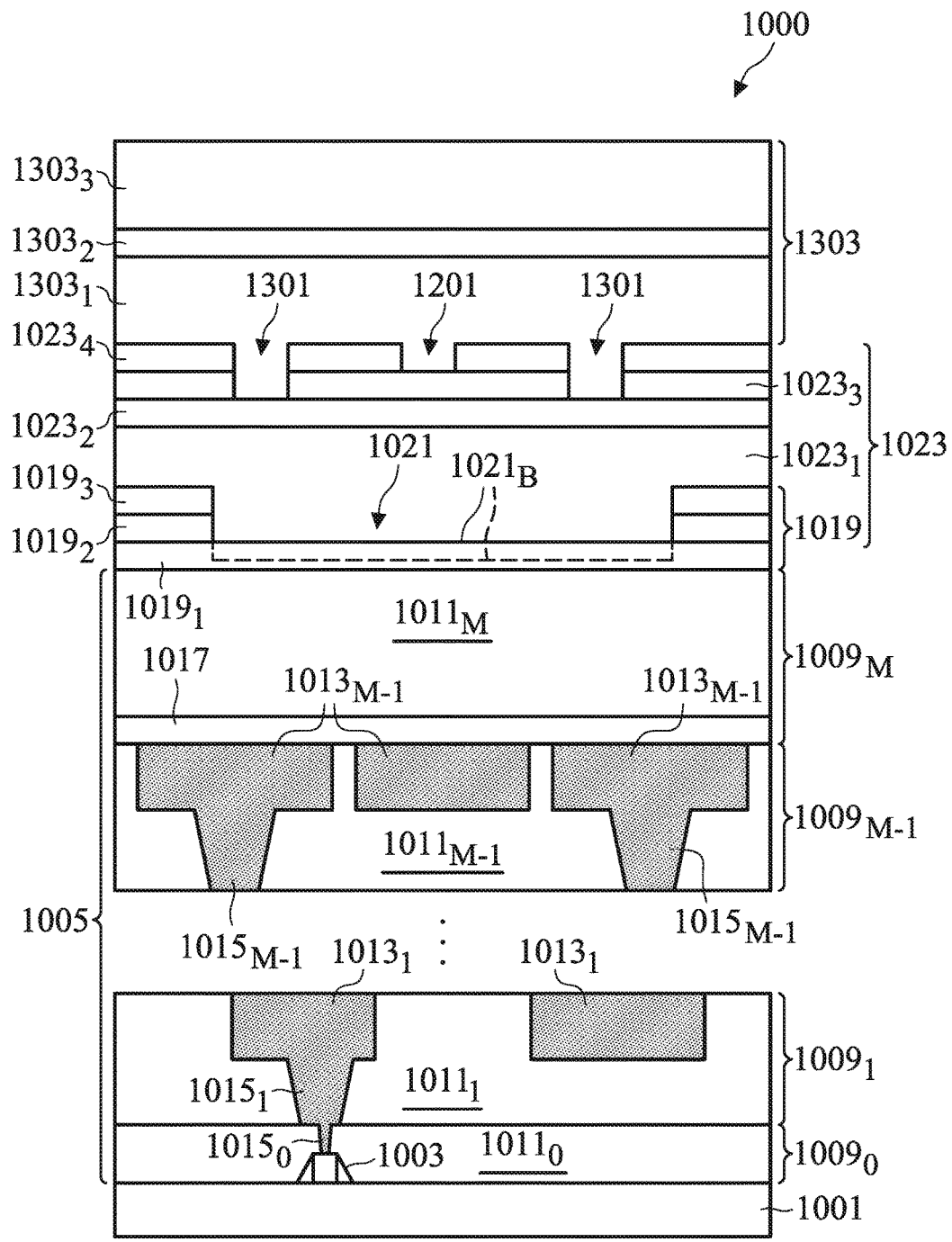
Figure 13C:
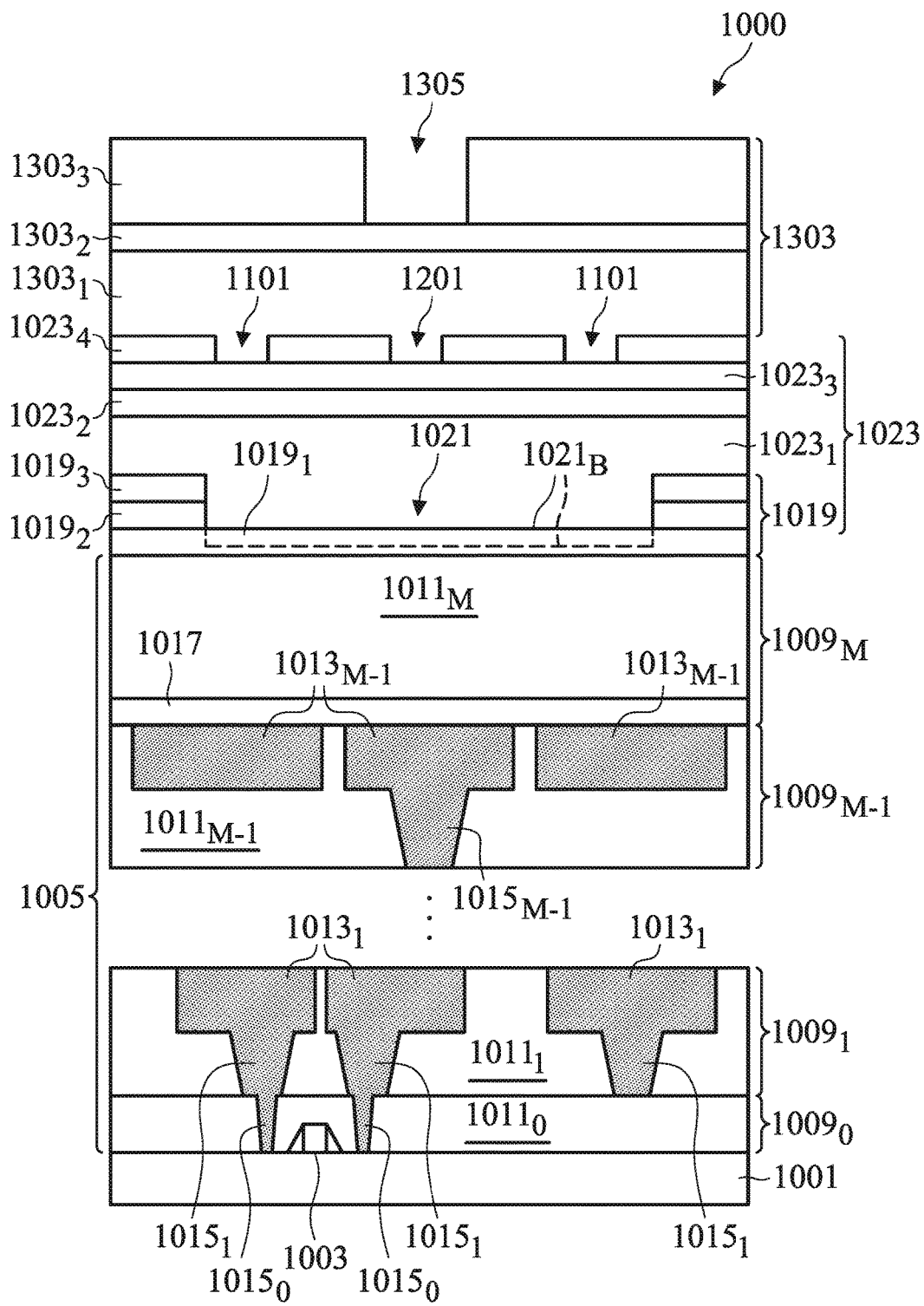

Referring to FIGS. 13A, 13B and 13C, a third patterning process is performed on the second mask stack 1023 to transfer overlaps of the openings 1205 with the corresponding openings 1101 to the second mask stack 1023 (see FIGS. 12A, 12B and 12C). The third patterning process forms openings 1301 in the second middle layer $1023_3$ of the second mask stack 1023. In some embodiments, the third patterning process comprises one or more etching processes, where the third tri-layer mask 1203 and the top layer $1023_4$ of the second mask stack 1023 (see FIGS. 12A, 12B and 12C) is used as a combined etch mask. The one or more etching processes may include anisotropic wet etching processes, anisotropic dry etching processes, or combinations thereof. During the third patterning process, the top layer $1203_3$, the middle layer $1203_2$, and the bottom layer $1203_1$ of the third tri-layer mask 1203 mask may be consumed. If any residue of the top layer $1203_3$, the middle layer $1203_2$, and the bottom layer $1203_1$ of the third tri-layer mask 1203 is left over the second mask stack 1023 after the third patterning process, the residue may also be removed.

Referring further to FIGS. 13A, 13B and 13C, a fourth tri-layer mask 1303 is formed over the second mask stack 1023. In some embodiments, the fourth tri-layer mask 1303 comprises a bottom layer $1303_1$, a middle layer $1303_2$ over the bottom layer $1303_1$, and a top layer $1303_3$ over the middle layer $1303_2$. In some embodiments, the bottom layer $1303_1$, the middle layer $1303_2$ and the top layer $1303_3$ of the fourth tri-layer mask 1303 may be formed using similar materials and methods as the bottom layer $125_1$, the middle layer $125_2$ and the top layer $125_3$ of the first tri-layer mask 125, respectively, described above with reference to FIGS. 1A, 1B and 1C, and the description is not repeated herein for the sake of brevity. In some embodiments, a thickness of the top layer $1303_1$ may be between about 500 Å and about 2000 Å, such as about 2000 Å, a thickness of the middle layer $1303_2$ may be between about 200 Å and about 500 Å, such as about 300 Å, and a thickness of the top layer $1303_3$ may be between about 500 Å and about 1000 Å, such as about 600 Å.

The top layer $1303_3$ of the fourth tri-layer mask 1303 is patterned to form openings 1305 in the top layer $1303_3$. In some embodiments, the top layer $1303_3$ of the fourth tri-layer mask 1303 may be patterned using similar methods as the top layer $125_3$ of the first tri-layer mask 125 described above with reference to FIGS. 1A, 1B and 1C, and the description is not repeated herein for the sake of brevity. In some embodiments, a width $W_9$ of the openings 1305 is between about 20 nm and about 88 nm. In an embodiment, the width $W_9$ is greater than the widths $W_5$ and $W_7$. In other embodiments, the width $W_9$ may be substantially equal to the widths $W_5$ or $W_7$. In the illustrated embodiment, the opening 1305 overlaps with the one of the openings 1021 and the opening 1201 as viewed from top. The portion of the opening 1305 overlapping with the openings 1021 and 1201 are shaded in FIG. 13A for the purpose of illustration. In the illustrated embodiments, the opening 1305 has a circular shape as viewed from top. In other embodiments, the opening 1305 may have other suitable shapes, such as oval shapes, square shapes, rectangular shapes, polygonal shapes, or the like, as viewed from top.

As described below in greater detail, the shaded portion of the opening 1305 is transferred to the dielectric layer $1011_M$ to form a via opening in the dielectric layer $1011_M$, which is filled with a suitable conductive material to form a conductive interconnect, such as a conductive via. Similar to the openings 1205 (see FIGS. 12A, 12B and 12C), due to lithography process variations, a location of the opening 1305 in the top layer $1203_3$ of the third tri-layer mask 1203 may shift from a desired location. Since an overlap of the opening 1305 with the opening 1021 and the opening 1201 determines an opening for a conductive via, an undesired overlay shift of the opening 1305 may be mitigated provided that the maximum overlay shift in the y-direction, $\Delta y_{max}$, is less than a distance between adjacent openings 1021, and the maximum overlay shift in the x-direction, $\Delta x_{max}$, is less than a distance between the opening 1201 and the adjacent opening 1101.

Figure 14A:
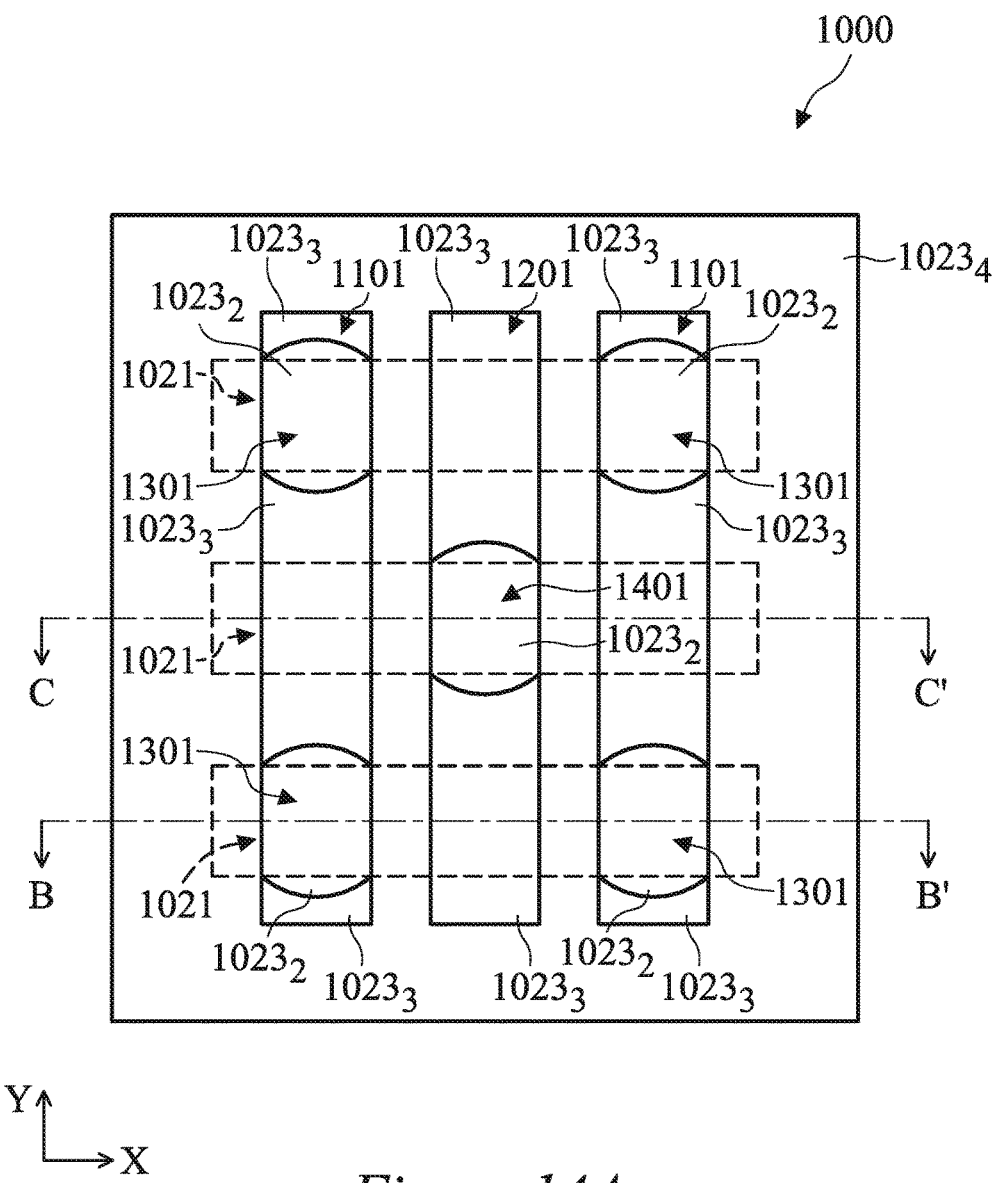
Figure 14B:
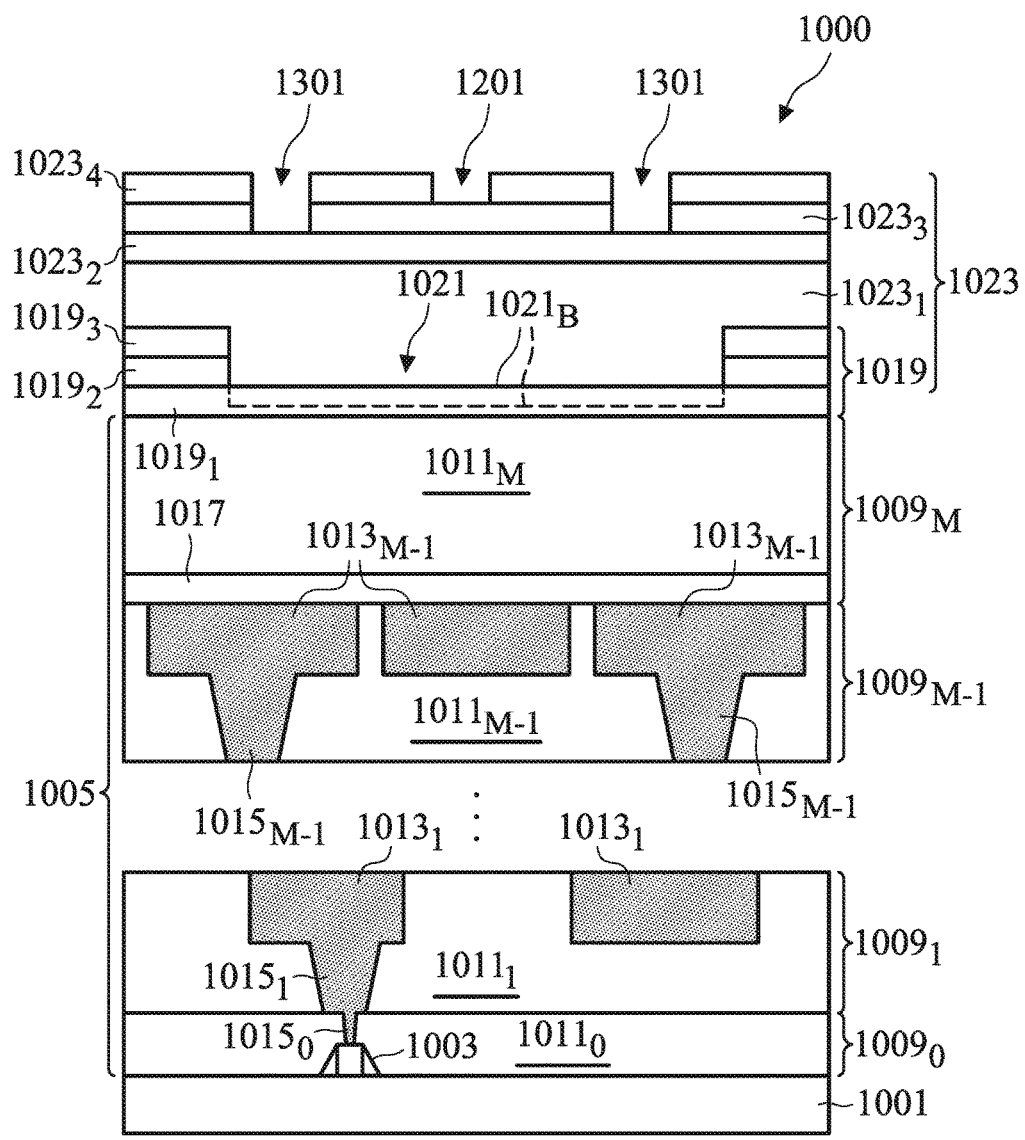
Figure 14C:
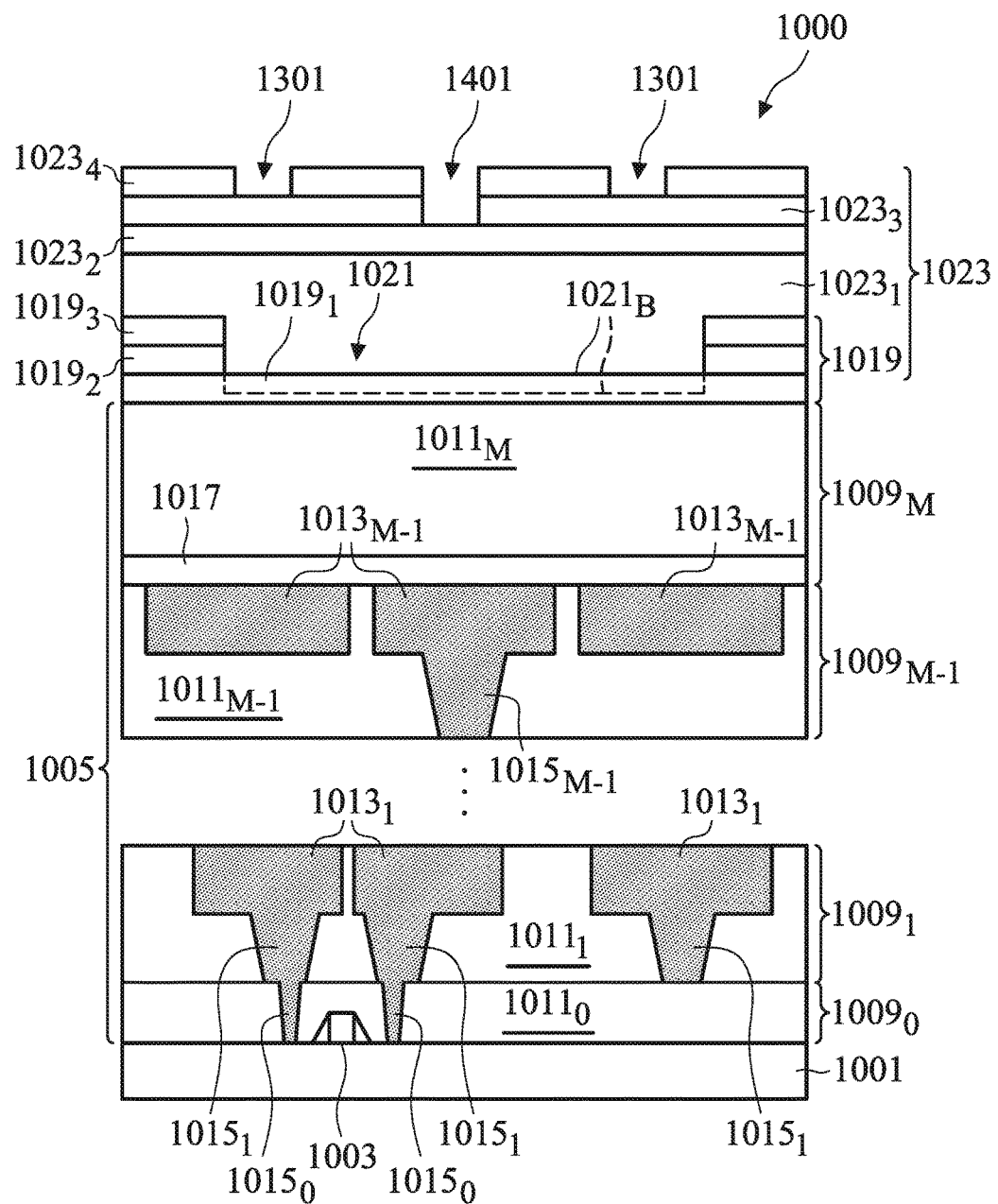

Referring to FIGS. 14A, 14B and 14C, a fourth patterning process is performed on the second mask stack 1023 to transfer the overlap of the opening 1305 with the opening 1201 (see FIGS. 13A, 13B and 13C) to the second mask stack 1023. The fourth patterning process forms an opening 1401 in the second middle layer $1023_3$ of the second mask stack 1023. In some embodiments, the fourth patterning process comprises one or more etching processes, where the fourth tri-layer mask 1303 and the top layer $1023_4$ of the second mask stack 1023 (see FIGS. 13A, 13B and 13C) is used as a combined etch mask. The one or more etching processes may include anisotropic wet etching processes, anisotropic dry etching processes, or combinations thereof. During the fourth patterning process, the top layer $1303_3$, the middle layer $1303_2$, and the bottom layer $1303_1$ of the fourth tri-layer mask 1303 may be consumed. If any residue of the top layer $1303_3$, the middle layer $1303_2$, and the bottom layer $1303_1$ of the fourth tri-layer mask 1303 is left over the second mask stack 1023 after the third patterning process, the residue may also be removed.

Referring further to FIGS. 14A, 14B and 14C, the openings 1301 are aligned with the openings 1101 in the x-direction and top view shapes of the openings 1301 are determined by overlaps of the openings 1205 with the openings 1101 (see FIGS. 12A, 12B and 12C). The opening 1401 is aligned with the opening 1201 in the x-direction and a top view shape of the opening 1401 is determined by an overlap of the opening 1305 with the opening 1201 (see FIGS. 13A, 13B and 13C).

Figure 15A:
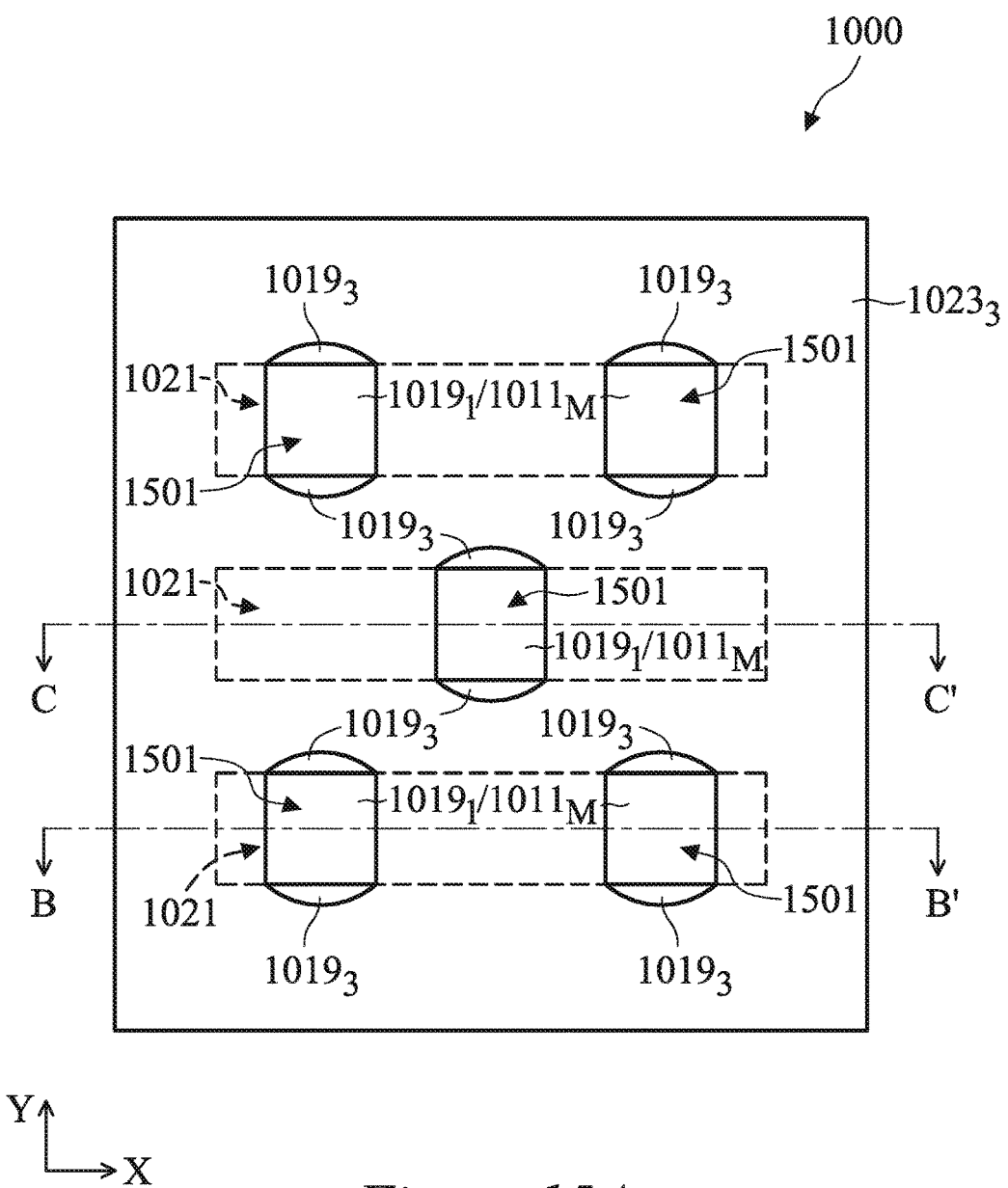
Figure 15B:
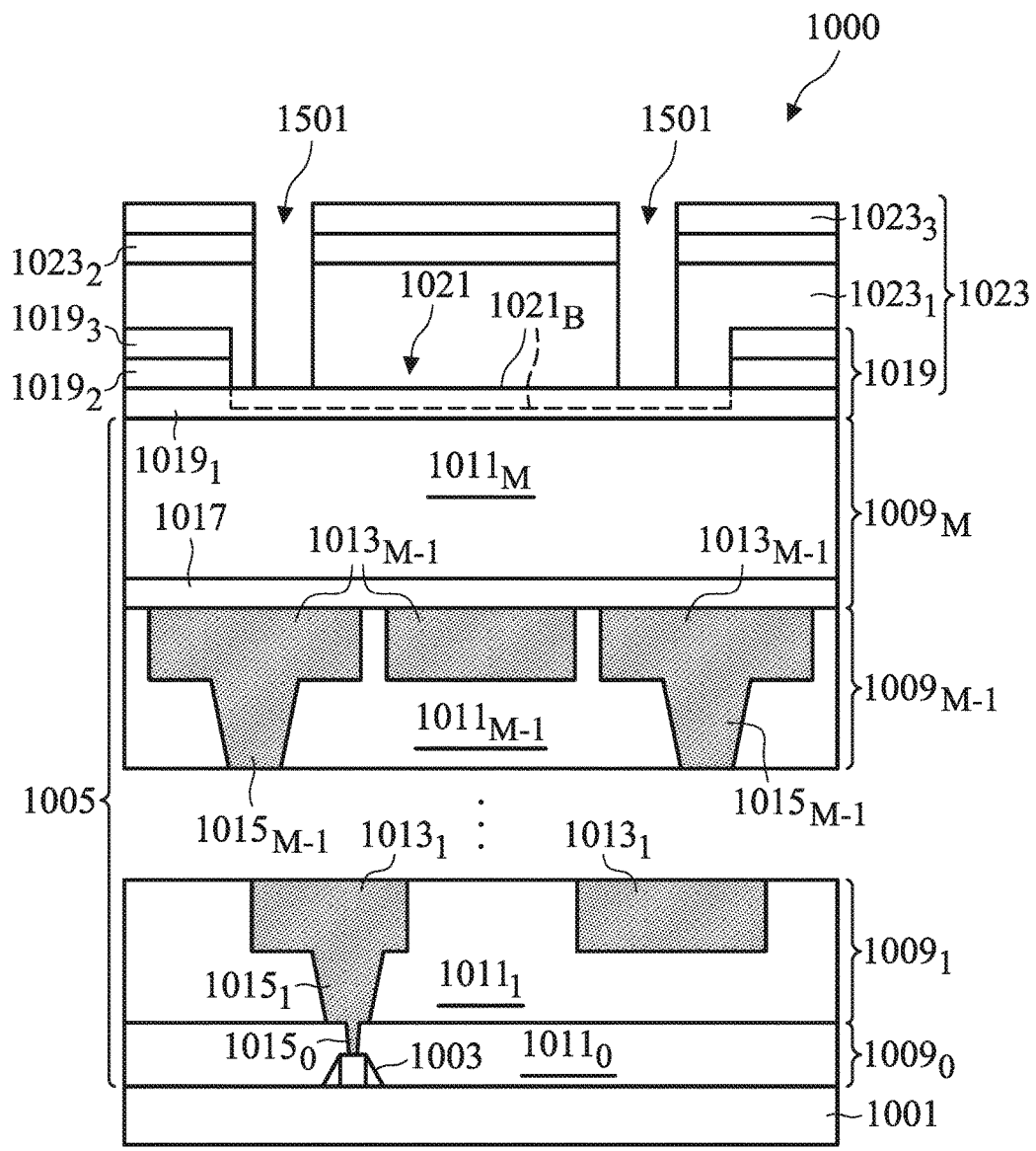
Figure 15C:
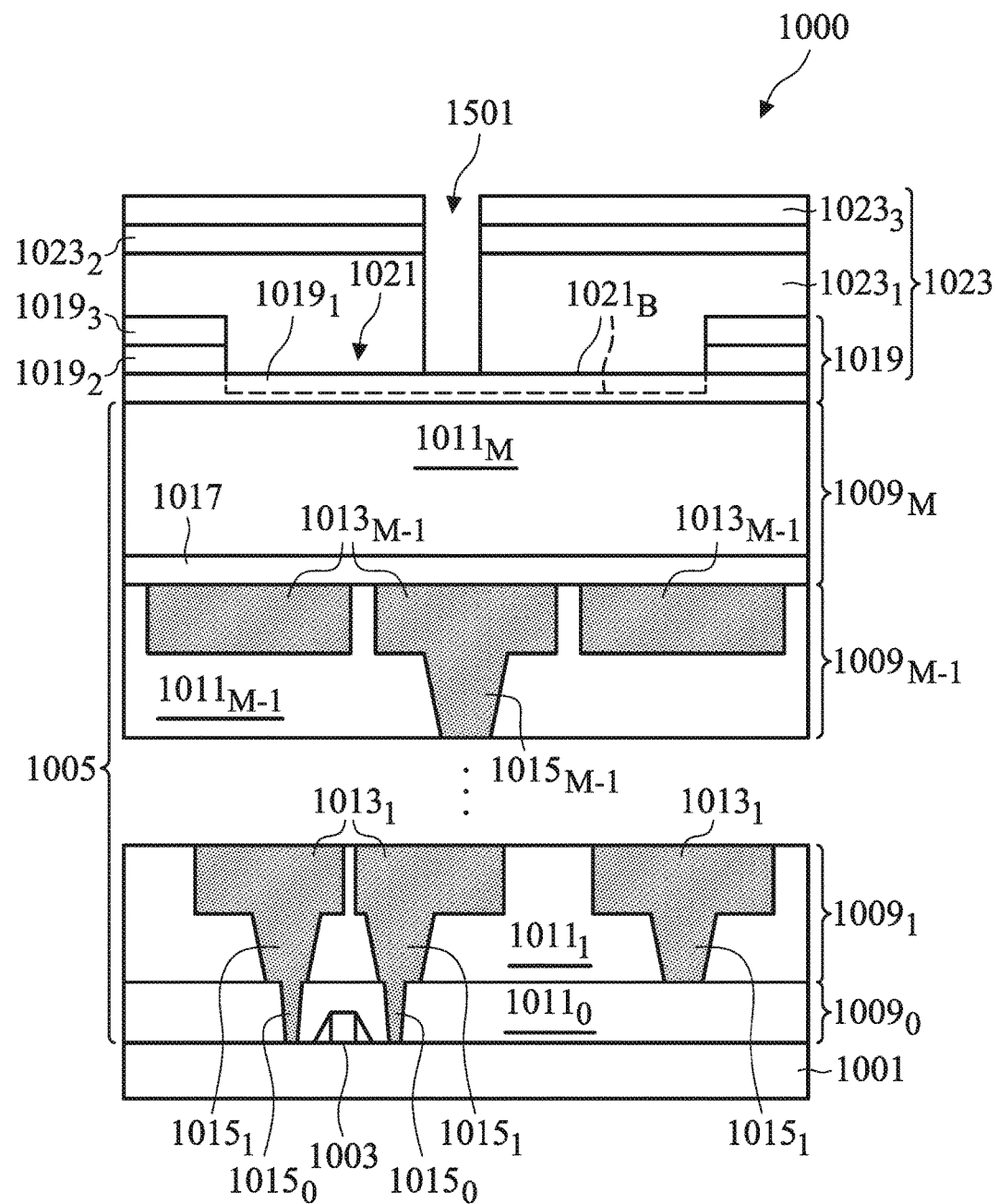

Referring to FIGS. 15A, 15B and 15C, the first middle layer $1023_2$ and the bottom layer $1023_1$ of the second mask stack 1023 are patterned to form openings 1501. In some embodiments, the patterning process may include one or more etching processes, where the top layer $1023_4$ and the second middle layer $1023_3$ of the second mask stack 1023 are used as a combined etching mask. The one or more etching processes may include anisotropic wet etching processes, anisotropic dry etching processes, or combinations thereof. Accordingly, the openings 1301 and 1401 (see FIGS. 14A, 14B and 14C) are transferred to the first middle layer $1023_2$ and the bottom layer $1023_1$ to form the openings 1501. Furthermore, the openings 1501 expose the first mask stack 1019, such that each opening 1501 exposes the bottom 1021B of the corresponding opening 1021 and a portion of the top layer $1019_3$ of the first mask stack 1019. In some embodiments, each opening 1501 exposes a portion of the bottom layer $1019_1$ of the first mask stack 1019. In other embodiments, each opening 1501 exposes a portion of the dielectric layer $1011_M$. In some embodiments, during the patterning process to form the openings 1501, the top layer $1023_4$, the second middle layer $1023_3$, and the first middle layer $1023_2$ of the second mask stack 1023 may be partially or fully consumed. If any residue the top layer $1023_4$, the second middle layer $1023_3$, and the first middle layer $1023_2$ of the second mask stack 1023 is left over the bottom layer $1023_1$ of the second mask stack 1023 after the patterning process, the residue may also be removed as illustrated in FIGS. 16A, 16B and 16C.

Figure 16A:
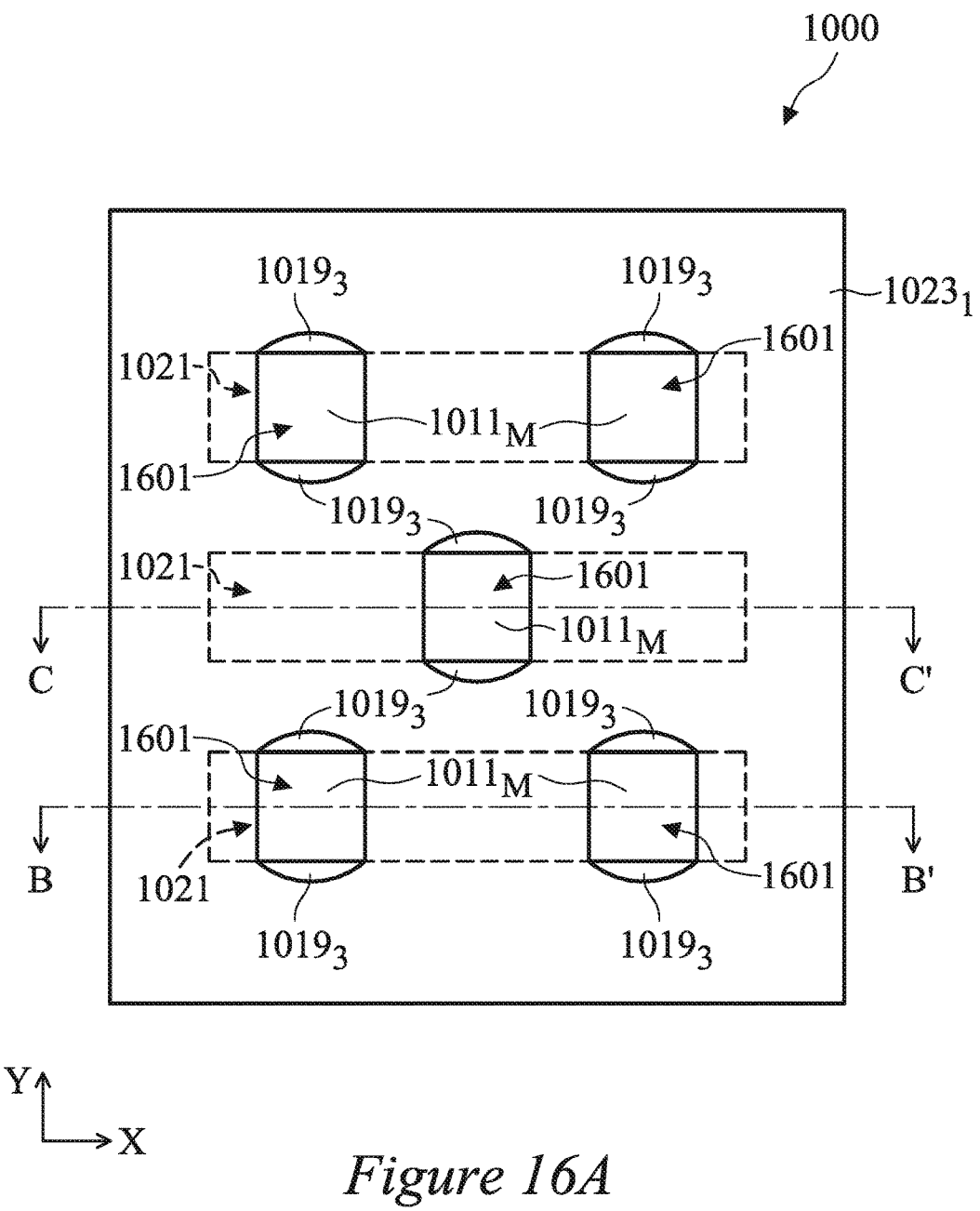
Figure 16B:
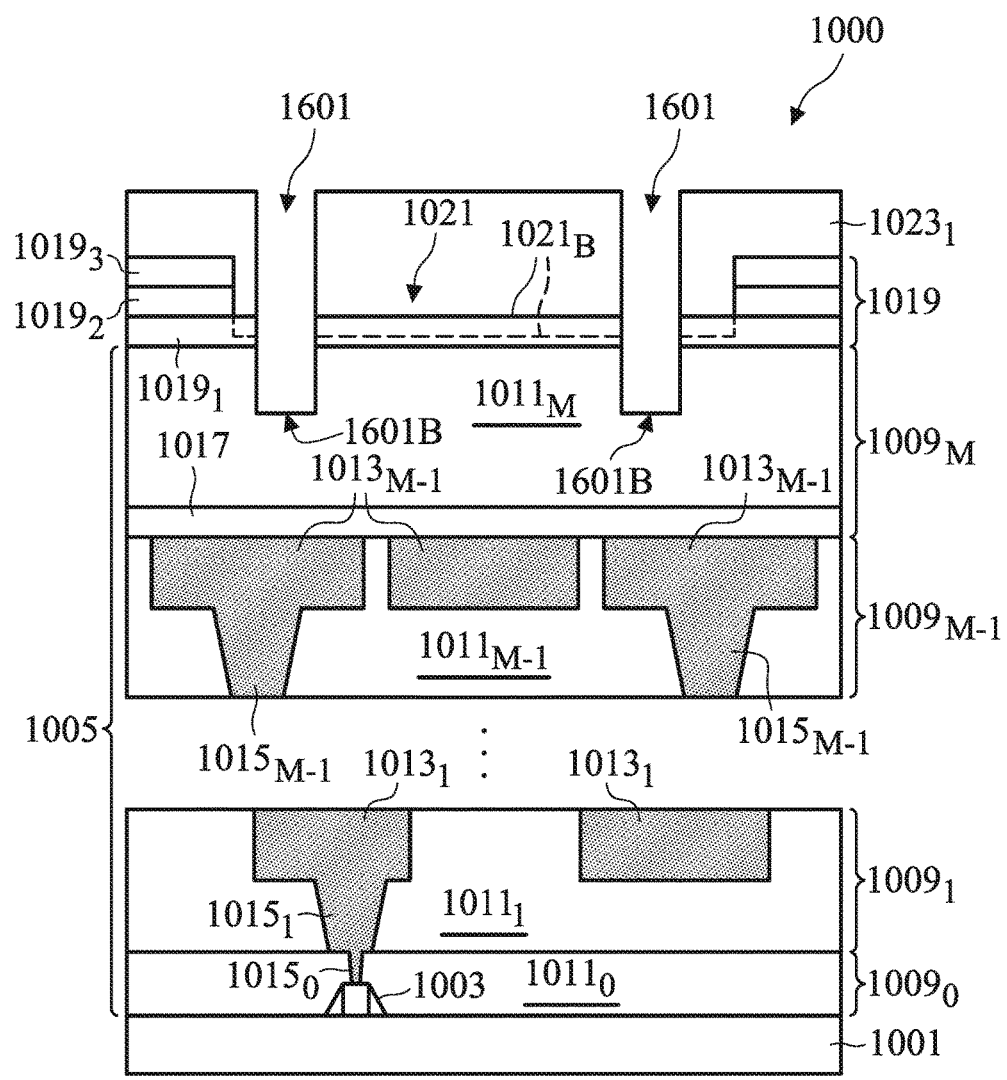
Figure 16C:
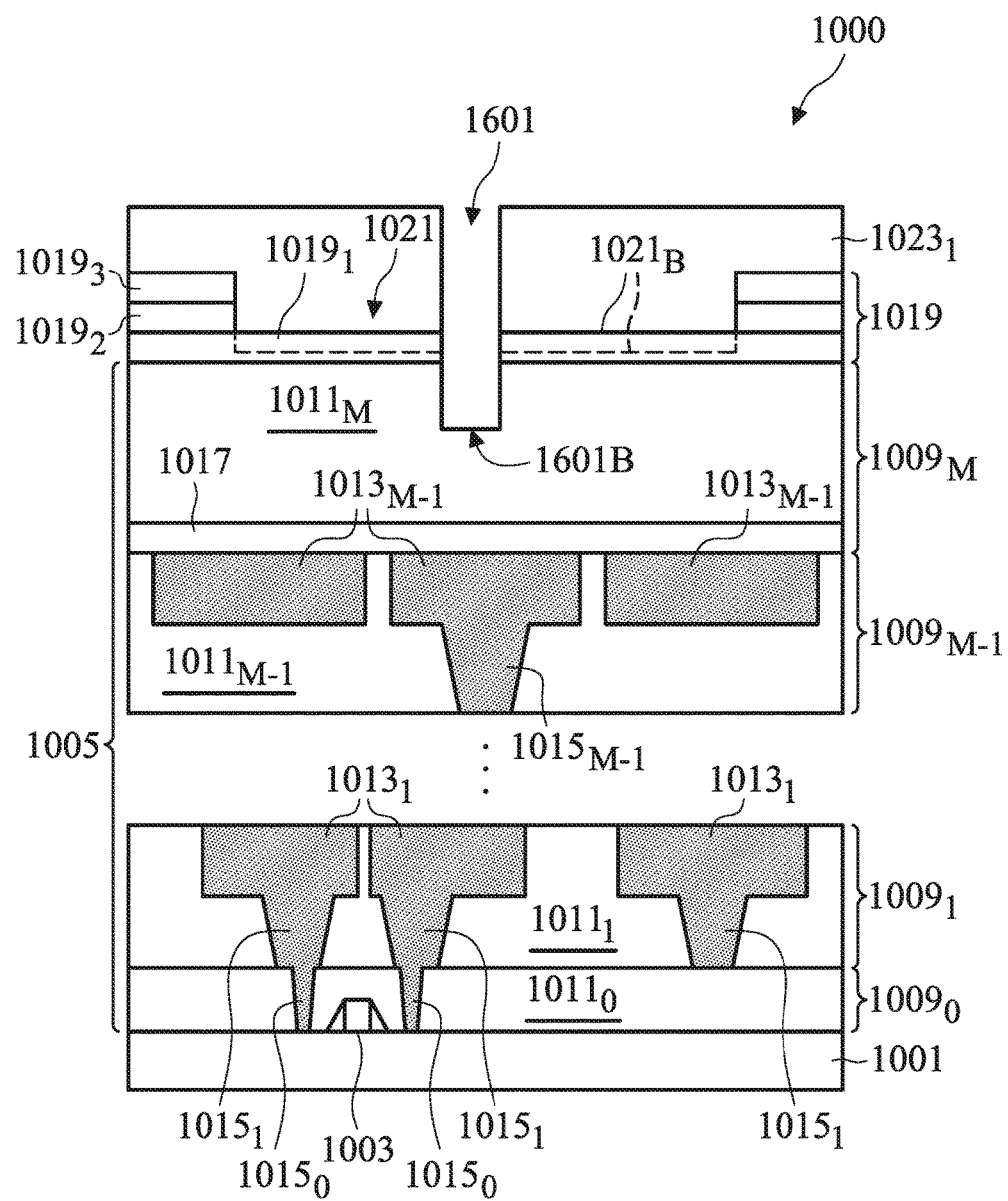

Referring further to FIGS. 16A, 16B and 16C, a first patterning process of the dielectric layer $1011_M$ is performed to form the openings 1601 in the dielectric layer $1011_M$. In some embodiments, the first patterning process may include one or more etching processes, where the bottom layer $1023_1$ of the second mask stack 1023 and the top layer $1019_3$ of the first mask stack 1019 are used as a combined etching mask. The one or more etching processes may include anisotropic wet etching processes, anisotropic dry etching processes, or combinations thereof. Accordingly, the openings 1601 are aligned with the openings 1021 in the y-direction and top view shapes of the openings 1601 are determined by overlaps of the openings 1501 with the corresponding openings 1021 (see FIGS. 15A, 15B and 15C). In some embodiment, the openings 1601 partially extend through the dielectric layer $1011_M$, such that bottoms 1601B of the openings 1601 are within the dielectric layer $1011_M$.

Figure 17A:
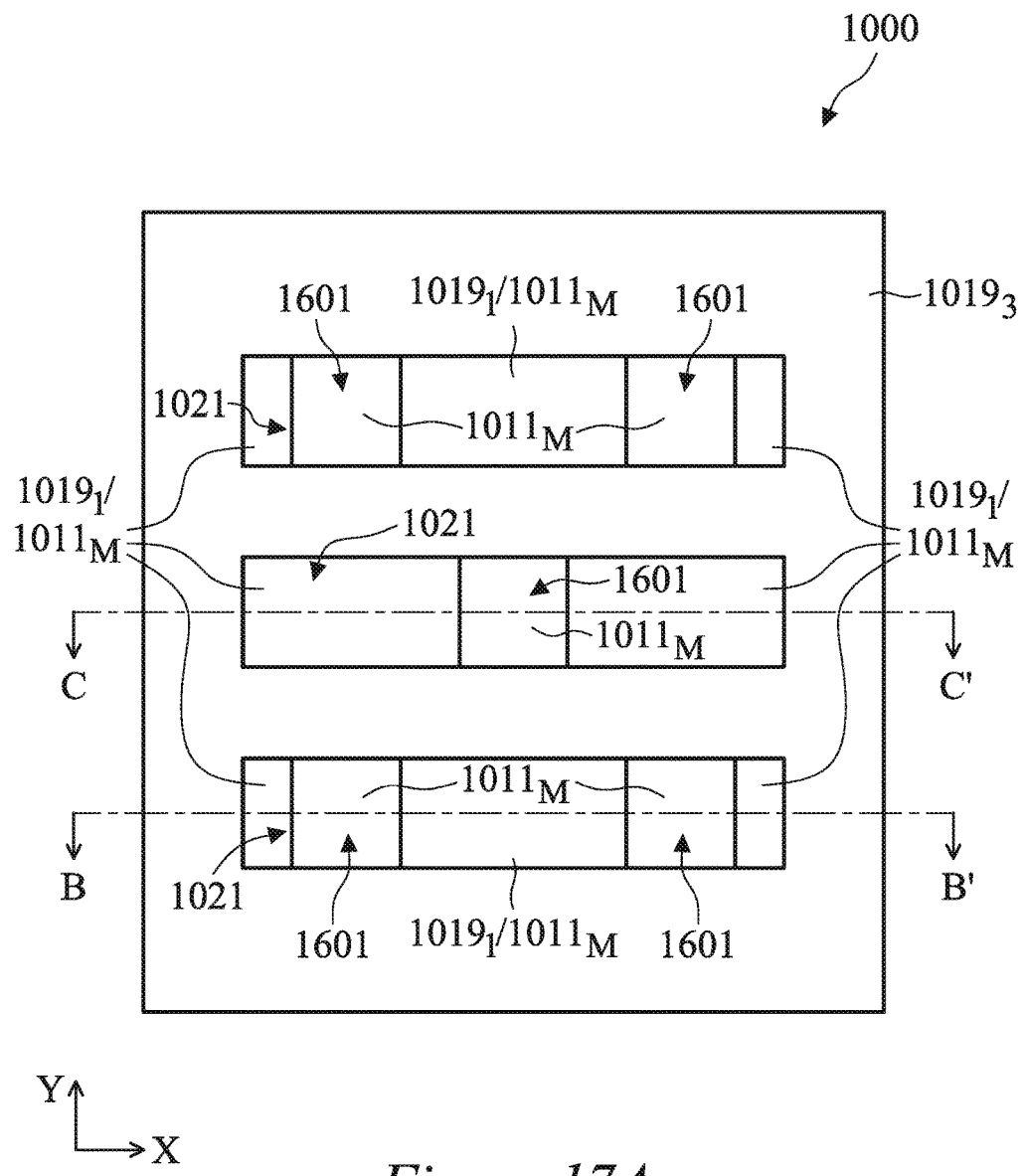
Figure 17B:
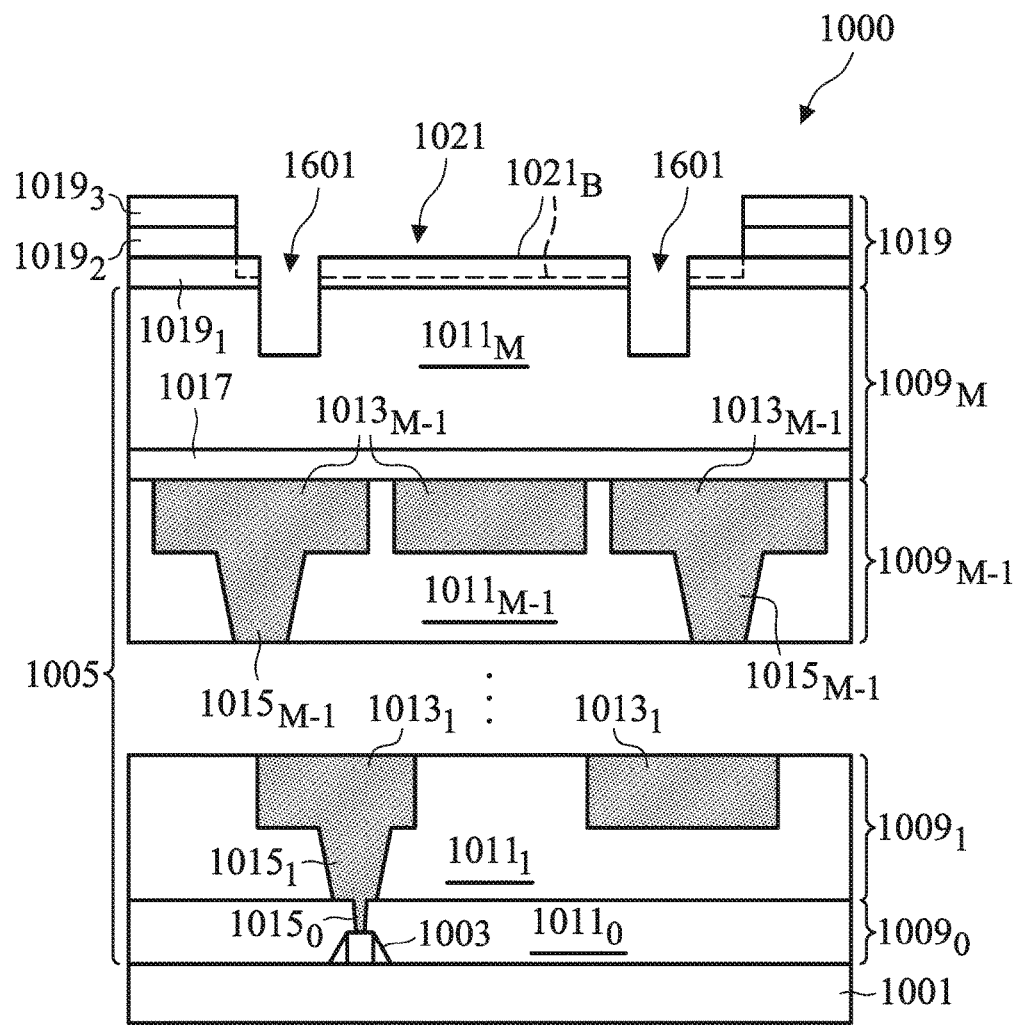
Figure 17C:
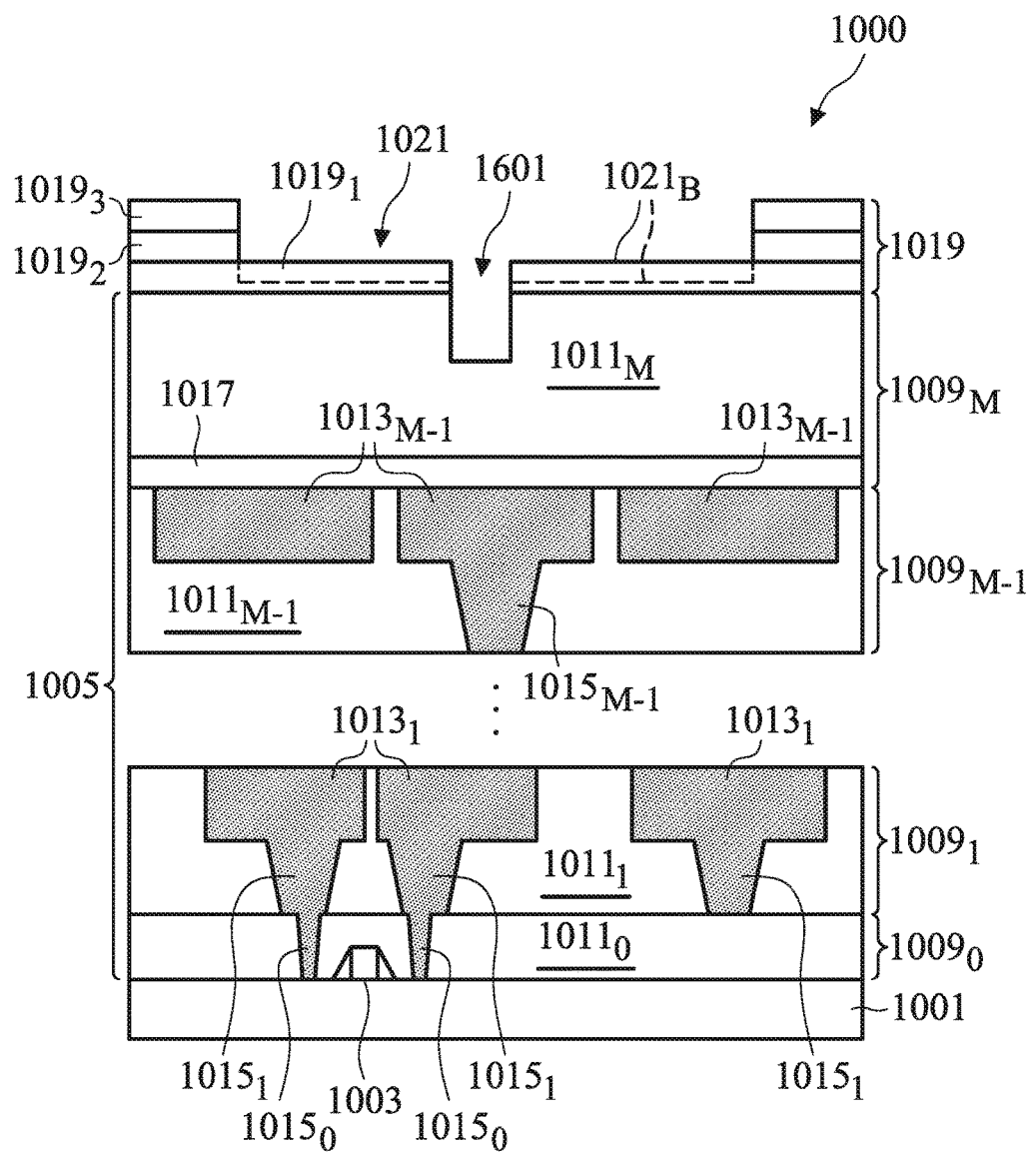

Referring to FIGS. 17A, 17B and 17C, in some embodiments, during the first patterning process to form the openings 1601, the bottom layer $1023_1$ of the second mask stack 1023 may be partially or fully consumed. If any residue of the bottom layer $1023_1$ of the second mask stack 1023 is left over the first mask stack 1019 after the first patterning process, the residue may also be removed to expose the openings 1021.

Figure 18A:
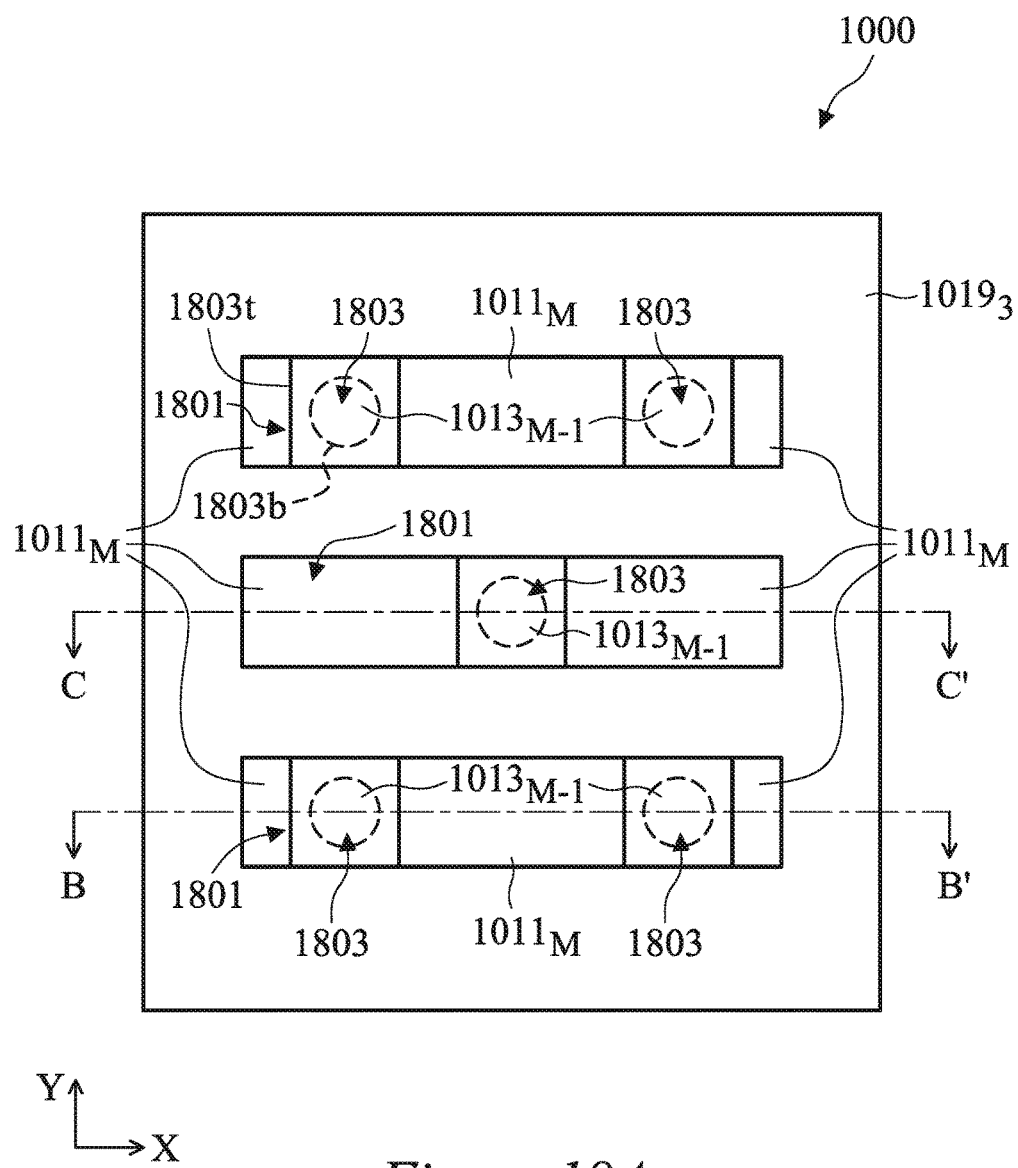
Figure 18B:
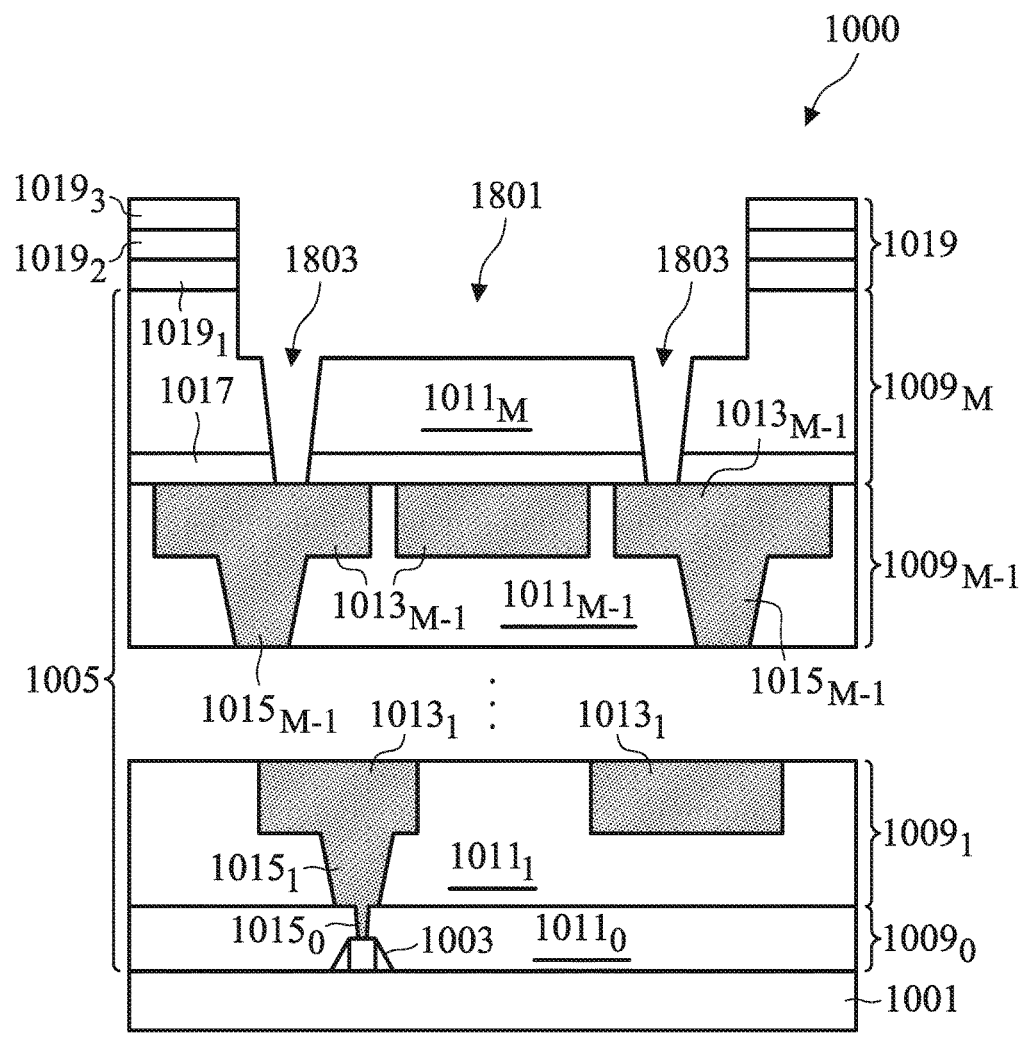
Figure 18C:
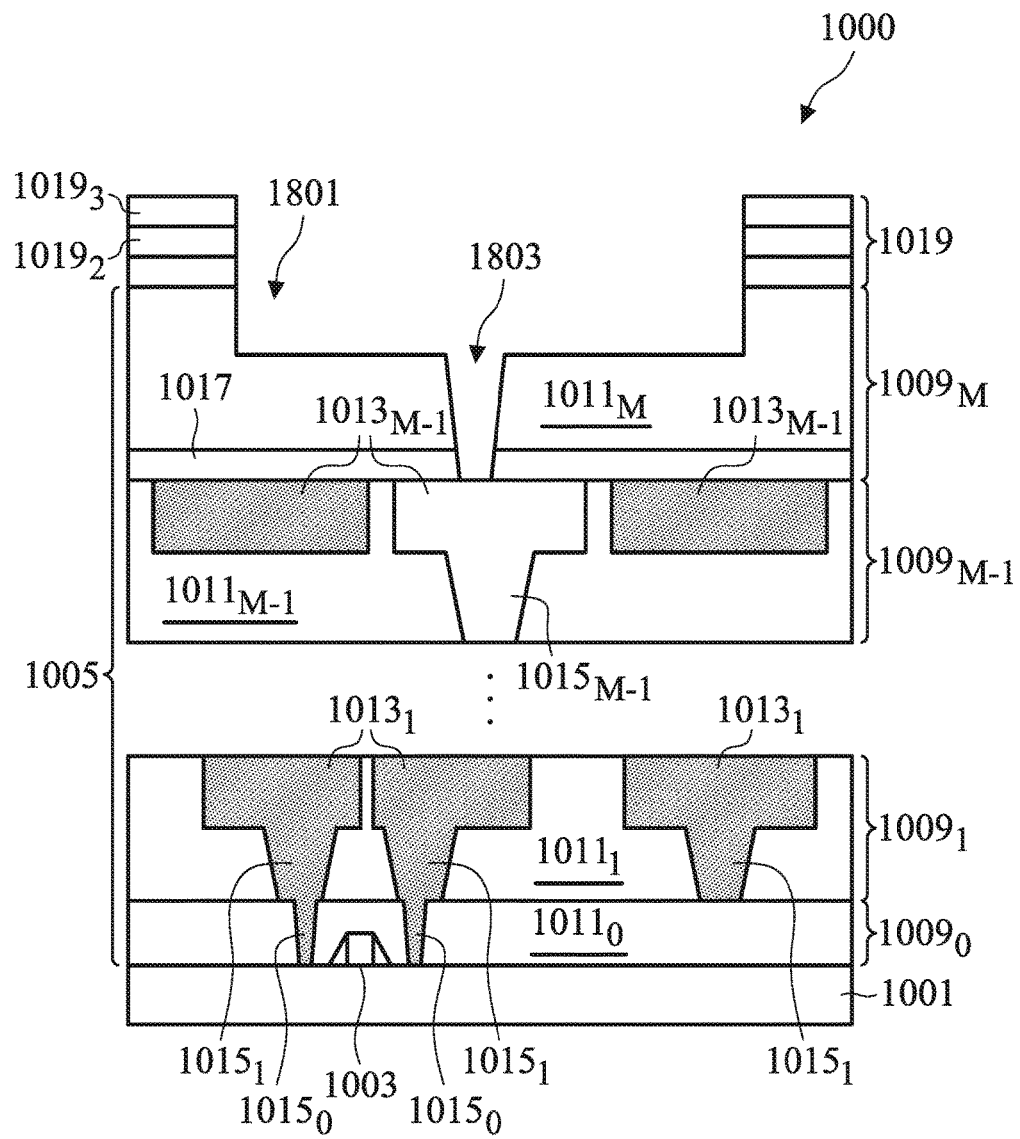

Referring to FIGS. 18A, 18B and 18C, a second patterning process of the dielectric layer $1011_M$ and the ESL 1017 is performed to form the openings 1801 and 1803 in the dielectric layer $1011_M$ and the ESL 1017. In some embodiments, the second patterning process may include one or more etching processes, where the top layer $1019_3$ of the first mask stack 1019 is used as an etching mask. The one or more etching processes may include anisotropic wet etching processes, anisotropic dry etching processes, or combinations thereof. The second patterning process, extends the openings 1021 into the dielectric layer $1011_M$ to form the openings 1801 in the dielectric layer $1011_M$, and extends the openings 1601 further into the dielectric layer $1011_M$ and the ESL 1017 to form the openings 1803. In some embodiments, the openings 1803 expose the conductive lines $1013_{M-1}$ of the metallization layer $1009_{M-1}$. Accordingly, the openings 1803 are aligned with the openings 1801. The openings 1801 and the openings 1803 may be also referred to as line openings 1801 or via openings 1803, respectively. In some embodiments, widths of the via openings 1803 narrow as the via openings 1803 extend toward corresponding conductive lines $1013_{M-1}$. Furthermore, top view shapes of the via openings 1803 also change as the via openings 1803 extend toward corresponding conductive lines $1013_{M-1}$. In the illustrated embodiment, top view shapes of top portions 1803$t$ of the via openings 1803 are squares with sharp corners and top view shapes of bottom portions 1803$b$ of the via openings 1803 are circles. In other embodiments, top view shapes of the top portions 1803$t$ of the via openings 1803 may be rectangles, polygons, or the like, with sharp or rounded corners, and top view shapes of the bottom portions 1803$b$ of the via openings 1803 may be ovals, or squares, rectangles, polygons, or the like, with sharp or rounded corners.

Figure 19A:
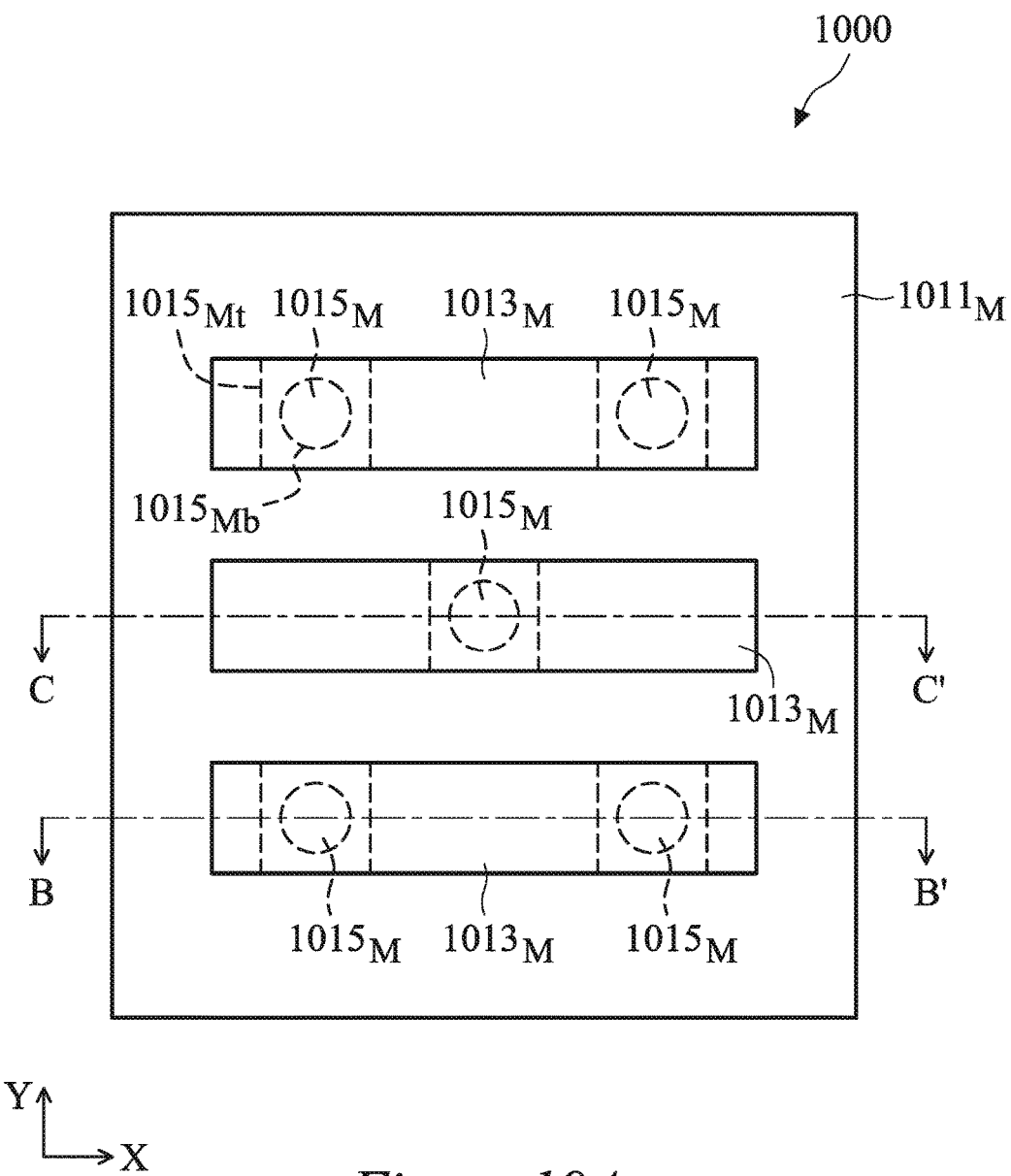
Figure 19B:
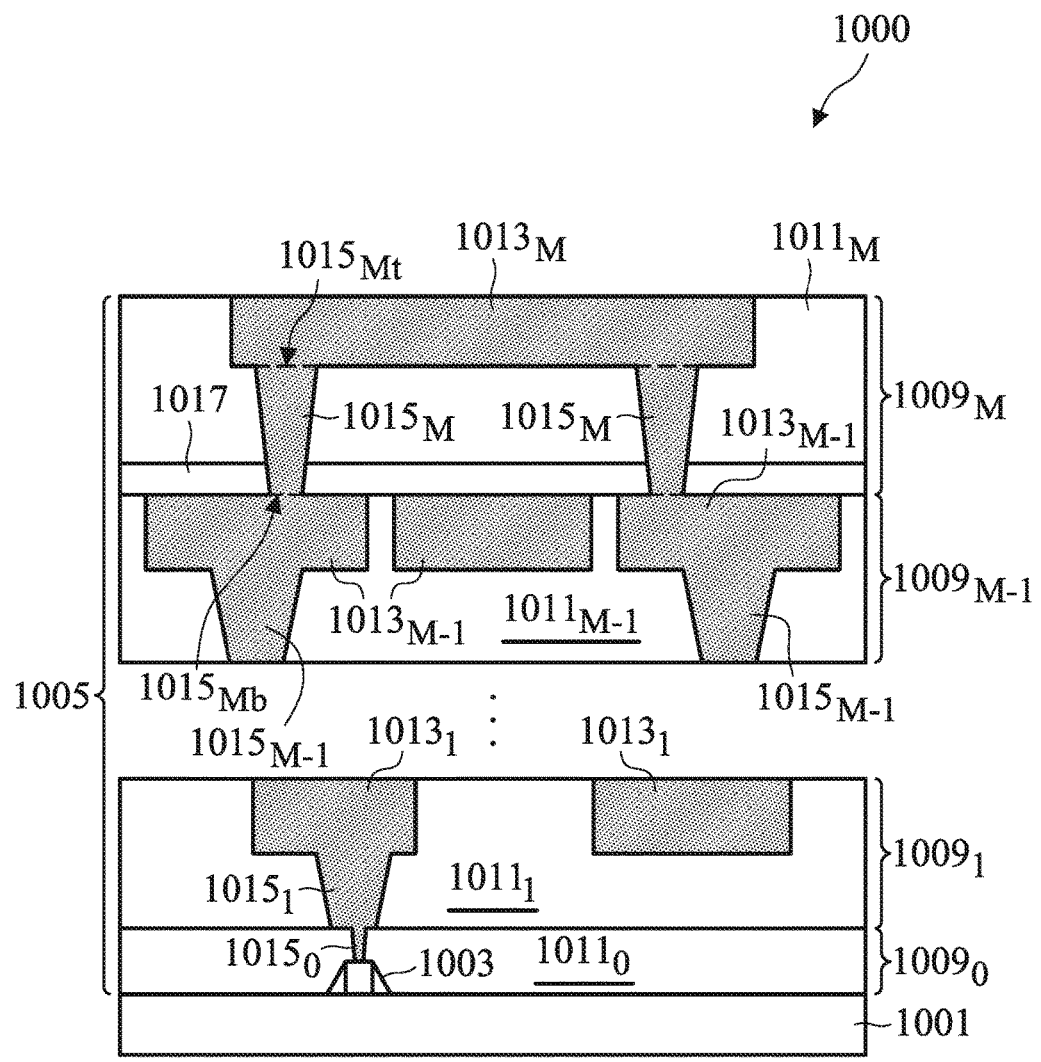
Figure 19C:
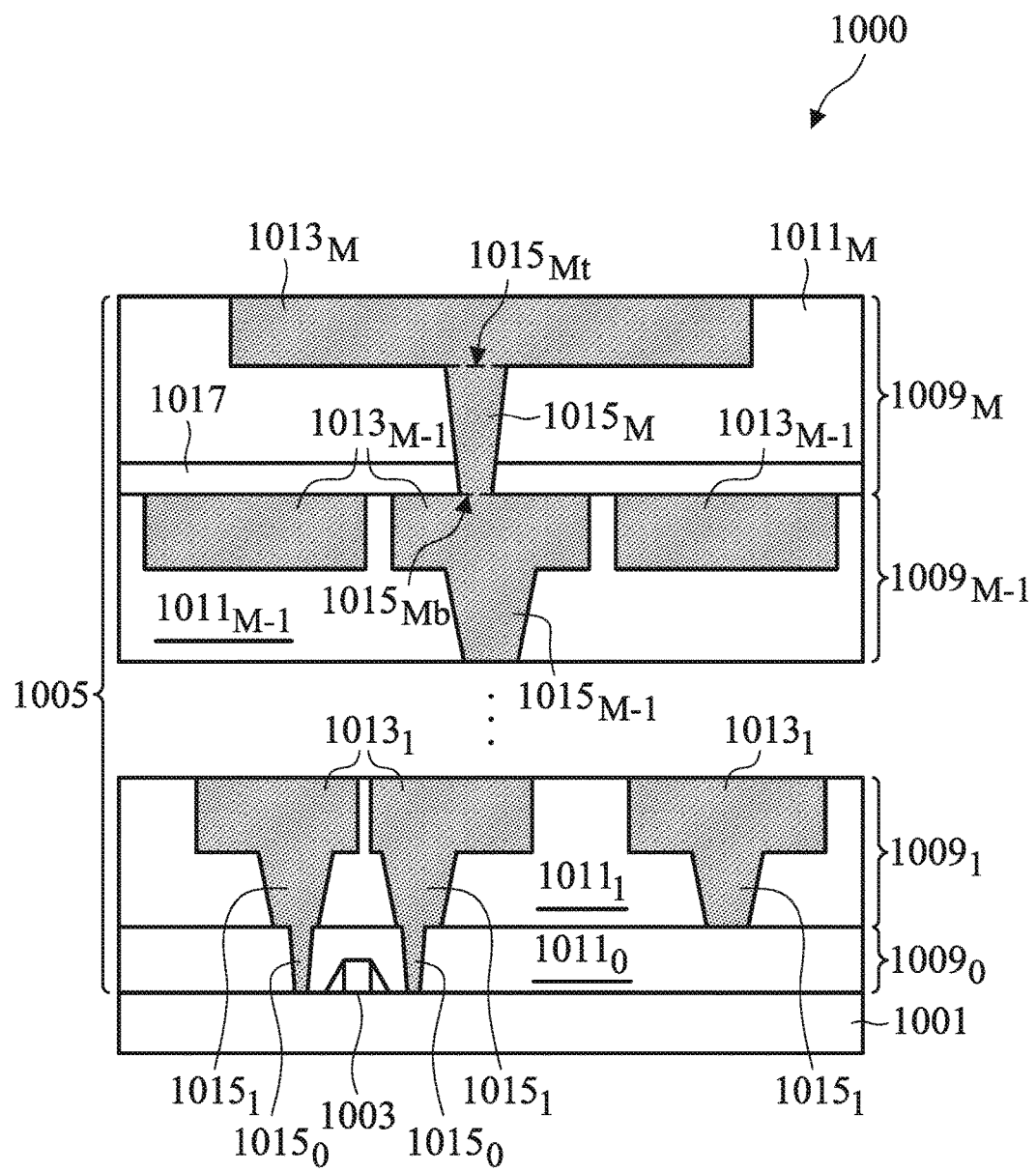

Referring to FIGS. 19A, 19B and 19C, the line openings 1801 and the via openings 1803 (see Figured 18A, 18B and 18C) are filled with suitable conductive materials to form the conductive lines $1013_M$ and conductive vias $1015_M$. The suitable conductive materials may include copper, aluminum, tungsten, combinations thereof, alloys thereof, or the like. The conductive lines $1013_M$ and conductive vias $1015_M$ may further comprise one or more barrier/adhesion layers (not shown) to protect the dielectric layer $1011_M$ from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like. In some embodiments, the steps for forming the conductive lines $1013_M$ and conductive vias $1015_M$ may include depositing one or more barrier/adhesion layers on sidewalls and bottoms of the line openings 1801 and on sidewalls and bottoms of the via openings 1803, depositing a seed layer of a suitable conductive material over the one or more barrier/adhesion layers, and filling the line openings 1801 and the via openings 1803 with a suitable conductive material, for example, by plating, or other suitable methods. Subsequently, excess materials overfilling the line openings 1801 are removed to expose a top surface of the dielectric layer $1011_M$. In some embodiments, the excess materials may be removed using a CMP process, a grinding process, an etching process, the like, or a combination thereof.

Referring further to FIGS. 19A, 19B and 19C, similar to openings 1803, widths of the conductive vias $1015_M$ narrow as the conductive vias $1015_M$ extend toward corresponding conductive lines $1013_{M-1}$. Furthermore, top view shapes of the conductive vias $1015_M$ also change as the conductive vias $1015_M$ extend toward corresponding conductive lines $1013_{M-1}$. In the illustrated embodiment, top view shapes of top surfaces $1015_{Mt}$ of the conductive vias $1015_M$ are squares with sharp corners and top view shapes of bottom surfaces $1015_{Mb}$ of the conductive vias $1015_M$ are circles. In other embodiments, top view shapes of the top surfaces $1015_{Mt}$ of the conductive vias $1015_M$ may be rectangles, polygons, or the like, with sharp or rounded corners, and top view shapes of the bottom surfaces $1015_{Mb}$ of the conductive vias $1015_M$ may be ovals, or squares, rectangles, polygons, or the like, with sharp or rounded corners.

In some embodiments, the metallization layer $1009_M$ may be the last metallization layer of the interconnect structure 1005 and formation of the metallization layer $1009_M$ completes formation of the interconnect structure 1005. In other embodiments, the metallization layer $1009_M$ may be an intermediate metallization layer of the interconnect structure 1005. In such embodiments, additional metallization layers are formed over the metallization layer $1009_M$ until the formation of the interconnect structure 1005 is completed. In some embodiments, further processing steps may be performed on the semiconductor structure 1000 after the formation of the interconnect structure 1005 is completed. The further processing steps may include formation of contact pads and one or more passivation layers over the interconnect structure 1005, formation of under-bump metallizations (UBMs) over the contact pads, and formation of connectors over the UBMs. Subsequently, the semiconductor structure 1000 may be singulated into separate dies, which may further undergo various packaging processes.

Figure 20:
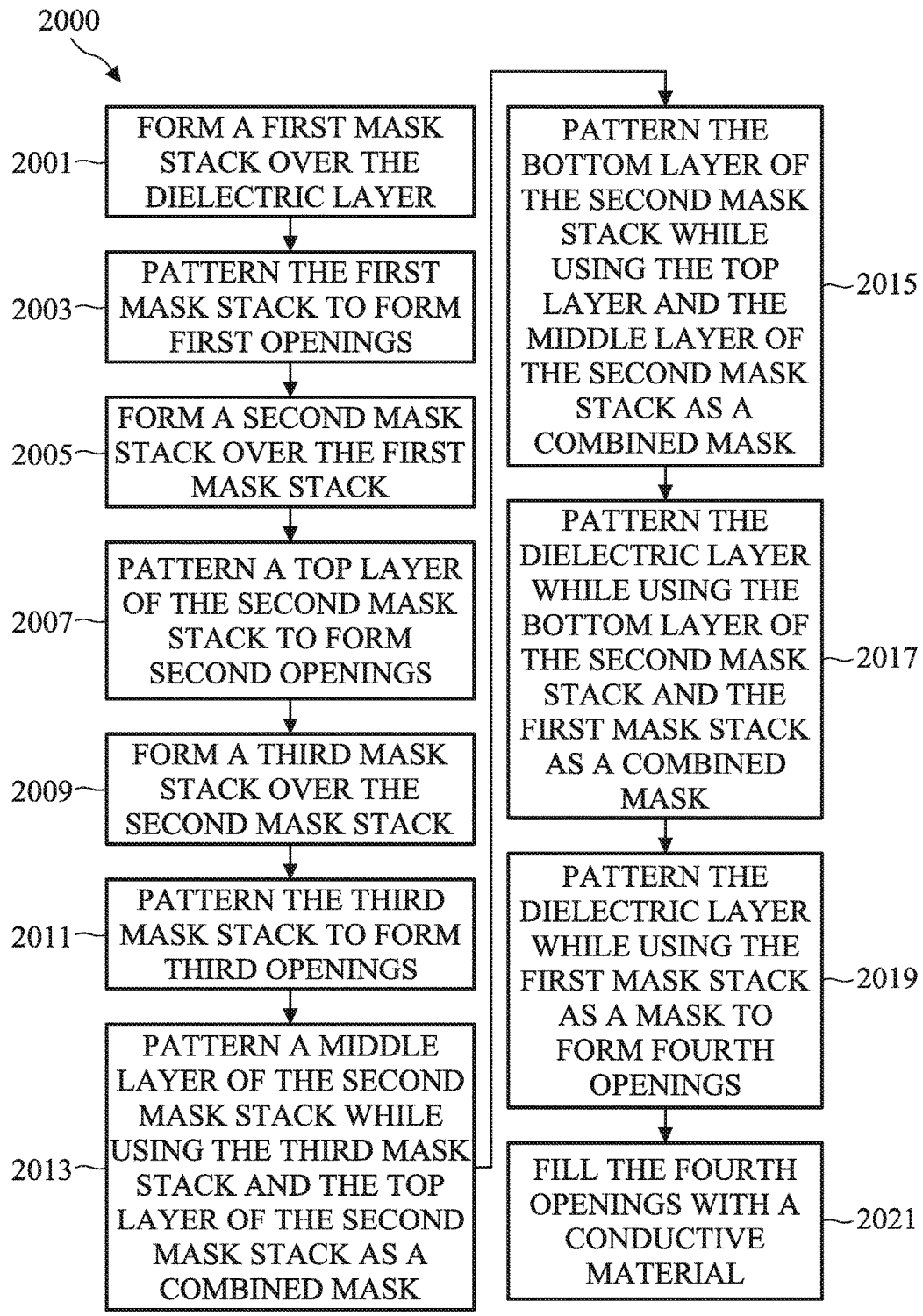
FIG. 20 is a flow diagram illustrating a method of forming a semiconductor structure in accordance with some embodiments.

FIG. 20 is a flow diagram illustrating a method 2000 of forming a semiconductor structure in accordance with some embodiments. The method 2000 starts with step 2001, where a first mask stack (such as the first mask stack 1019 illustrated in FIGS. 10A, 10B and 10C) is formed over a dielectric layer (such as the dielectric layer $1011_M$ illustrated in FIGS. 10A, 10B and 10C) as described above with references to FIGS. 10A, 10B and 10C. In step 2003, the first mask stack is patterned to form first openings (such as the openings 1021 illustrated in FIGS. 10A, 10B and 10C) as described above with references to FIGS. 10A, 10B and 10C. In step 2005, a second mask stack (such as the second mask stack 1023 illustrated in FIGS. 10A, 10B and 10C) is formed over the first mask stack as described above with references to FIGS. 10A, 10B and 10C. In step 2007, a top layer (such as the top layer $1023_4$ illustrated in FIGS. 12A, 12B and 12C) of the second mask stack is patterned to form second openings (such as the openings 1101 and 1201 illustrated in FIGS. 12A, 12B and 12C) as described above with reference to FIGS. 10A-12C. In step 2009, a third mask stack (such as the third tri-layer mask 1203 illustrated in FIGS. 12A, 12B and 12C) is formed over the second mask stack as described above with reference to FIGS. 12A, 12B and 12C. In step 2011, the third mask stack is patterned to form third openings (such as the openings 1205 illustrated in FIGS. 12A, 12B and 12C) as described above with reference to FIGS. 12A, 12B and 12C. In step 2013, a middle layer (such as the second middle layer $1023_3$ illustrated in FIGS. 13A, 13B and 13C) of the second mask stack is patterned while using the third mask stack and the top layer of the second mask stack as a combined mask as described above with reference to FIGS. 12A-13C. In some embodiments, a patterning step described above with respect to steps 2009, 2011 and 2013 may be repeated one or more times. For example, such an additional patterning step is described above with reference to FIGS. 13A-14C. In step 2015, the bottom layer (such as the bottom layer $1023_1$ illustrated in FIGS. 15A, 15B and 15C) of the second mask stack is patterned while using the top layer and the middle layer of the second mask stack as a combined mask as described above with reference to FIGS. 15A, 15B and 15C. In step 2017, the dielectric layer (such as the dielectric layer $1011_M$ illustrated in FIGS. 16A, 16B and 16C) is patterned while using the bottom layer of the second mask stack and the first mask stack as a combined mask as described above with reference to FIGS. 16A, 16B and 16C. In step 2019, the dielectric layer is further patterned to form fourth openings (such as the openings 1801 and 1803 illustrated in FIGS. 18A, 18B and 18C) while using the second mask stack as a mask as described above with reference to FIGS. 18A, 18B and 18C. In step 2021, the fourth openings are filled with a conductive material as described above with reference to FIGS. 19A, 19B and 19C.

Various embodiments discussed herein allow for forming self-aligned interconnects, such that conductive vias are aligned with corresponding conductive lie. Furthermore, various embodiments discussed herein allow for forming interconnects having a reduced size and pitch, and allow for reducing or avoiding effects caused by overlay shift during lithography. In some embodiments, via-induced-metal-bridge (VIMB), via-to-line and via-to-via leakage defects may be avoided. Furthermore, a time dependent dielectric breakdown (TDDB) window may be improved, Rc uniformity of interconnects may be improved and Rc yield window may be enhanced.

According to an embodiment, a method includes forming a dielectric layer over a conductive feature. A first mask is formed over the dielectric layer. The first mask is patterned to form a first opening in the first mask. A second mask is formed over the first mask. A third mask is formed over the second mask. The third mask is patterned to form a second opening in the third mask. A fourth mask is formed over the third mask. The fourth mask is patterned to form a third opening in the fourth mask, a portion of the third opening overlapping with the second opening as viewed from top. The portion of the third opening is transferred to the second mask, thereby forming a fourth opening in the second mask, a portion of the fourth opening overlapping with the first opening as viewed from top. The portion of the fourth opening is transferred to the dielectric layer, thereby forming a fifth opening in the dielectric layer, a bottom of the fifth opening being within the dielectric layer. The fifth opening is extended into the dielectric layer, thereby forming an extended fifth opening, the extended fifth opening exposing at least a portion of the conductive feature. The extended fifth opening is filled with a conductive material.

According to another embodiment, a method includes forming a dielectric layer over a metallization layer. A first mask is formed over the dielectric layer. The first mask is etched to form a first opening in the first mask. A second mask is formed over the first mask. A third mask is formed over the second mask. The third mask is etched to form a second opening in the third mask, the first opening overlapping with the second opening as viewed from top. A fourth mask is formed over the third mask, the fourth mask having a third opening therein, a portion of the third opening overlapping with the second opening as viewed from top. The second mask is etched to transfer the portion of the third opening to the second mask, thereby forming a fourth opening in the second mask, a portion of the fourth opening overlapping with the first opening as viewed from top. The dielectric layer is etched to form a fifth opening in the dielectric layer while using the first mask and the second mask as a combined etching mask, a bottom of the fifth opening being above a bottommost surface of the dielectric layer. The dielectric layer is etched to form a sixth opening in the dielectric layer and to extend the fifth opening and form an extended fifth opening in the dielectric layer, while using the first mask as an etching mask, the extended fifth opening exposing a conductive feature of the metallization layer. The extended fifth opening and the sixth opening are filled with a conductive material.

According to yet another embodiment, a method includes forming a dielectric layer over a conductive feature. A first mask stack is formed over the dielectric layer. The first mask stack is patterned to form a first opening in the first mask stack. A second mask stack is formed over the first mask stack. The second mask stack is patterned to form a second opening in a top layer of the second mask stack, the first opening overlapping with the second opening as viewed from top. A third mask stack is formed over the second mask stack. The third mask stack is patterned to form a third opening in a top layer of the third mask stack, the third opening overlapping with the first opening and the second opening as viewed from top. A portion of the third opening overlapping with the second opening is transferred to a bottom layer of the second mask stack, thereby forming a fourth opening in the bottom layer of the second mask stack. A portion of the fourth opening overlapping with the first opening is transferred to the dielectric layer, thereby forming a fifth opening in the dielectric layer, the fifth opening extending partially into the dielectric layer. The fifth opening is extended into the dielectric layer, thereby forming an extended fifth opening, the extended fifth opening exposing the conductive feature. A conductive material is deposited into the extended fifth opening.

According to yet another embodiment, a method includes forming a dielectric layer over a conductive feature. A first mask is formed over the dielectric layer. The first mask is patterned to form a first opening in the first mask. A second mask is formed over the first mask. A third mask is formed over the second mask. A fourth mask is formed over the third mask. The fourth mask is patterned to form a second opening in the fourth mask, the second opening overlapping with the first opening in a plan view. A fifth mask is formed over the fourth mask. The fifth mask is patterned to form a third opening in the fifth mask, a portion of the third opening overlapping with the second opening in the plan view. The portion of the third opening is transferred to the third mask, thereby forming a fourth opening in the third mask. The fourth opening is transferred to the second mask, thereby forming a fifth opening in the second mask. A portion of the fifth opening overlaps with the first opening in the plan view. The portion of the fifth opening is transferred to the dielectric layer, thereby forming a sixth opening in the dielectric layer. A bottom of the sixth opening is within the dielectric layer. The sixth opening is extended into the dielectric layer, thereby forming an extended sixth opening. The extended sixth opening exposes at least a portion of the conductive feature. The extended sixth opening is filled with a conductive material.

According to yet another embodiment, a method includes forming a dielectric layer over a metallization layer. A first mask is formed over the dielectric layer. The first mask is etched to form a first opening in the first mask. A second mask is formed over the first mask. A third mask is formed over the second mask. A fourth mask is formed over the third mask. The fourth mask is etched to form a second opening in the fourth mask. The second opening overlaps with the first opening in a plan view. A fifth mask is formed over the fourth mask, the fifth mask having a third opening therein. The third opening overlaps with the first opening and the second opening in the plan view. The third mask is etched to form a fourth opening in the third mask while using the fourth mask and the fifth mask as a combined etching mask. The second mask is etched to form a fifth opening in the second mask. The fifth opening overlaps with the first opening in the plan view. The dielectric layer is etched to form a sixth opening in the dielectric layer while using the first mask and the second mask as a combined etching mask. A bottom of the sixth opening is above a bottommost surface of the dielectric layer. The dielectric layer is etched to reshape the sixth opening while using the first mask as an etching mask, thereby forming a reshaped sixth opening in the dielectric layer. The reshaped sixth opening exposes a conductive feature of the metallization layer. The reshaped sixth opening is filled with a conductive material.

According to yet another embodiment, a method includes forming a dielectric layer over a conductive feature. A first mask stack is formed over the dielectric layer. The first mask stack is patterned to form a first opening in the first mask stack. A second mask stack is formed over the first mask stack. A top layer of the second mask stack is patterned to form a second opening in the top layer of the second mask stack. The second opening overlaps with the first opening in a plan view. A third mask stack is formed over the second mask stack. A top layer of the third mask stack is patterned to form a third opening in the top layer of the third mask stack. The third opening overlaps with the first opening and the second opening in the plan view. A portion of the third opening overlapping with the second opening is transferred to a middle layer of the second mask stack, thereby forming a fourth opening in the middle layer of the second mask stack. The fourth opening is transferred to a bottom layer of the second mask stack, thereby forming a fifth opening in the bottom layer of the second mask stack. A portion of the fifth opening overlapping with the first opening is transferred to the dielectric layer, thereby forming a sixth opening in the dielectric layer. The sixth opening extends partially into the dielectric layer. The sixth opening is extended into the dielectric layer, thereby forming an extended sixth opening in the dielectric layer. The extended sixth opening exposes the conductive feature. A conductive material is deposited into the extended sixth opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a dielectric layer over a conductive feature;
forming a first mask over the dielectric layer;
patterning the first mask to form a first opening in the first mask;
forming a second mask over the first mask;
forming a third mask over the second mask;
forming a fourth mask over the third mask;
patterning the fourth mask to form a second opening in the fourth mask, the second opening overlapping with the first opening in a plan view;
forming a fifth mask over the fourth mask;
patterning the fifth mask to form a third opening in the fifth mask, a portion of the third opening overlapping with the second opening in the plan view;
transferring the portion of the third opening to the third mask, thereby forming a fourth opening in the third mask;
transferring the fourth opening to the second mask, thereby forming a fifth opening in the second mask, a portion of the fifth opening overlapping with the first opening in the plan view;
transferring the portion of the fifth opening to the dielectric layer, thereby forming a sixth opening in the dielectric layer, a bottom of the sixth opening being within the dielectric layer;
extending the sixth opening into the dielectric layer, thereby forming an extended sixth opening, the extended sixth opening exposing at least a portion of the conductive feature; and
filling the extended sixth opening with a conductive material.

2. The method of claim 1, wherein forming the first mask over the dielectric layer comprises:
forming a first sublayer of the first mask over the dielectric layer;
forming a second sublayer of the first mask over the first sublayer of the first mask; and
forming a third sublayer of the first mask over the second sublayer of the first mask.

3. The method of claim 2, wherein patterning the first mask to form the first opening in the first mask comprises patterning the second sublayer and the third sublayer of the first mask.

4. The method of claim 3, wherein patterning the first mask to form the first opening in the first mask further comprises patterning the first sublayer of the first mask.

5. The method of claim 1, further comprising, before forming the third mask over the second mask, forming a sixth mask over the second mask.

6. The method of claim 5, wherein transferring the fourth opening to the second mask comprises patterning the sixth mask.

7. The method of claim 1, wherein the first opening exposes a portion of the dielectric layer.

8. A method comprising:
forming a dielectric layer over a metallization layer;
forming a first mask over the dielectric layer;
etching the first mask to form a first opening in the first mask;
forming a second mask over the first mask;
forming a third mask over the second mask;
forming a fourth mask over the third mask;
etching the fourth mask to form a second opening in the fourth mask, the second opening overlapping with the first opening in a plan view;
forming a fifth mask over the fourth mask, the fifth mask having a third opening therein, the third opening overlapping with the first opening and the second opening in the plan view;
etching the third mask to form a fourth opening in the third mask while using the fourth mask and the fifth mask as a combined etching mask;
etching the second mask to form a fifth opening in the second mask, the fifth opening overlapping with the first opening in the plan view;
etching the dielectric layer to form a sixth opening in the dielectric layer while using the first mask and the second mask as a combined etching mask, a bottom of the sixth opening being above a bottommost surface of the dielectric layer;
etching the dielectric layer to reshape the sixth opening while using the first mask as an etching mask, thereby forming a reshaped sixth opening in the dielectric layer, the reshaped sixth opening exposing a conductive feature of the metallization layer; and
filling the reshaped sixth opening with a conductive material.

9. The method of claim 8, wherein the first opening has a rectangular shape in the plan view.

10. The method of claim 8, wherein the second opening has a rectangular shape in the plan view.

11. The method of claim 8, wherein the third opening has a circular shape in the plan view.

12. The method of claim 8, wherein forming the first mask over the dielectric layer comprises:
forming a first sublayer of the first mask over the dielectric layer;
forming a second sublayer of the first mask over the first sublayer of the first mask; and
forming a third sublayer of the first mask over the second sublayer of the first mask.

13. The method of claim 12, wherein etching the first mask to form the first opening in the first mask comprises etching the second sublayer and the third sublayer of the first mask.

14. The method of claim 13, wherein etching the first mask to form the first opening in the first mask further comprises etching the first sublayer of the first mask.

15. A method comprising:
forming a dielectric layer over a conductive feature;
forming a first mask stack over the dielectric layer;
patterning the first mask stack to form a first opening in the first mask stack;
forming a second mask stack over the first mask stack;
patterning a top layer of the second mask stack to form a second opening in the top layer of the second mask stack, the second opening overlapping with the first opening in a plan view;
forming a third mask stack over the second mask stack;
patterning a top layer of the third mask stack to form a third opening in the top layer of the third mask stack, the third opening overlapping with the first opening and the second opening in the plan view;
transferring a portion of the third opening overlapping with the second opening to a middle layer of the second mask stack, thereby forming a fourth opening in the middle layer of the second mask stack;
transferring the fourth opening to a bottom layer of the second mask stack, thereby forming a fifth opening in the bottom layer of the second mask stack;
transferring a portion of the fifth opening overlapping with the first opening to the dielectric layer, thereby forming a sixth opening in the dielectric layer, the sixth opening extending partially into the dielectric layer;

extending the sixth opening into the dielectric layer, thereby forming an extended sixth opening in the dielectric layer, the extended sixth opening exposing the conductive feature; and depositing a conductive material into the extended sixth opening.

16. The method of claim 15, wherein the first opening exposes a bottom layer of the first mask stack.

17. The method of claim 15, wherein a long axis of the first opening is perpendicular to a long axis of the second opening.

18. The method of claim 15, wherein transferring the portion of the fifth opening overlapping with the first opening to the dielectric layer comprises etching the dielectric layer while using the first mask stack and the bottom layer of the second mask stack as a combined etching mask.

19. The method of claim 15, wherein extending the sixth opening into the dielectric layer comprises etching the dielectric layer while using the first mask stack as an etching mask.

20. The method of claim 15, further comprising, before extending the sixth opening into the dielectric layer, removing the bottom layer of the second mask stack.

* * * * *